US008392955B2

(12) United States Patent (10) Patent No.: US 8,392,955 B2
Shaul (45) Date of Patent: Mar. 5, 2013

(54) APPARATUS AND METHOD FOR REPRESENTING A SEQUENCE OF CONTENT AS PROJECTIONS FOR RECONSTRUCTING THE SEQUENCE AT FULL OR LOWER QUALITY

(76) Inventor: Hayim Shaul, Kfar Sava (IL)

( * ) Notice: Subject to any disclaimer, the term of this patent is extended or adjusted under 35 U.S.C. 154(b) by 534 days.

(21) Appl. No.: 12/674,108

(22) PCT Filed: Aug. 5, 2008

(86) PCT No.: PCT/IL2008/001074
§ 371 (c)(1),
(2), (4) Date: Feb. 18, 2010

(87) PCT Pub. No.: WO2009/031134
PCT Pub. Date: Mar. 12, 2009

(65) Prior Publication Data
US 2010/0211981 A1 Aug. 19, 2010

Related U.S. Application Data

(60) Provisional application No. 60/967,277, filed on Sep. 4, 2007.

(51) Int. Cl.
*H04N 7/173* (2011.01)
(52) U.S. Cl. ............... 725/95; 725/87; 725/93; 725/94
(58) Field of Classification Search .............. 725/87, 725/93–95
See application file for complete search history.

(56) References Cited

U.S. PATENT DOCUMENTS

| | | | |
|---|---|---|---|
| 5,497,435 A | | 3/1996 | Berger |
| 5,960,081 A | * | 9/1999 | Vynne et al. ............ 713/176 |
| 6,868,519 B2 | * | 3/2005 | Beacken et al. .......... 714/762 |
| 2002/0151992 A1 | * | 10/2002 | Hoffberg et al. ............ 700/83 |
| 2003/0048855 A1 | | 3/2003 | Klaghofer et al. |
| 2005/0010675 A1 | | 1/2005 | Jaggi et al. |
| 2005/0152391 A1 | | 7/2005 | Effros et al. |
| 2006/0224760 A1 | | 10/2006 | Yu et al. |
| 2006/0282677 A1 | | 12/2006 | Rodriguez et al. |
| 2007/0165673 A1 | | 7/2007 | Huang |
| 2007/0280233 A1 | | 12/2007 | Bush |

OTHER PUBLICATIONS

Khayam; "Seminar 1-The Discrete Cosine Transform (DCT): Theory and Application;" *ECE 802-602: Information Theory and Coding*; Mar. 10, 2003; pp. 1-31; Michigan State University.
Johnson et al; "Extensions of Lipschitz Mappings into a Hilbert Space;" 1984; pp. 189-206; American Mathematical Society.
Liu; "Patten Recognition Using Hilbert Space;" *Intelligent Robots and Computer Vision XI*; 1992; pp. 63-77; SPIE vol. 1825.
Hecht-Nielsen; "Context Vectors General Purpose Approximate Meaning Representations Self-Organized From Raw Data;" *Computational Intelligence: Imitating Life*; 1994; pp. 43-56; IEEE.
Vempala; "The Random Projection Method; *Series in Discrete Mathematics and Theoretical Computer Science*;" 2004; pp. 1-4; vol. 65; American Mathematical Society.

(Continued)

*Primary Examiner* — Hunter B Lonsberry
(74) *Attorney, Agent, or Firm* — Oliff & Berridge, PLC

(57) ABSTRACT

A content presentation system comprising content playing apparatus and content providing apparatus operative to receive an array of digitally represented numbers, representing content as P points in D-dimensional space, to generate therefrom a plurality of projections on at least one sub-space of a vector space comprising a span of at least one D-dimensional vector, and to provide the plurality of projections to the content playing apparatus, the content playing apparatus being operative to reconstruct the array of digitally represented numbers from the plurality of projections and to expose human users to content accordingly.

4 Claims, 33 Drawing Sheets

OTHER PUBLICATIONS

Ye et al; "GPCA: An Efficient Dimension Reduction Scheme for Image Compression and Retrieval;" *Research Track Paper*; 2004; pp. 354-363; Seattle, Washington, USA.

Bingham et al; "Random Projection in Dimensionality Reduction: Applications to Image and Text Data;" 2001; pp. 1-6; Laboratory of Computer and Information Science, Helsinki University of Technology.

Xie et al; "Wyner-Ziv Image Coding From Random Projections;" 2007; pp. 136-139; IEEE.

Written Opinion of the International Searching Authority mailed on Jan. 6, 2009 in corresponding International Application No. PCT/IL2008/001074.

International Search Report mailed on Jan. 6, 2009 in corresponding International Application No. PCT/IL2008/001074.

* cited by examiner

APPARATUS AND METHOD FOR REPRESENTING A SEQUENCE OF CONTENT AS PROJECTIONS FOR RECONSTRUCTING THE SEQUENCE AT FULL OR LOWER QUALITY

REFERENCE TO CO-PENDING APPLICATIONS

Priority is claimed from U.S. provisional application No, 60/967,277, entitled "A method for representing data by high-dimensional projections" and filed 17 Sep. 2007.

FIELD OF THE INVENTION

The present invention relates generally to compressing and decompressing data such as content for human consumption.

BACKGROUND OF THE INVENTION

Network coding is known and is described e.g. in the following US published patent documents:
20030048855 20050152391 20060282677 20070280233 20050010675 20060224760 20070165673

Random projection as a method for reducing the dimensionality of a set of points in Euclidean space is known e.g. in:

Bingham, E. and Mannila, H. 2001, Random projection in dimensionality reduction: applications to image and text data. In Proceedings of the Seventh ACM SIGKDD International Conference on Knowledge Discovery and Data Mining (San Francisco, Calif., Aug. 26-29, 2001). KDD '01. ACM, New York, N.Y., 245-250; and Santosh Vempala, The Random Projection Method, American Mathematical Society, 2004.

The following references describe technologies related to the field of the present invention:
1. Ye, Jieping and Janardan, Ravi and Li, Qi "GPCA: an efficient dimension reduction scheme for image compression and retrieval". KDD '04: Proceedings of the tenth ACM SIGKDD International Conference on Knowledge Discovery and Data Mining 2004.
2. W. B. Johnson and J. Lindenstrauss. "Extensions of Lipshitz mapping into Hilbert space". In Conference in modern analysis and probability, volume 26 of Contemporary Mathematics, pages 189206. Amer. Math. Soc., 1984.
3. R. Hecht-Nielsen. "Context vectors: general purpose approximate meaning representations self-organized from raw data". In J. M. Zurada, R. J. Marks II, and C. J. Robinson, editors, Computational Intelligence: Imitating Life, pages 4356. IEEE Press, 1994.
4. Shoulie Xie, Susanto Rahardja, and Zhengguo Li. "Wyner-Ziv Image Coding from Random Projections". In IEEE International Conference on Multimedia and Expo, 2007.

The disclosures of all publications and patent documents mentioned in the specification, and of the publications and patent documents cited therein directly or indirectly, are hereby incorporated by reference.

SUMMARY OF THE INVENTION

Presented here is a new method to represent data in computers. Data in computers is represented as numbers kept in some electronic way. Each symbol has a unique code which represents it, For example 'a' is represented by the number 64, 'b' by 65, etc. So the string "abba" is represented by the array of numbers: 64,65,65,64. If any action (such as transmitting, storing, compressing, back-upping, etc.) is to be applied on the string "abba", the action is actually applied on the array 64,65,65,64. Certain embodiments of the present invention include a method to represent data. The innovative method represents data in a new way, and achieves certain advantages that were lacking in the old method, An advantage of certain embodiments of the present invention is the ability to enhance or optimize data transmissions. Transmission of data is the driving engine of the Internet, contributing to its popularity. Computers connected to the Internet transmit files and streams to each other. In this background some of the challenges met when transmitting data are surveyed, and some of the popular solutions are presented.

Data is thought of as a file being transmitted, although data can be any other type of data as well (for example a stream).

The asymmetric nature of the Internet infrastructure suggests that a computer connected to the Internet downloads much more data than it uploads. ADSL is a good example of this, as the 'A' stands for 'Asymmetric'. This technology allows users to download in rates 8-times higher than the upload rate.

This asymmetry makes the bottleneck of transferring data from one computer to another to be the upload rate of the sending computer.

To work around this problem developers usually prefer to download data from several sources. When downloading from several sources the downloader needs to assign each source with a different range to upload (sometimes called chunk). When all sources finish the chunks they were assigned, the downloader merges all chunks to create the file. Note That This Workaround Has Several Shortcomings:
1. It can be applied only on a file (and not on a real-time stream)
2. When sources are disconnected during the transmission they leave the client with a fraction of a chunk downloaded. The client needs to keep a map of the regions it has downloaded successfully
3. In case of a very slow source, the chunk assigned to it might take a long time to download, long after the rest of the file was downloaded. In this case the chunk of the slow source should be reassigned to another source, or the download would take a long time A new approach is presented, which provides a solution to such problems, and which does not have the above shortcomings.

As users log in and out of the Internet, the consistency of a source is not guaranteed, either because they close their Internet connection, or because they close the application acting as the source of the data. As a result, sources transmitting data to a downloader may stop transmitting, or new sources may be available after the download has started.

When different chunks are assigned to different sources the application should take into consideration that sources may be lost during the transmission, or new sources may become available. The application constantly needs to reassign the chunks for the various sources. Furthermore, the application needs to keep track of the chunks and chunk-parts (in case a source has transmitted only a fraction of a chunk before disconnecting) it has downloaded. This is done by keeping a map that keeps track of the bytes downloaded. This map is either coarse (thus having fragmentation problems) or fine (thus storage-consuming).

When downloading a stream, to view a movie for example, the user downloads a stream of bytes from a source, and displays the movie decoded on the screen without saving the stream to a file on the disk. Applying the 'chunk-workaround' while playing the stream in real-time is impossible in an environment where sources have different bandwidth rates and might disconnect during the transmission.

Described below are certain embodiments of the present invention which allow a downloader to download from different sources with different bandwidth rates, and where the sources can dynamically connect and disconnect, and still be able to play a stream in real-time, and not only download a file.

A method to represent data is now described. Data stream of length n is represented as an n-dimensional vector in n-dimensional space. One can list the values of each coordinate of the vector (which is equivalent to listing the symbols of the data), but according to certain embodiments of the present invention, the vector is described by projecting it on to another random vector. The projection yields one scalar value. Using n scalars from n linear independent projections one can reconstruct the vector. It was proposed to use a representation of projections rather than a simple list of symbols. More formally, if d is the vector of data, and v is the vector we want to project d on to, then the projection is the scalar product vd. Given n linear independent vectors $v_1, \ldots, v_n$, whose d's projections on them are the values $x_1, \ldots, x_n$ we gather $v_1, \ldots, v_n$ into a matrix M and formulate the relations between $v_1, \ldots, v_n, x_1, \ldots, x_n$ and d as: Md=x. The multiplication here stands for the product of the matrix (M) with a vector (d) to get a vector (x). Since $v_1, \ldots, v_n$ are linearly independent M is reversible, $d=M^{-1}x$, thus reconstructing d back from x.

In a similar way, data of size n may be considered as a polygonal line of m point in n/m-dimension, and continue as before.

Both M and x are needed to be able to reconstruct d. The size of M is an order of magnitude larger than the size of d. A method is proposed to reduce the cost of the matrix M.

It was observed that M is not random, but can be represented with very little bits of information. The matrix M can be represented by as few bits as those enough to represent a single number. Such an optimization may be achieved if M is allowed to be pseudo-randomly generated. A representation of M can be a number which was used as a seed for a random generator, or a range in a full Van der-Monde matrix.

This optimization eliminates the high cost of the matrix M in this method.

Unlike traditional representation where it is important to download the data in the correct order, when downloading projections of the data onto random vectors, the order of receiving the projections has no relevance. Moreover, the only restriction is for the projections to be linearly independent, and if they are randomly chosen, the probability to get linearly dependent projections is very slight. The exact probability depends on the random function, and the size of the field in which the projection is done.

Adding a source to the download is done by receiving projections from that source. There is no need to partition the data into chunks and to assign different sources with different chunks. All sources transmit projections of the data, and when the downloader has downloaded enough projections it can reconstruct the data. Similarly, when a source has disconnected, and no more projections are received from it, there is no need to reassign any chunk to the remaining sources.

In real-time streaming, a stream of bytes is created in real time (for example television broadcast) and transmitted. Unlike a file, the stream is infinite, and the download of the stream must not pause, otherwise the display of the television stream will not work properly. When using traditional representation, there is no easy way to connect to more than one source. However, using the innovative representation described here, one downloader can connect to several sources getting a portion of the projections from each source. Moreover, the downloader can receive from each source a little more than he needs, so if one source fails, the downloader still has enough projections from the remaining sources to properly use the stream until the failed server has recovered.

For example, a downloader can connect to 11 different sources, downloading from each source 1/10 of the projections needed for a correct display of the television broadcast, thus downloading 110% of the needed projections. If one source fails, the downloader still receives enough projections every second to properly display the television broadcast.

A new method to represent data is illustrated. Instead of listing the symbols of the data as the common method does, nuggets of information are given where each nugget contributes to the entire data, and not to one symbol.

Such representation has two Main characteristics:
1. The nuggets of information do not need to be considered in any particular order
2. If one has n extra nuggets of information then these nuggets can compensate for loss of any other n nuggets of information These characteristics make such a representation ideal for download from many sources, and especially download real time streaming from many sources, when the sources may dynamically connect, disconnect or fail.

Certain embodiments of the present invention view the data as a vector (or list of vectors) in high dimensional space over a finite Galois field. This vector is projected over random vectors in space, and these projections are the nuggets of information. Given enough projections the original data vector can be reconstructed by simple means of matrix inversion and multiplication.

The present invention includes but is not limited to the following embodiments: a method for representing data in such a way that the representation does not depend on the order of the nuggets of information; a method for representing data in such a way that the representation can use any redundant n nuggets to compensate over any other nuggets of information; a method representing data in such a way that the representation does not depend on the order of the nuggets of information and the representation can use any redundant n nuggets to compensate over any other nuggets of information; the method described above where the data is a file being downloaded from several sources; the method described above where there is no need to partition the data into chunks and assign chunks to sources; the method described above where the data is a real-time stream being downloaded from several sources; the method described above where there is no need to partition the data into chunks and assign chunks to sources; the method described above where there data is a real-time stream being downloaded from several sources; the method described above where the downloader can reconstruct the stream in real-time even if any predefined number of arbitrary servers have failed; the method described above where the nuggets of information are projections of the data represented as an n-dimensional vector, on a random vector; the method described above, where the nuggets of information are projections of the data represented as an n-dimensional vector, on a random vector; the method described above where the nuggets of information are projections of the data represented as an n-dimensional vector, on a random sub-space of dimension m; the method described above where the nuggets of information are projections of the data represented as an n-dimensional vector, on a random sub-space of dimension m; the method described above where the field used is GF(x), for $x=2^8$, $2^{16}$, $2^{32}$, $2^{64}$; the method described above where the matrix M is generated by a pseudo random generator with a pre-negotiated seed; the method described above where the matrix M is a pre-negotiated submatrix of the Van der Monde matrix; the method described above where the method is applied on disjoint, consecutive chunks of the data; the method described above where the method is applied on disjoint, consecutive chunks of the data; the method described above where the method is applied on window over the data which is continuously sliding; and the method described above where the method is applied on window over the data which is continuously sliding.

A method of dimensional reduction is now described which is applicable to movies, audio, and any applications for which "lossy compression" is pertinent.

A particular feature of certain embodiments of the present invention is that entertainment data, image data, audio data and other such data is treated as a set of points in high dimensional space, typically over a finite Galois field, and projections thereof, rather than coefficients of equations whose solution constitutes the data, are computed and stored or transmitted, thereby to reduce the dimensionality of the data for purposes of storage or transmission, e.g. using PCT or random projection methods to generate a lower dimension approximation of the data, and still to enable acceptable later reconstruction of the data.

It is appreciated that one application of the system and methods for dimensionality reduction shown and described herein is sending images over a communication network such as the Internet, by viewing the images as a set of vectors in high dimensional space over a finite Galois field and projecting the vectors over typically random vectors in space. Given enough such projections the original data vector can be adequately reconstructed by of matrix inversion and multiplication.

Due to the asymmetric nature of the Internet infrastructure, a computer connected to the Internet downloads much more data than it uploads. The bottleneck of transferring data from one computer to another is typically the upload rate of the sending computer. To work around this problem developers usually prefer to download data from several sources. When downloading from several sources the downloader typically assigns to each source a different range or portion of data to upload (sometimes called a "chunk"). When all sources finish the chunks they were respectively assigned, the downloader merges all chunks to create the file. However, this can be applied only to a file and not to a real-time stream. Also, when sources become disconnected during transmission they leave the client with a fraction of a chunk downloaded. The client typically is forced to maintain a map of the regions it has downloaded successfully. Finally, if a source is slow, the chunk assigned to it might take a long time to download, terminating long after the rest of the file was downloaded. The chunk of the slow source may then be reassigned to another source. Certain embodiments of the present invention present a different solution to this problem.

As users log in and out of the Internet, the consistency of a source is not guaranteed, either because users close their Internet connection, or because they close the application acting as the source of the data. As a result, sources transmitting data to a downloader may stop transmitting, or new sources may become available after the download started.

When different chunks are assigned to different sources the application typically takes into consideration that sources may be lost during transmission, and conversely, new sources may become available. The application may repeatedly reassign the chunks for the various sources. Furthermore, the application may keep track of chunks and chunk-portions it has downloaded, where "chunk portion" refers to a fraction of a chunk transmitted by a source before disconnecting. This may be accomplished by maintaining a map that keeps track of bytes downloaded. This map is either coarse, causing fragmentation problems, or fine, in which case it is storage-consuming. This process is termed herein "chunk workaround".

When downloading a stream, to view a movie for example, the user downloads a stream of bytes from a source, and displays the movie decoded therefrom on the screen without saving them to a file on the disk. Applying the 'chunk-workaround' described above, playing the stream in real-time is impossible in an environment where sources have different bandwidth rates and might disconnect during the transmission. According to certain embodiments of the present invention, a downloader can download from different sources with different bandwidth rates, with sources connecting and disconnecting all the while, without preventing the downloader from playing a stream in real-time (or downloading a file).

There is thus provided, in accordance with at least one embodiment of the present invention, a method for encoding a sequence of M raw digital entertainment content bits comprising grouping the M raw digital entertainment content bits into P points, by partitioning the bits into tuples of L bits and taking a number whose binary representation equals the (ixD+j)-th L tuple to be the j-th coordinate of the i-th point ($1<=i<=P$), ($1<=j<=D$), each point being D-dimensional, each dimension having 2 to the power of L levels, such that $P \times D \times L >= M$; and generating at least a portion of a sequence of E data elements $ELEMENT_1, \ldots ELEMENT_E$, wherein each data element $ELEMENT_k$ ($1<=k<=E$) comprises a $d_k$-dimensional subspace $s_k$ of D-dimensional space and a projection of substantially all of the P points onto subspace $s_k$, and wherein $ELEMENT_k$'s projection comprises P sets of $d_k$ L-tuples of bits defining P points, PNTk,1 PNTk,2, ..., PNTk,p, respectively, in subspace $s_k$.

Further in accordance with at least one embodiment of the present invention, the method also comprises transmitting at least a portion of the sequence of E data elements to a client over an information network.

Still further in accordance with at least one embodiment of the present invention, the transmitting comprises transmitting only a client-defined subsequence of the sequence of E data elements.

Additionally in accordance with at least one embodiment of the present invention, at least one of the subspaces $s_k$ is transmitted by specifying the coordinates of the vectors that span subspace $s_k$.

Further in accordance with at least one embodiment of the present invention, at least one of the subspaces $s_k$ is transmitted by specifying an index in a list of previously predefined subspaces [iClaim 1].

Still further in accordance with at least one embodiment of the present invention, at least one of the subspaces $s_k$ is transmitted by specifying a number, that is used to generate the vectors that span subspace $s_k$.

Further in accordance with at least one embodiment of the present invention, at least one of the subspaces $s_k$ is transmitted using a predefined function whose output is a subspace that depends on an input number.

Additionally in accordance with at least one embodiment of the present invention, subspaces $s_k$ ($k=1, \ldots E$) are linearly independent, and dimensions $d_1, \ldots d_E$ of the subspaces $s_1$[iClaim2], $\ldots s_E$ respectively are characterized in that $d_1 + \ldots + d_E = D$.

Additionally in accordance with at least one embodiment of the present invention, the span of the subspaces $s_k$ (k=1, ... E) is a space of dimension D, wherein the dimensions $d_1, \ldots d_E$ of the subspaces $s_1$[iClaim3], ... $s_E$ respectively are characterized in that $d_1 + \ldots + d_E > D$.

A particular advantage of this embodiment is the ability to transmit redundant information to a receiver which generally allows the receiver to able to recover exact data even if packet drops occur.

Further in accordance with at least one embodiment of the present invention, the span of the subspaces $s_k$ (k=1, ... E) is a space of dimension lower than D.

Further in accordance with at least one embodiment of the present invention, the method also comprises providing raw digital entertainment content comprising a multiplicity of pixels; and providing a sequence of M raw digital entertainment content bits selected to represent the multiplicity of pixels.

Still further in accordance with at least one embodiment of the present invention, the method comprises providing raw digital entertainment content comprising a multiplicity of samples of a sound wave; and providing a sequence of M raw digital entertainment content bits selected to represent the multiplicity of samples of a sound wave.

Also in accordance with at least one embodiment of the present invention, there is provided a content presentation system comprising content playing apparatus; and content providing apparatus operative to receive an array of digitally represented numbers, representing content as P points in D-dimensional space, to generate therefrom a plurality of projections on at least one sub-space of a vector space comprising a span of at least one D-dimensional vector, and to provide the plurality of projections to the content playing apparatus, the content playing apparatus being operative to reconstruct the array of digitally represented numbers from the plurality of projections and to expose human users to content accordingly.[iClaim4]

Any suitable method may be employed to represent an image as an array.[iClaim5] One possible method is to write the red values of an RGB image one row after another followed by the blue and then green values.[iClaim6] Another possibility is to partition the image into blocks of 8×8 pixels and write these in some order.

Also in accordance with at least one embodiment of the present invention, there is provided a method for retrieving a sequence of P×D×L>=M raw digital entertainment content bits from a received sequence of e<=E data elements, each data element comprising P sets of $d_k$ L-tuples of bits, each data element $ELEMENT_k$ (1<=k<=e) comprising a projection of substantially all of P points defined in a coordinate system having an origin, onto a $d_k$-dimensional subspace $s_k$ of D-dimensional space, thereby to define subspaces defining a span, the subspaces being characterized in that the span (S1, ... Sk)<=D, the method comprising repeating, for p=1, ... P, retrieving a p'th point comprising D L-tuples of bits, wherein retrieving the p'th point comprises, for each data element $ELEMENT_h$ (1<=h<=e) in the sequence of e data elements, taking the intersection of all $O_{p,1}, O_{p,2}, \ldots, O_{p,e}$ where $O_{p,h}$ (1<=p<=P, 1<=h<=e) is a translated subspace orthogonal to $s_h$ that contains the point PNTh,p, the dimension of the subspace being $D-d_h$, the intersection of all of the translated subspaces orthogonal to $s_h$ defining an intersection translated subspace comprising a translated subspace of dimension D-dim(span(s1,s2, ..., sk)) and choosing a D-dimensional point $q_p$ within the intersection translated subspace, wherein each dimension of the D-dimensional point is represented at a $2^L$-level resolution, such that the point is defined by D L-tuples of bits; and decoding the P D-dimensional points into M raw digital entertainment bits by setting the (ixD+j)-th L-tuple of bits to hold the L-bit binary representation of the j-th coordinate of the i-th point (1<=j<=D) (1<=i<=P), thereby obtaining P×D×L bits.

Further in accordance with at least one embodiment of the present invention, span(s1, ... se)=D such that all subspaces $s_k$ (1<=k<=E) intersect at a single D-dimensional point, each dimension having L levels, the point being the exact encoding of M.

Still further in accordance with at least one embodiment of the present invention, dim(span(s1,s2, ... se))×P×L=M.

Further in accordance with at least one embodiment of the present invention, S1,S2, ... , Se are linearly independent, such that dim(span(s1,s2, ... se))=d1+d2+ ... +de.

Further in accordance with at least one embodiment of the present invention, the function is a pseudo-random generator.

Also provided, in accordance with at least one embodiment of the present invention, is a system for digitizing a playable sequence of content items, the method comprising a whole-sequence representing digital element generator computing at least a portion of a set of digital data elements, the set being characterized in that it is possible to reconstruct an approximation of the playable sequence from at least some subsets of the set of digital data elements and wherein each the approximation has a quality, and wherein the quality of each the approximation depends on the size of the subset from which the approximation is reconstructed.

Further in accordance with at least one embodiment of the present invention, the set is characterized in that it is possible to reconstruct the playable sequence from the set of digital data elements.

Still further in accordance with at least one embodiment of the present invention, the set of digital data elements comprises a set of projections of an n-dimensional vector representation of the sequence of content items, onto a corresponding set of vectors.

Further in accordance with at least one embodiment of the present invention, the set of digital data elements comprises a set of projections of an n-dimensional vector representation of the sequence of content items, onto a corresponding set of sub-spaces.

Still further in accordance with at least one embodiment of the present invention, the set of vectors is randomly selected.

Further in accordance with at least one embodiment of the present invention, the set of sub-spaces is randomly selected.

Further in accordance with at least one embodiment of the present invention, the digital element generator comprises a digitizer operative to generate an array of numbers representing the playable sequence and the data elements comprise respective projections of the array of numbers onto respective vectors.

Still further in accordance with at least one embodiment of the present invention, each projection is computed over a Galois field GF(2 exp n).

Further in accordance with at least one embodiment of the present invention, the array is received by the content providing apparatus as a real time stream and the content playing apparatus is operative in real time to reconstruct the array of digitally represented numbers from the plurality of projections and to generate entertainment accordingly.

Still further in accordance with at least one embodiment of the present invention, the content playing apparatus at least partly determines how many projections are included in the plurality of projections.

Further in accordance with at least one embodiment of the present invention, a population of entertainment content providing devices, including the entertainment content providing apparatus, is served, thereby to define a work load, and wherein the work load at least partly determines how many projections are included in the plurality of projections.

Still further in accordance with at least one embodiment of the present invention, the content providing apparatus is entitled to a known quality of service, and wherein the quality of service at least partly determines how many projections are included in the plurality of projections.

Additionally in accordance with at least one embodiment of the present invention, the known quality of service is stored on a smart card.

Further in accordance with at least one embodiment of the present invention, the content providing apparatus comprises a voice over IP device.

Still further in accordance with at least one embodiment of the present invention, the plurality of projections includes more than enough data to reconstruct the array of digitally represented numbers such that even if the plurality of projections is incompletely received by the content playing apparatus, the array of digitally represented numbers can at least usually be reconstructed.

Further in accordance with at least one embodiment of the present invention, the work load is operationalized as at least one bandwidth constraint.

Still further in accordance with at least one embodiment of the present invention, the population of entertainment content providing devices comprise a population of video-on-demand clients and the content providing apparatus comprises a video-on-demand server.

Further in accordance with at least one embodiment of the present invention, the population of entertainment content providing devices comprises a population of televisions and the content providing apparatus comprises a television streaming server.

Still further in accordance with at least one embodiment of the present invention, the content providing apparatus comprises a voice over IP device and the content comprises voice information, the device being characterized in that if a packet of content is dropped, the device does not play silence and instead reduces the quality of the voice played.

Additionally in accordance with at least one embodiment of the present invention, the content providing apparatus comprises a plurality of video-streaming devices serving as simultaneous sources for video content.

Also provided, in accordance with at least one embodiment of the present invention, is an entertainment system comprising entertainment content storing apparatus; and content providing apparatus operative to receive an array of digitally represented numbers, representing entertainment content having a quality parameter as P points in D-dimensional space, to generate therefrom a plurality of projections on at least one sub-space of a vector space comprising a span of at least one D-dimensional vector, and to store the plurality of projections on the entertainment content storing apparatus, thereby to ensure that local damage to the entertainment content storing apparatus does not eradicate any portion of the entertainment content and instead generally uniformly reduces the quality parameter of all portions of the entertainment content.

Further in accordance with at least one embodiment of the present invention, to the content providing apparatus includes a terminating function operative, upon a termination signal received from the content playing apparatus, to terminate generation of projections from the array of digitally represented numbers.

Still further in accordance with at least one embodiment of the present invention, the content playing apparatus comprises a audio-visual device for playing movies.

Further in accordance with at least one embodiment of the present invention, the grouping comprises partitioning the bits into tuples of L bits and taking the number whose binary representation is as the (ixD+j)-th tuple to be the j-th coordinate of the i-th point ($1<=i<=P$), ($1<=j<=D$).

Still further in accordance with at least one embodiment of the present invention, the projections are pseudo-randomly selected from among a universe of possible projections.

Additionally in accordance with at least one embodiment of the present invention, $q_p$, is chosen so as to minimize its Euclidian distance from the origin.

Optionally, content may be represented as P points in D-dimensional space by generating a P×D array where element (p,d) stores the d'th coordinate of the p'th point for d=1, ... D and p=1, ... P. Array[pD+d] may be the d-th coordinate of the p-th point, or array[dP+p] may be the d-th coordinate of the p-th point. It is appreciated that these implementations are merely exemplary and are not intended to be limiting.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and /or memories of a computer, The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings.

Figure 2A:
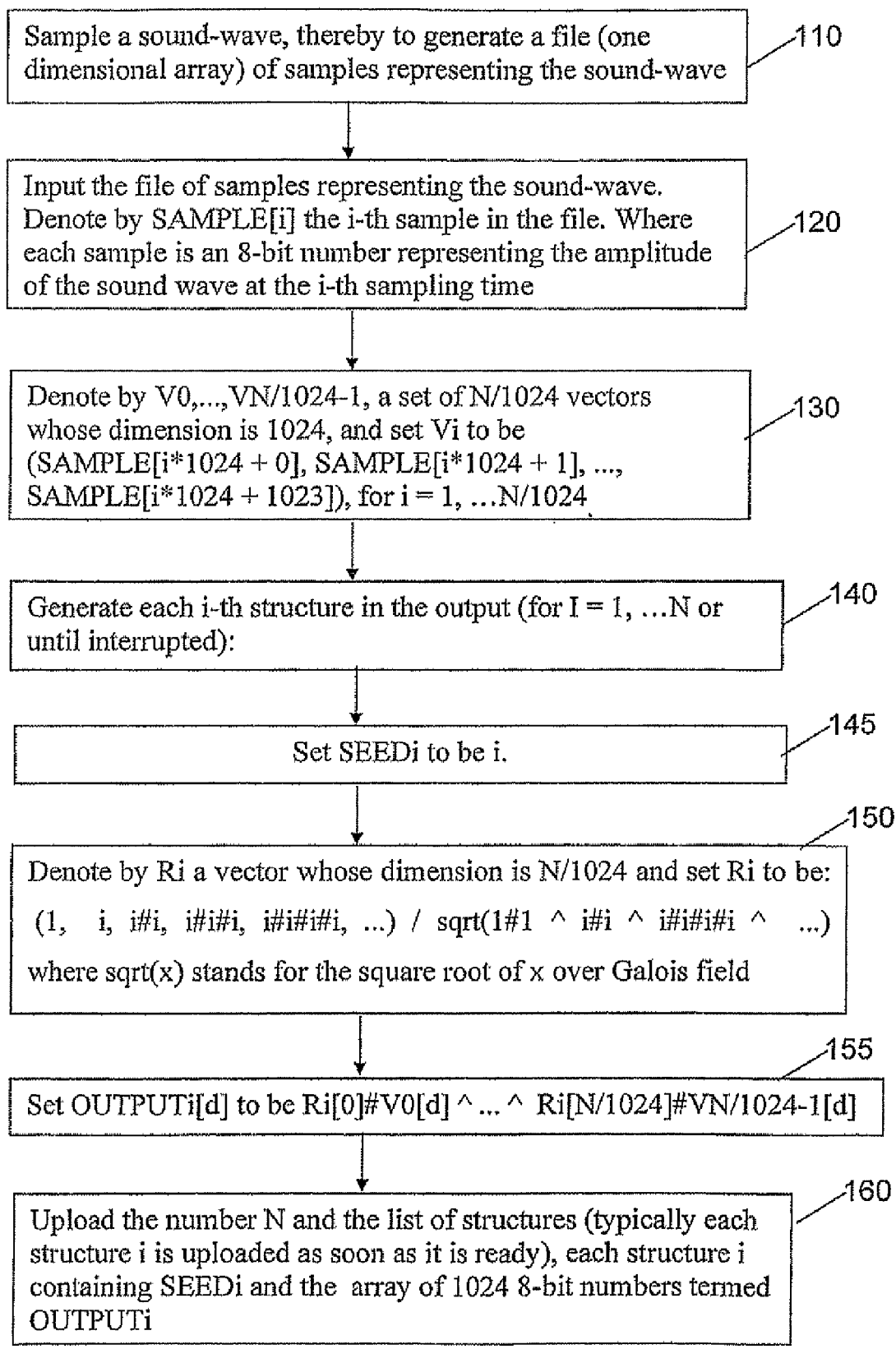
Figure 2B:
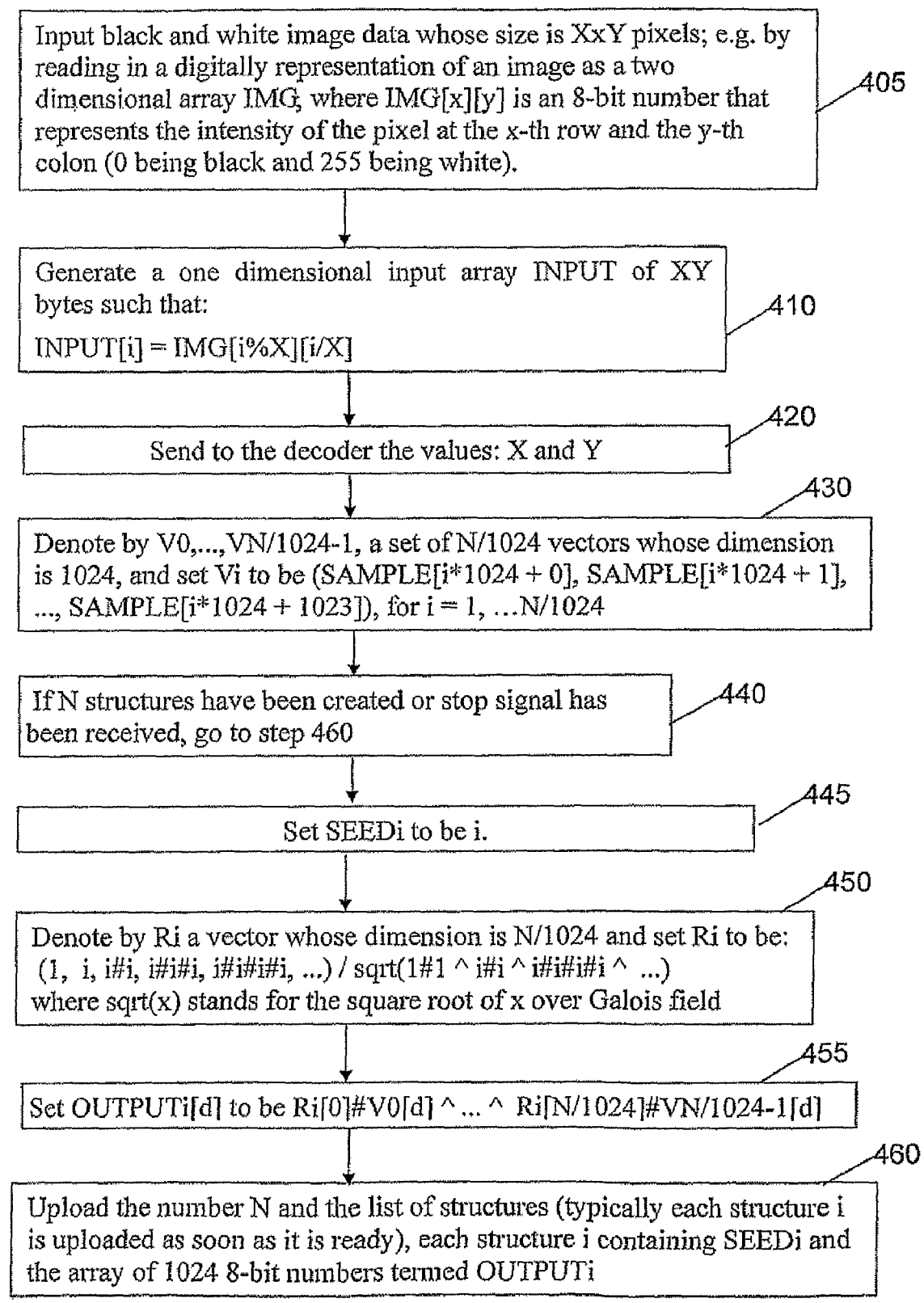
Figure 2C:
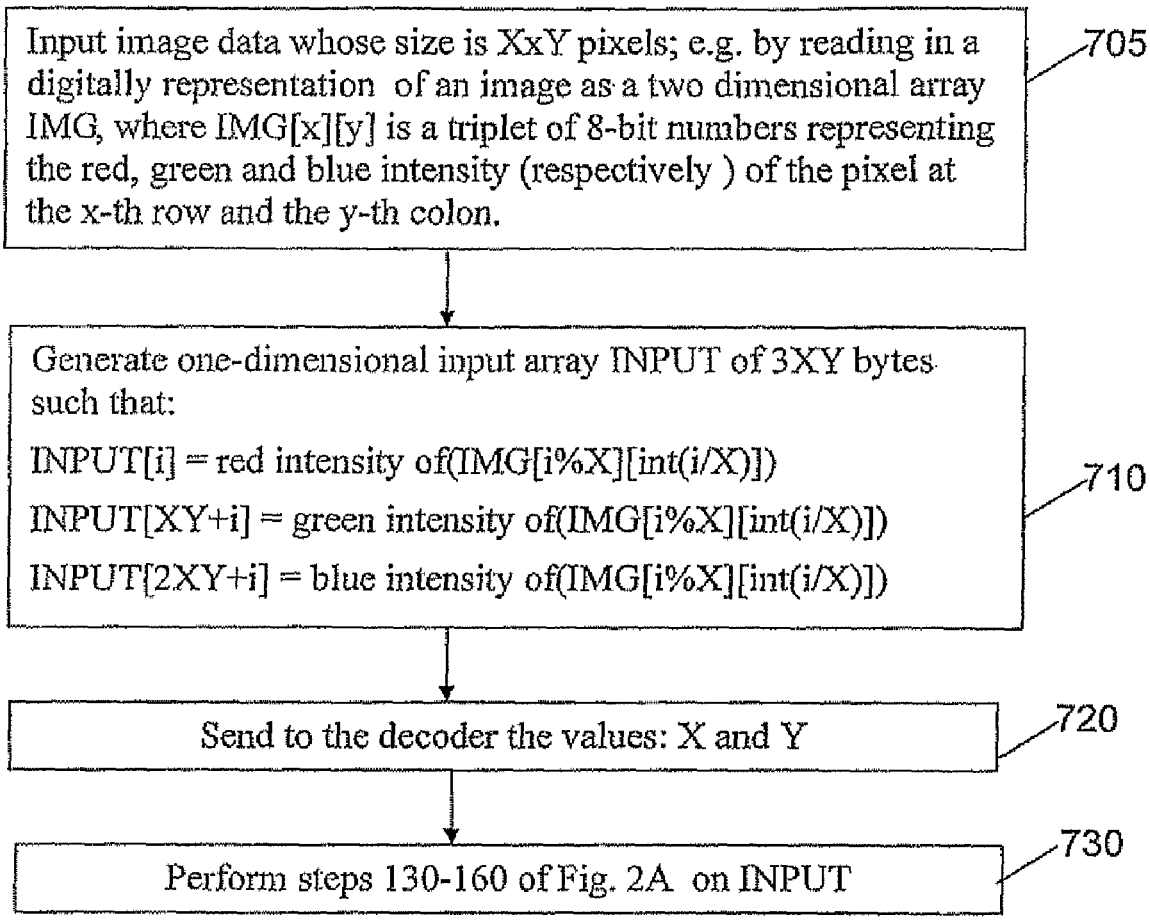
Figure 2D:
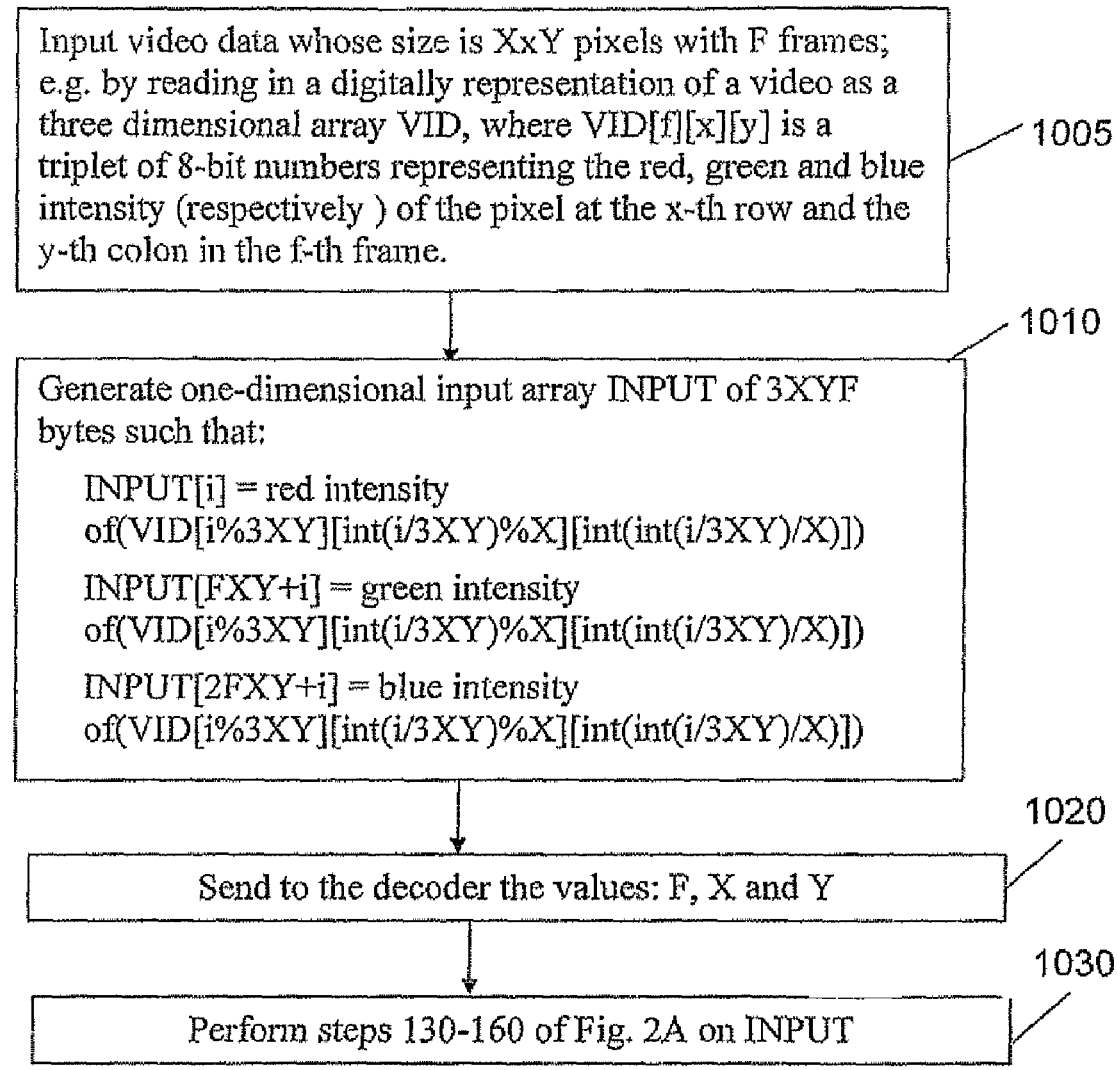
Figure 2E:
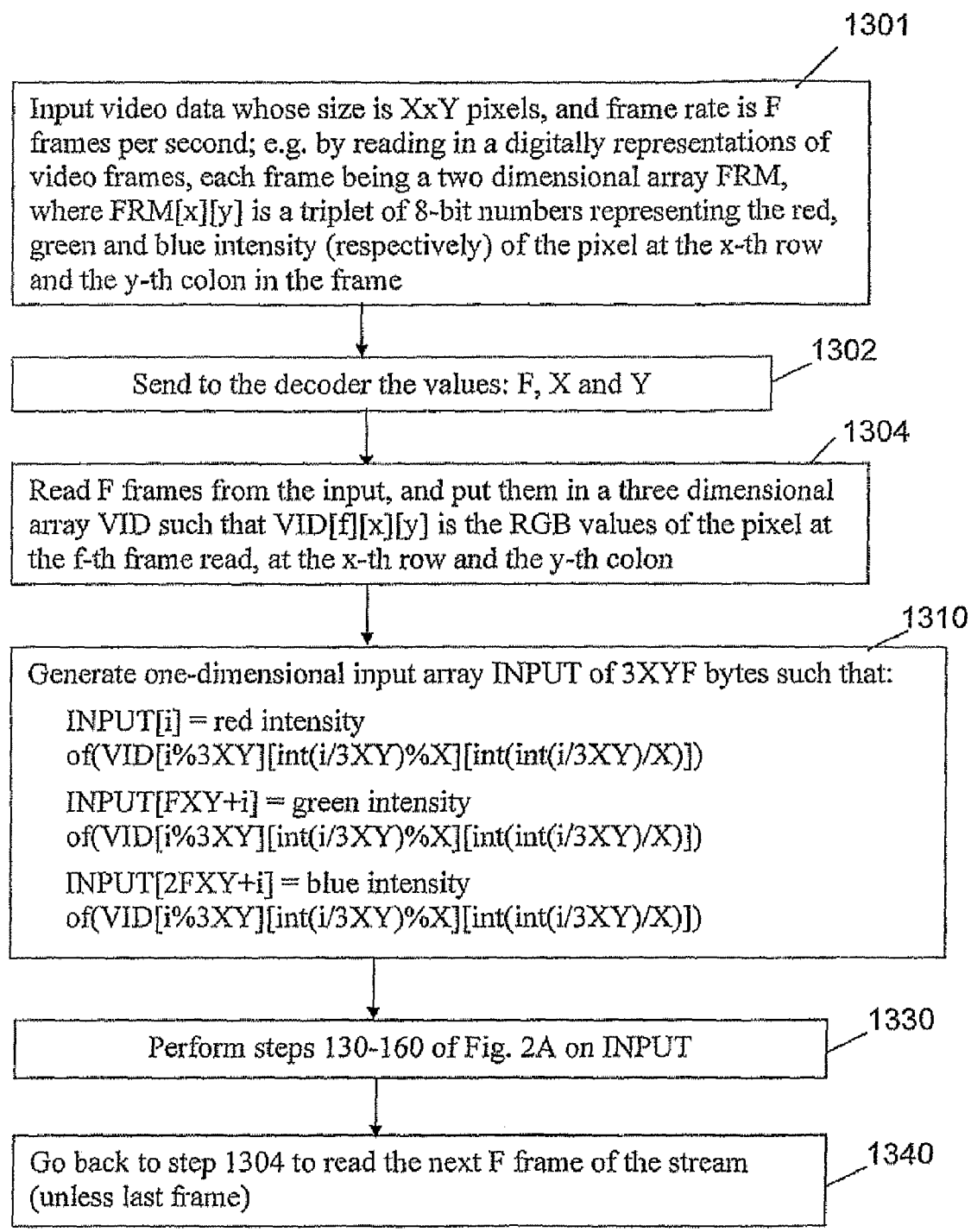
Figure 2F:
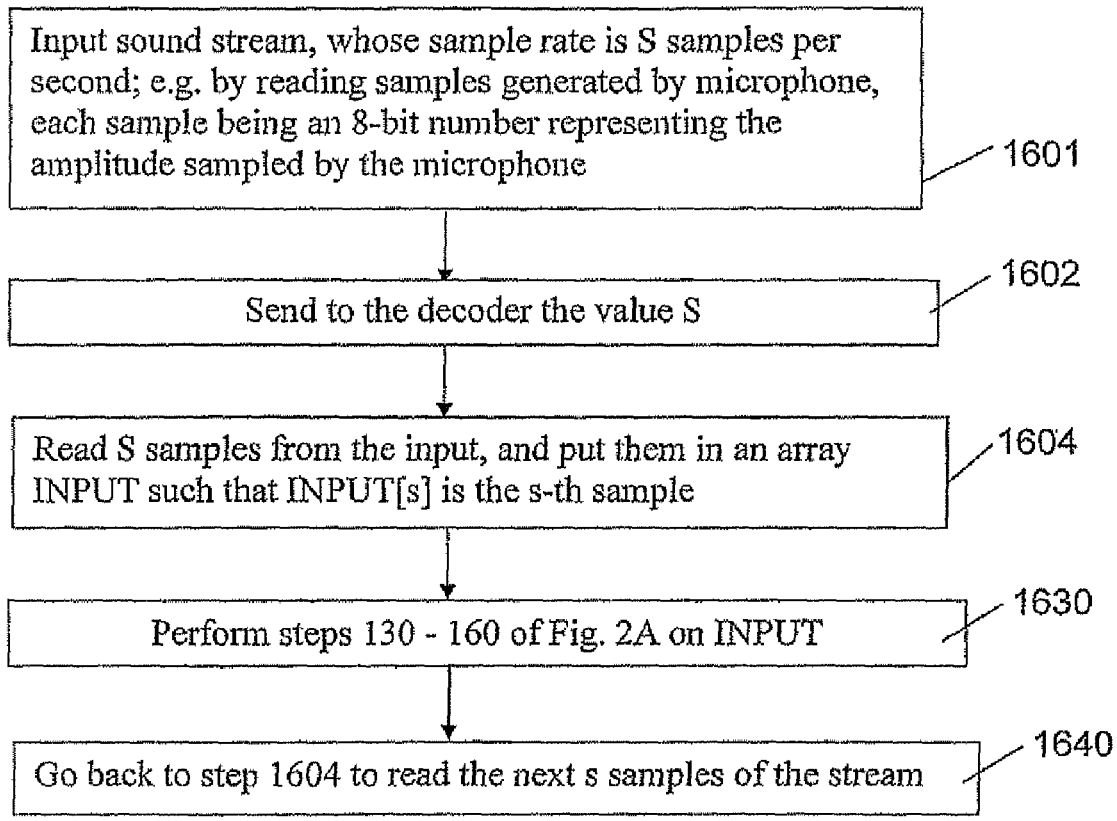
Figure 3A:
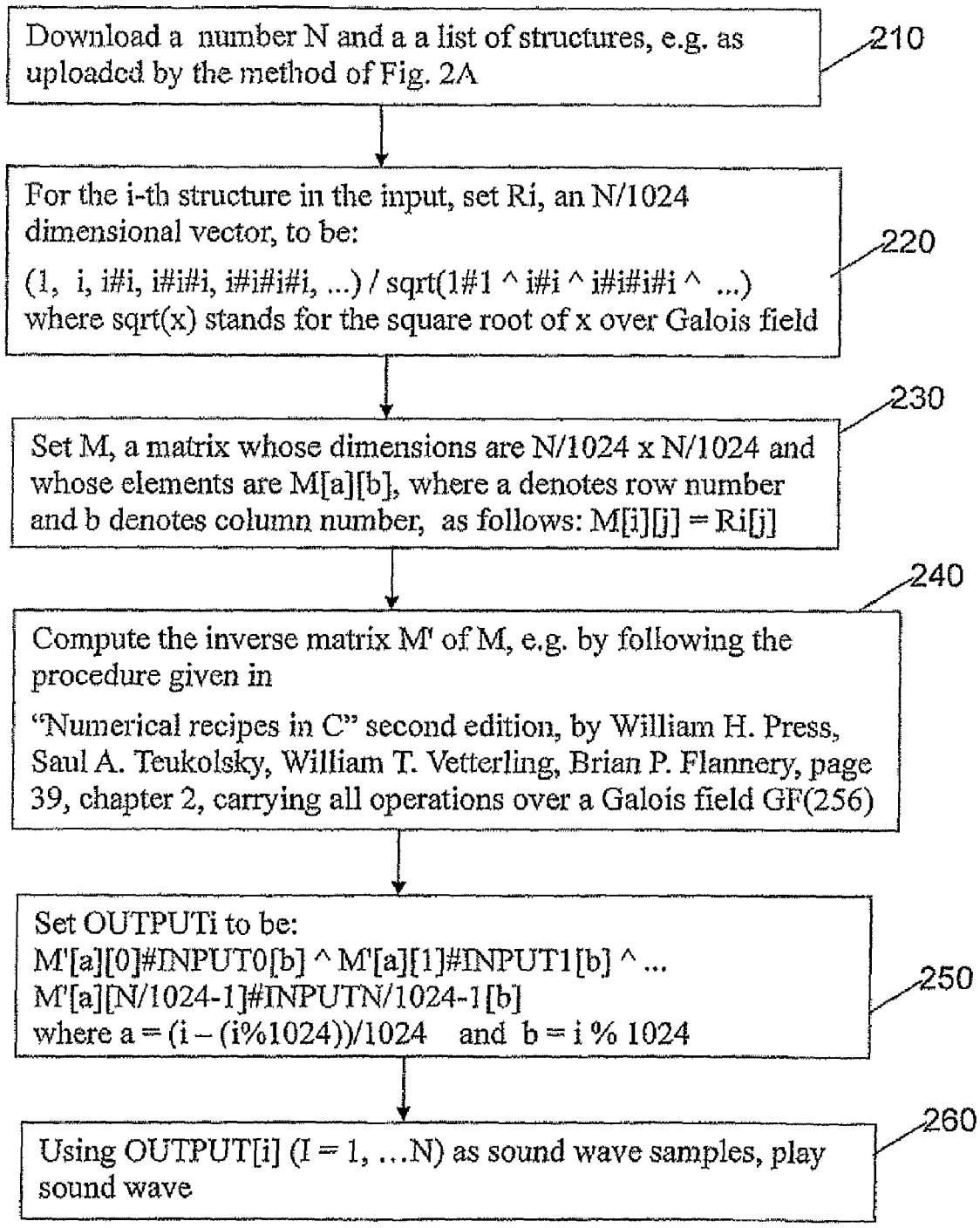
Figure 3B:
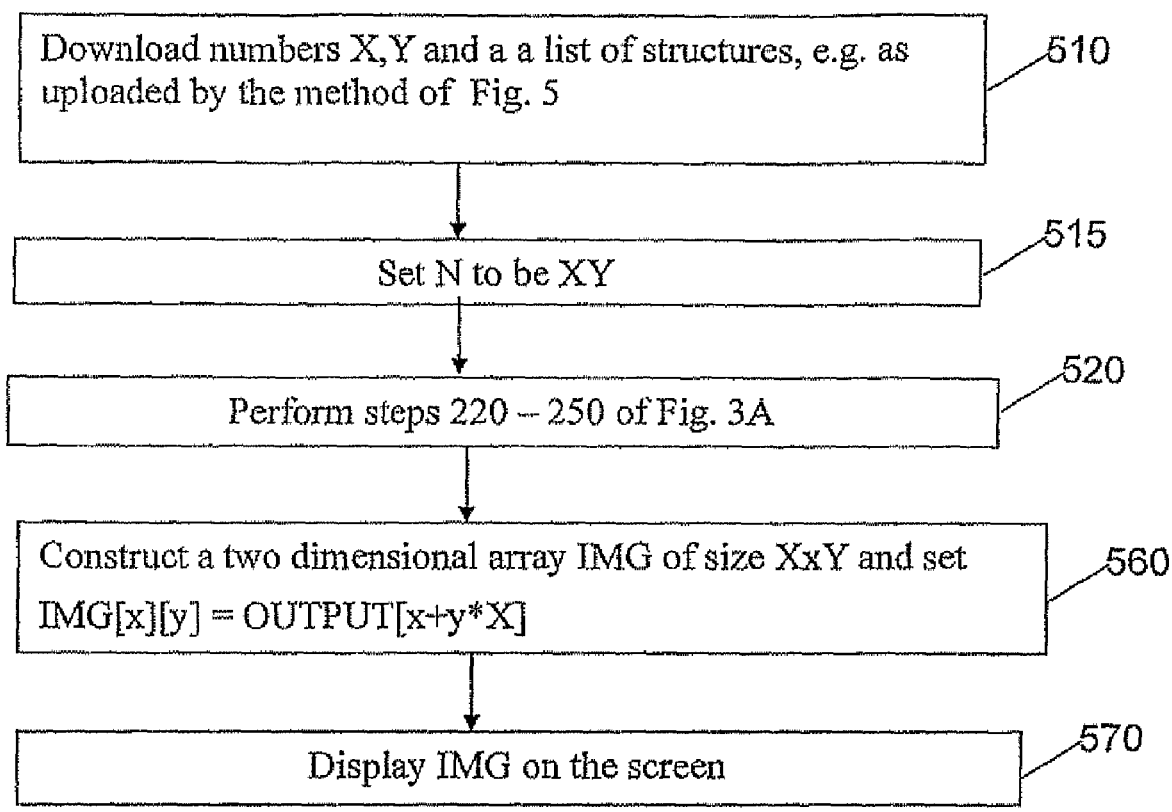
Figure 3C:
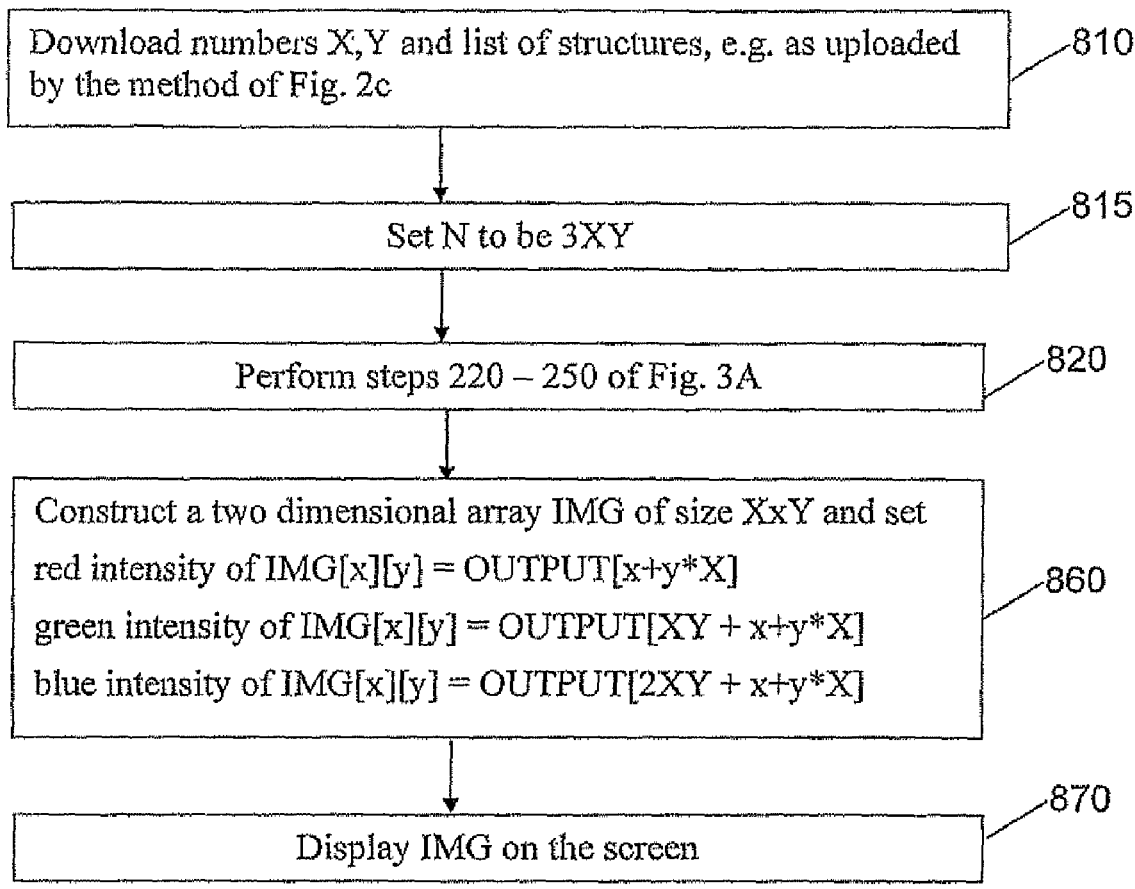
Figure 3D:
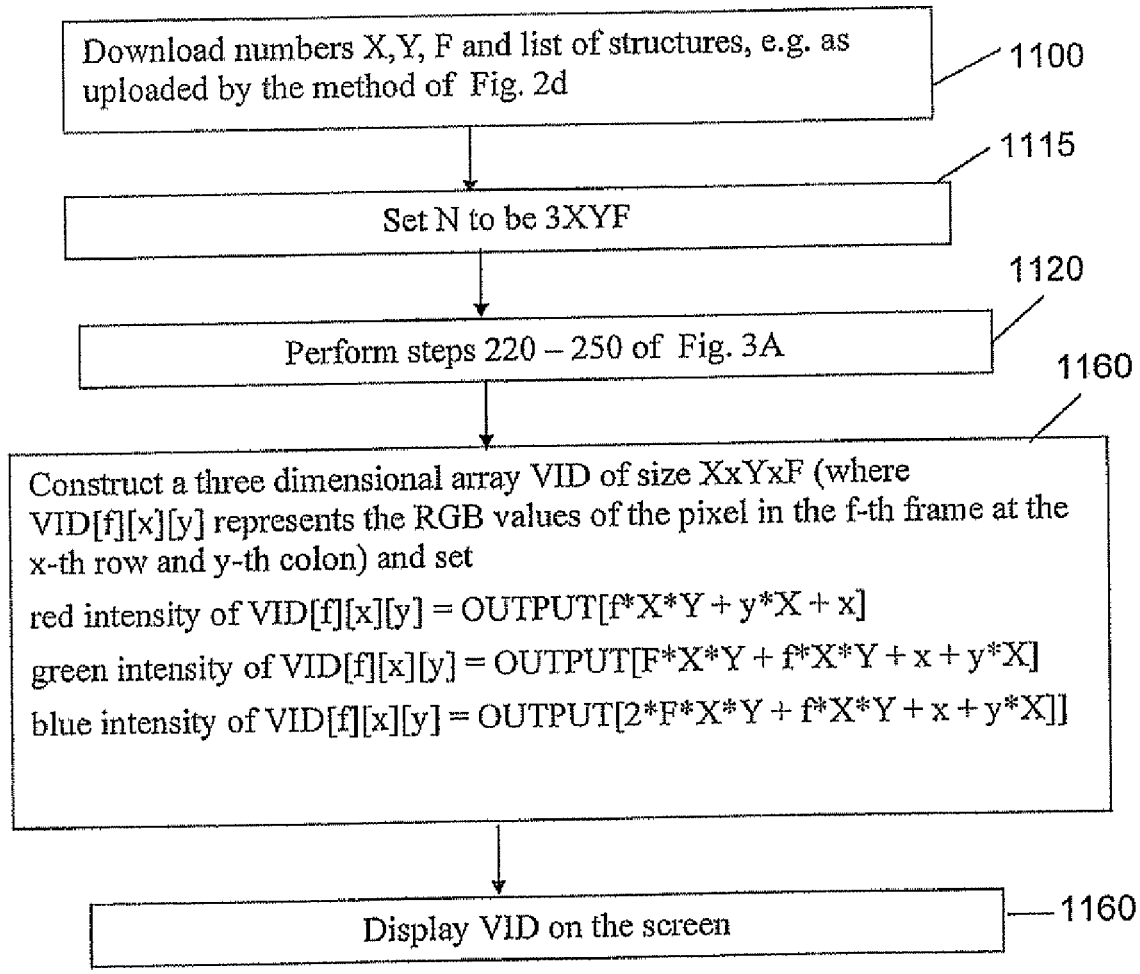
Figure 3E:
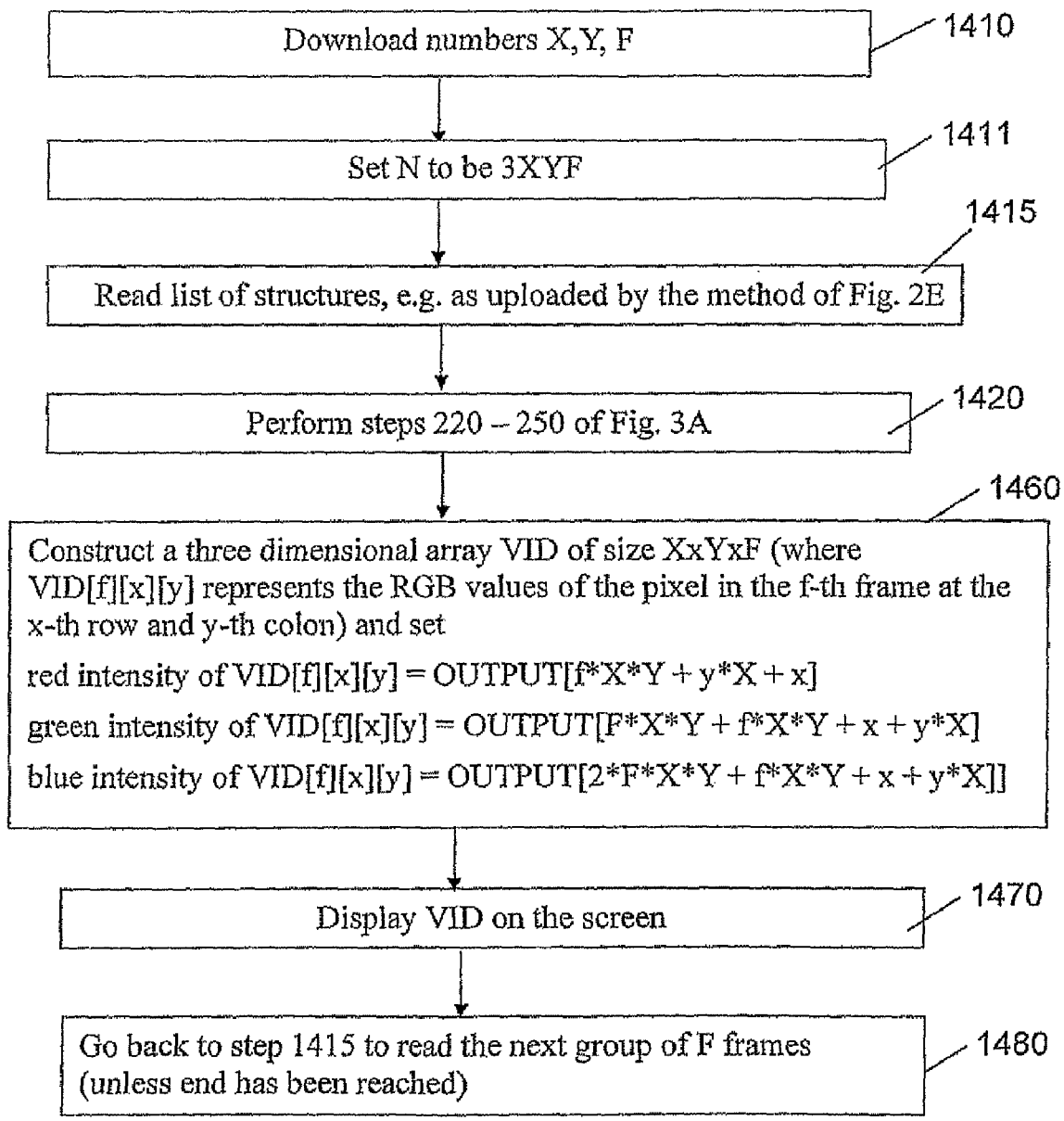
Figure 3F:
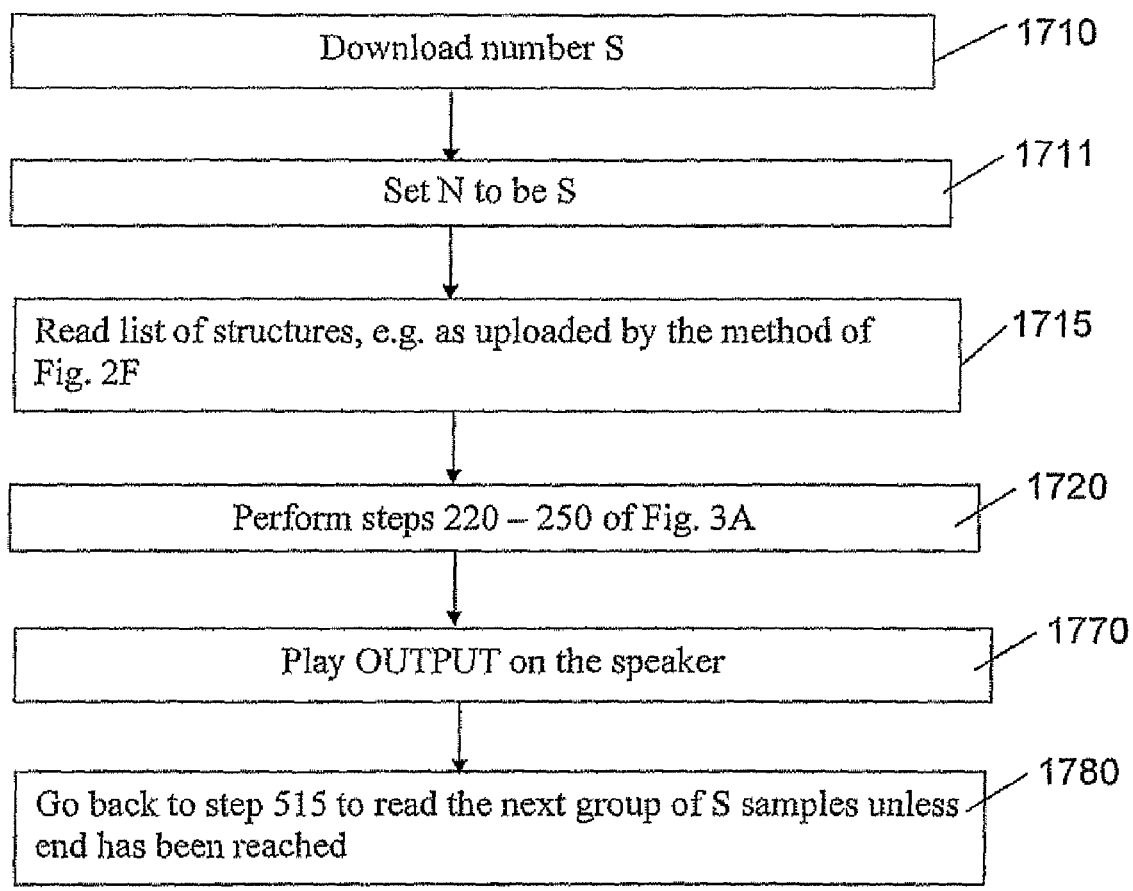
Figure 4A:
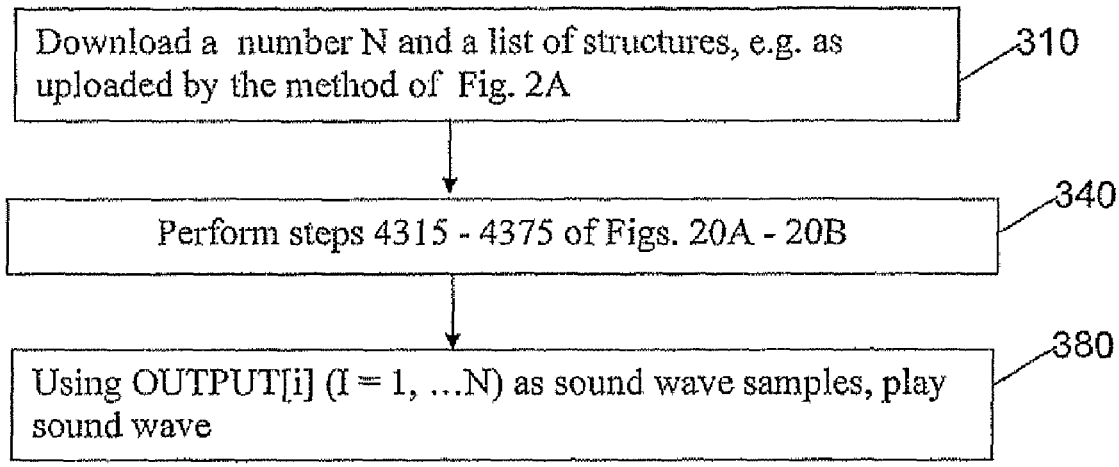
Figure 4B:
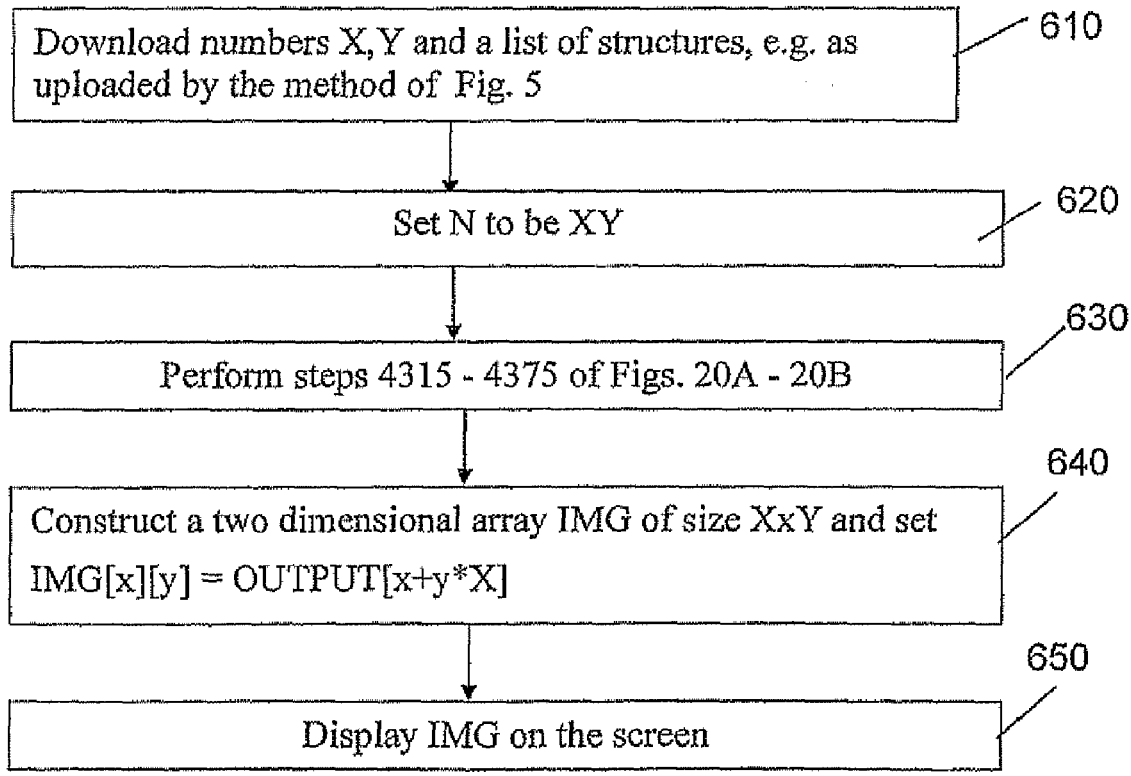
Figure 4C:
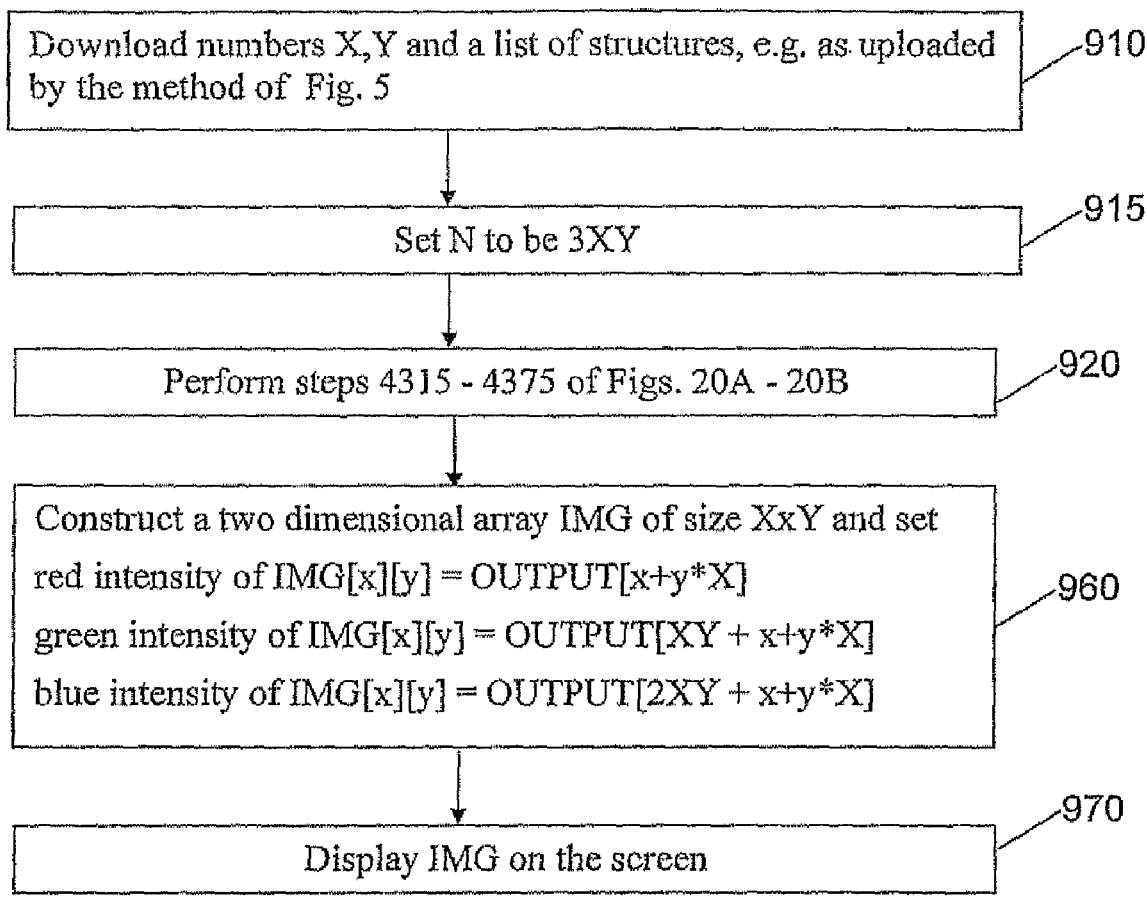
Figure 4D:
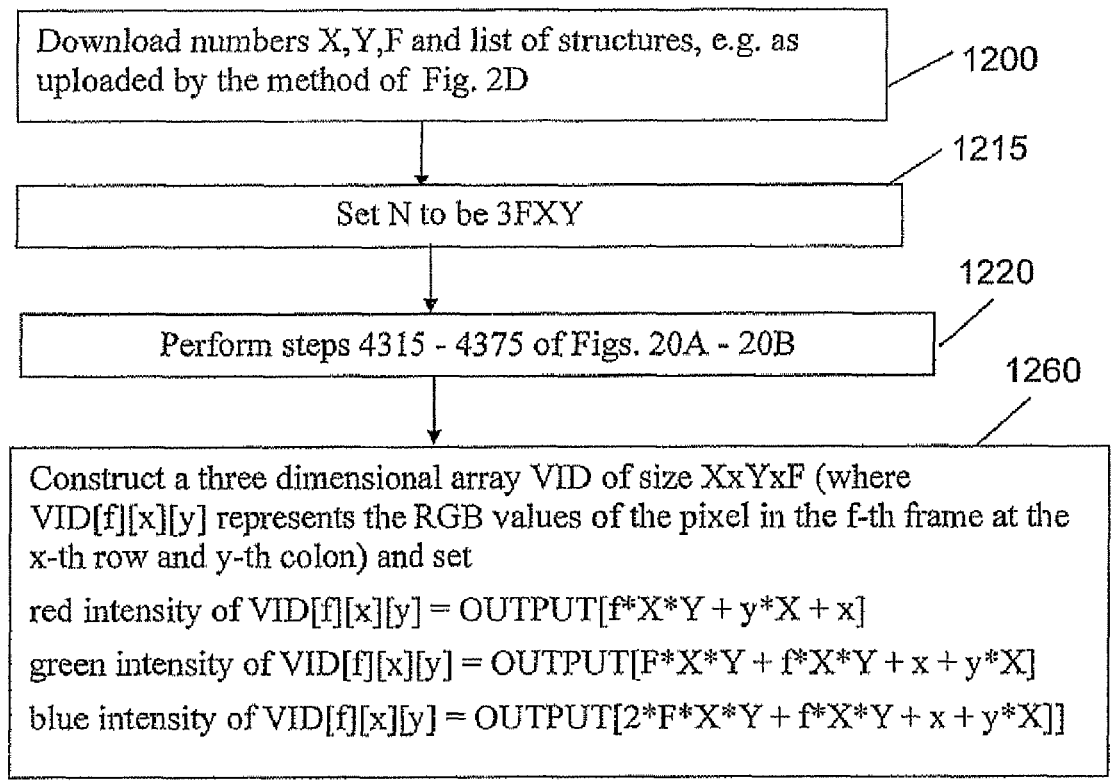
Figure 4E:
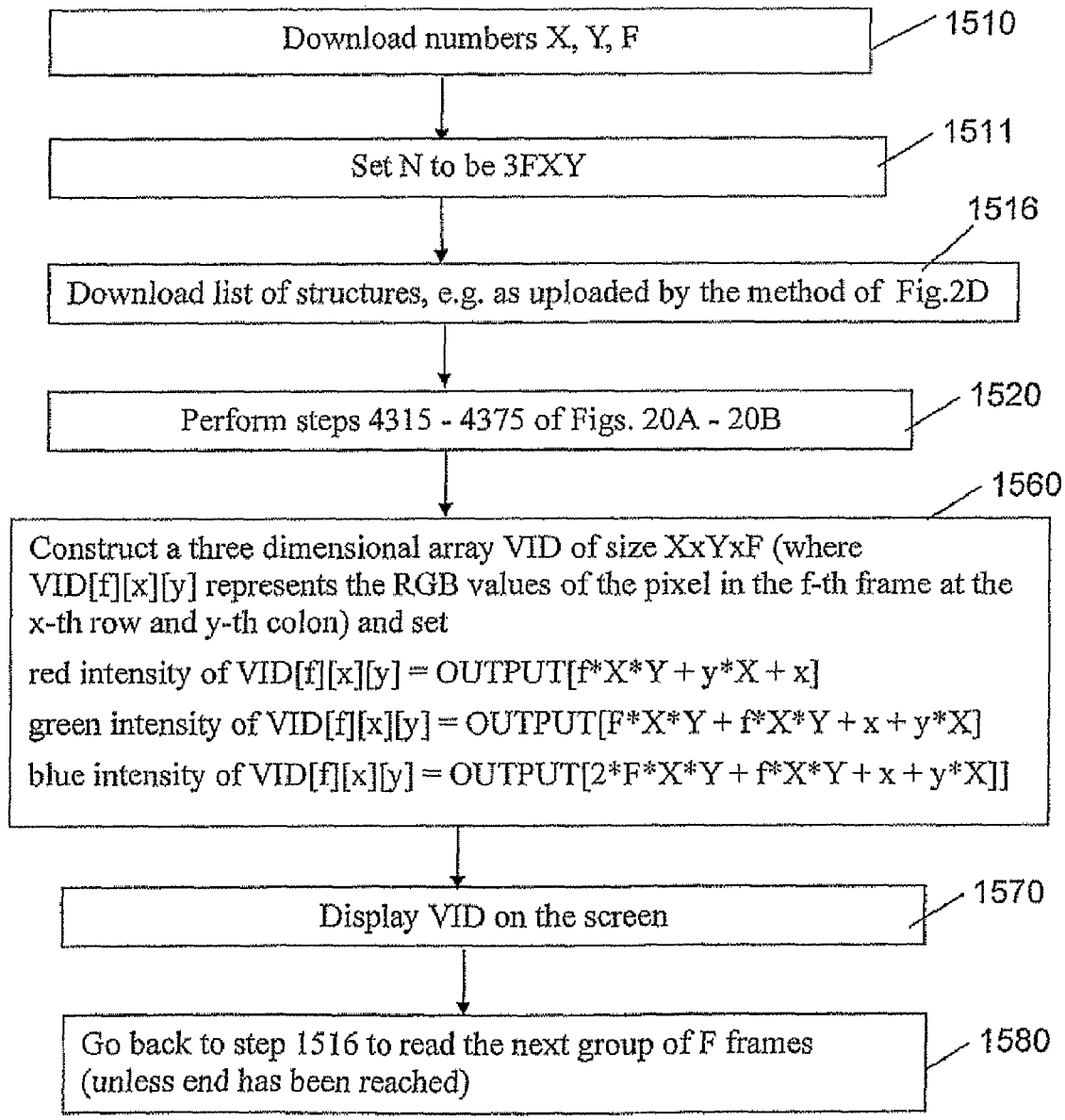
Figure 4F:
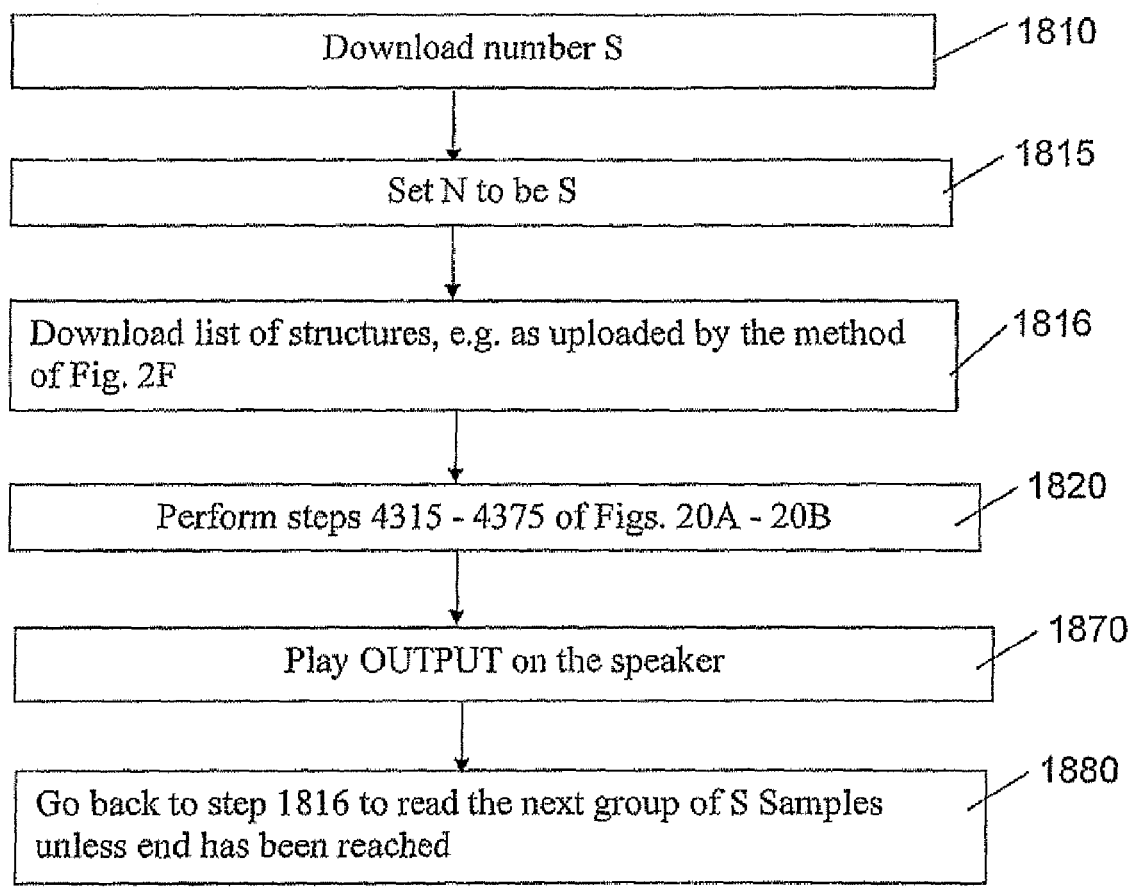
Figure 5:
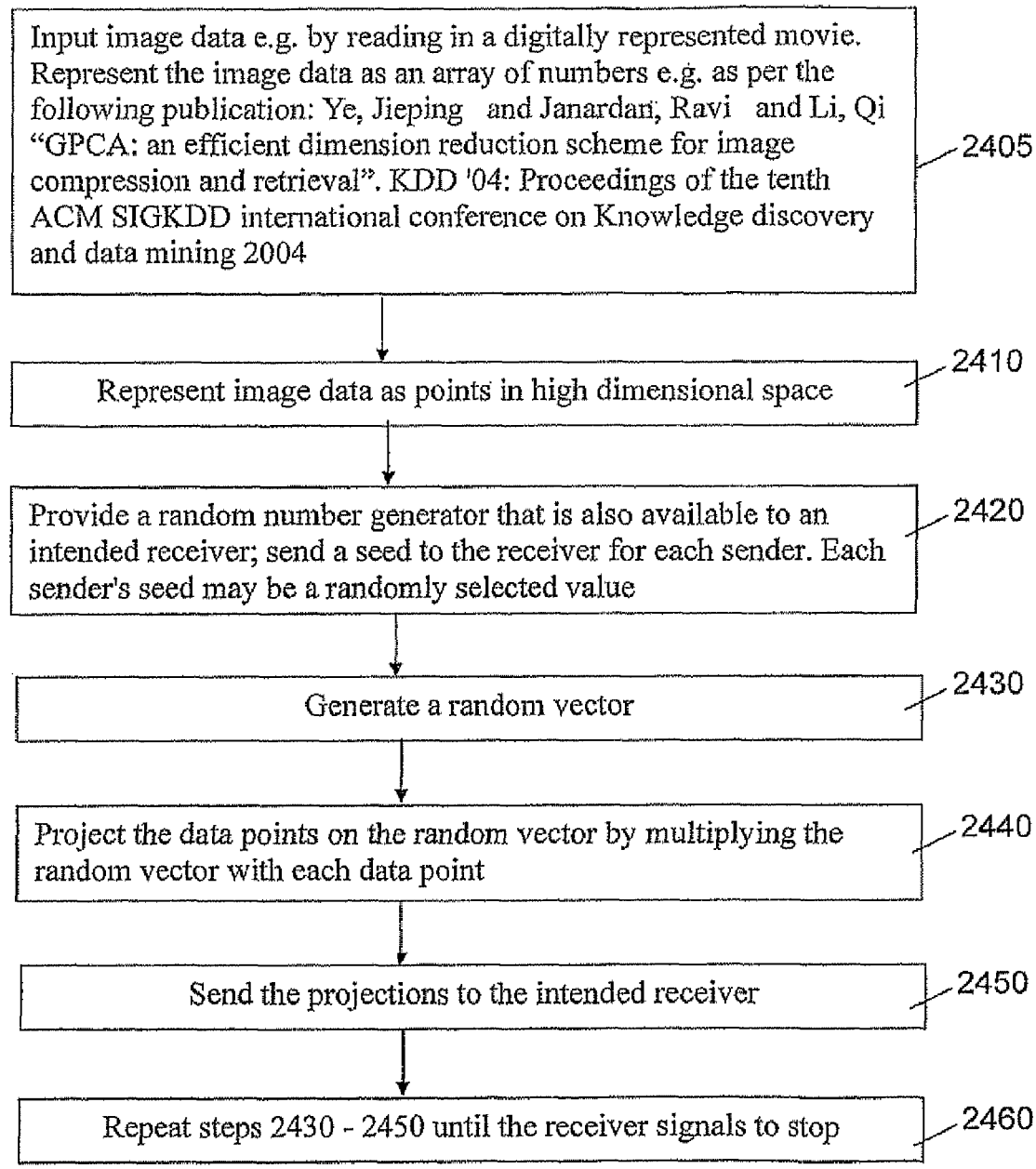
Figure 6:
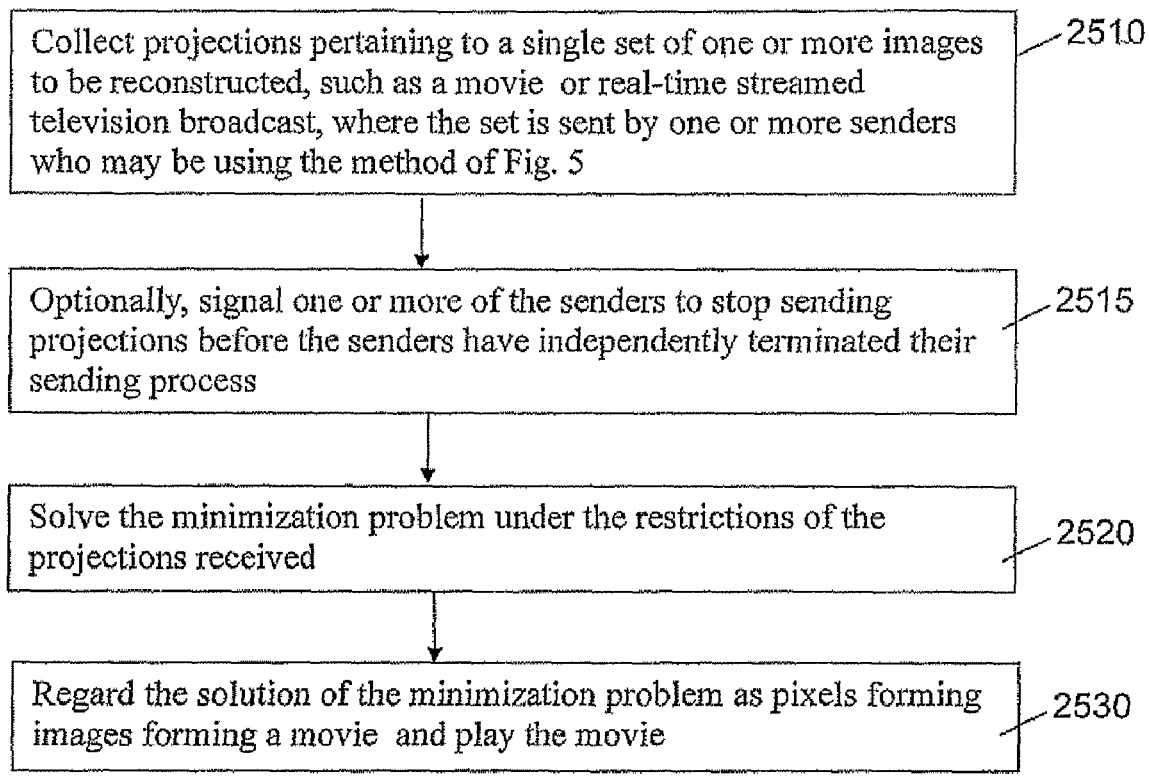
Figure 7:
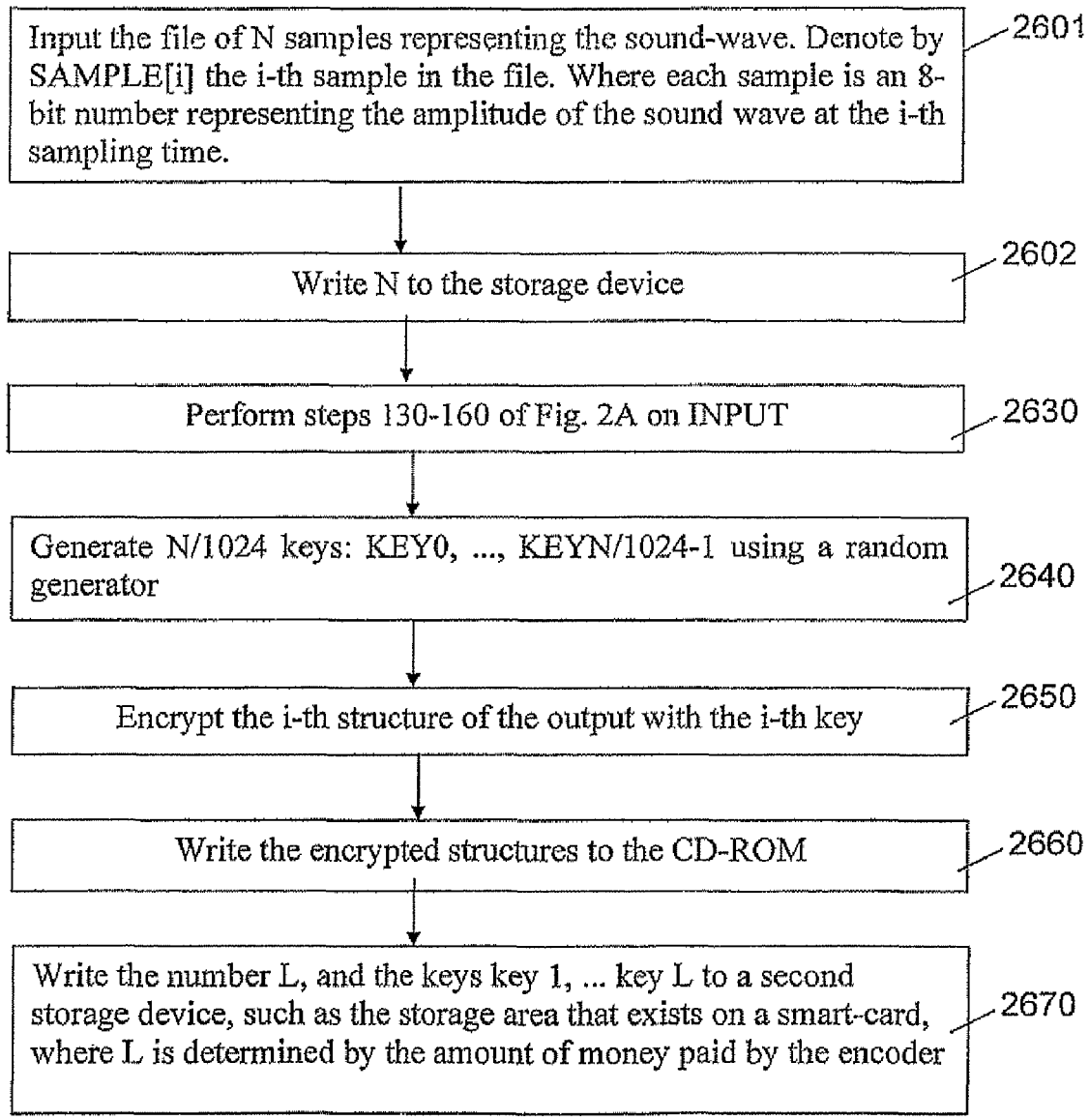
Figure 8:
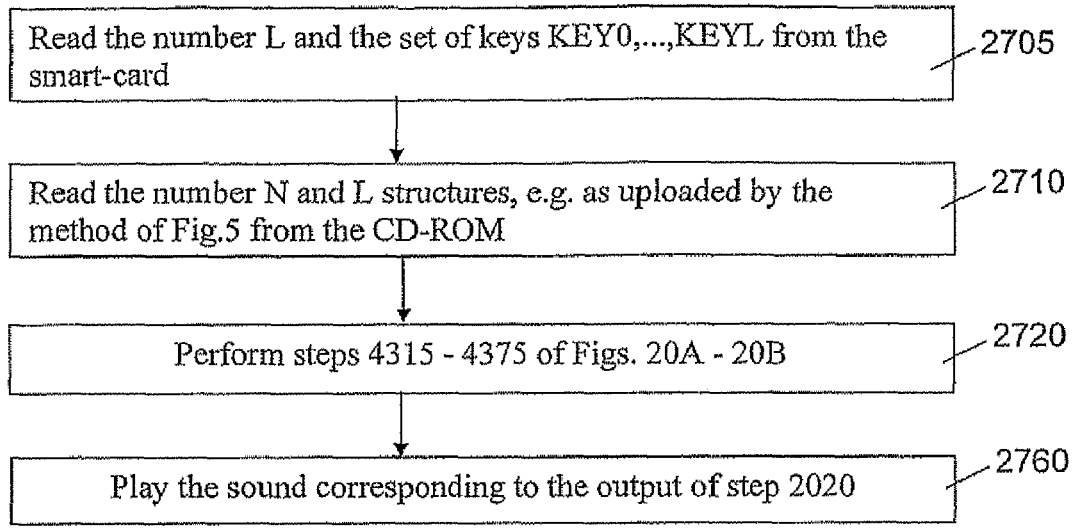
Figure 18:
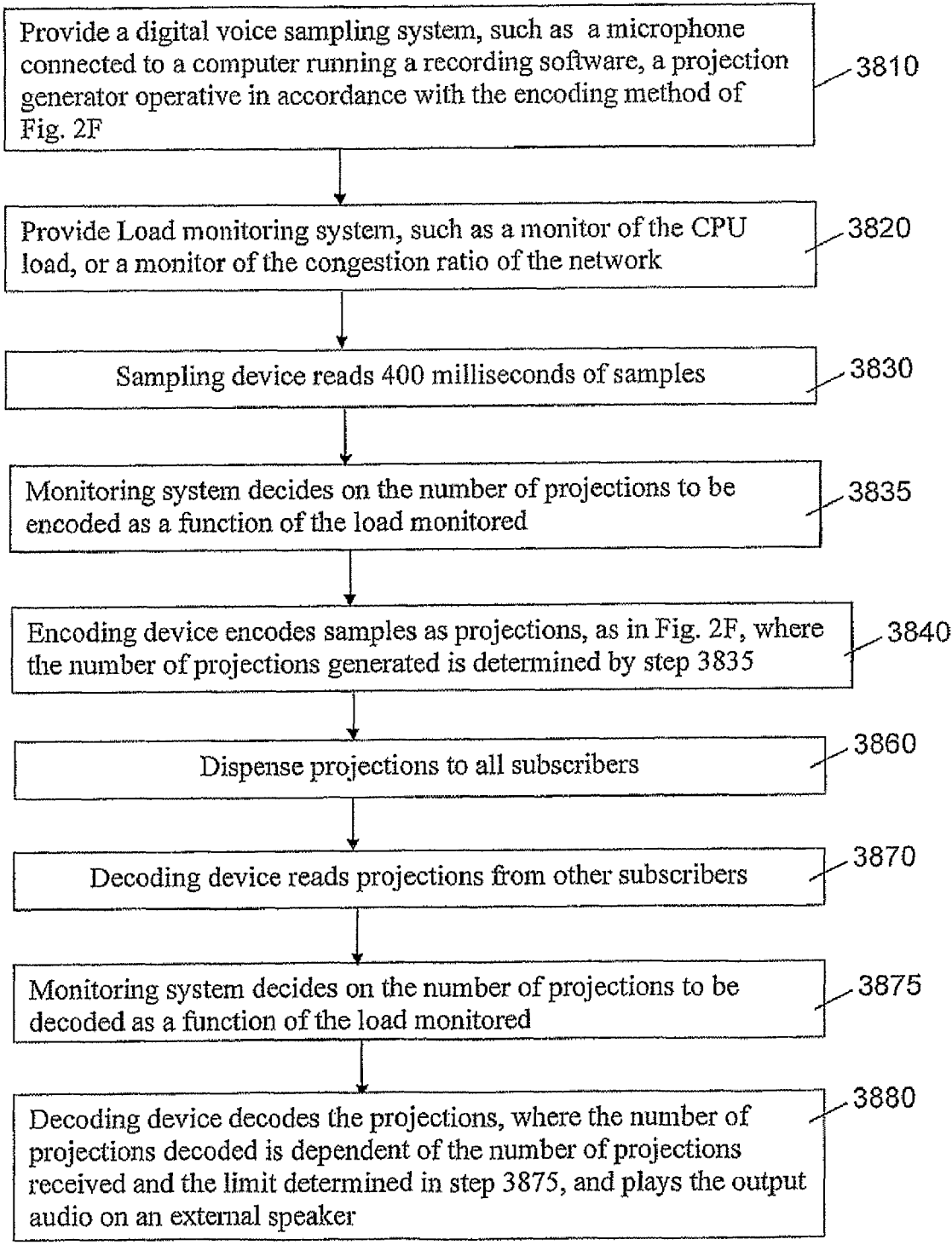
Figure 19:
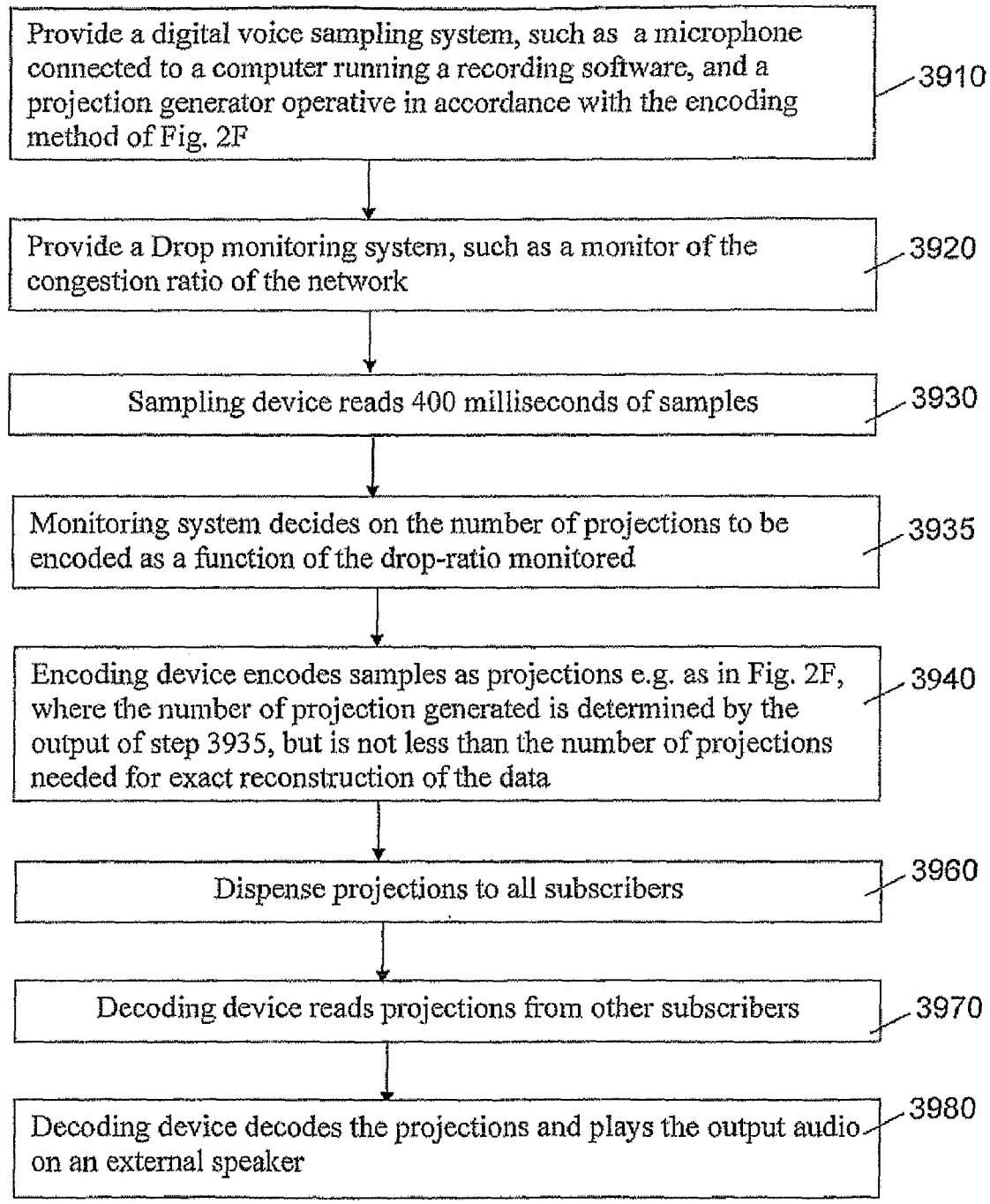
Figure 20A:
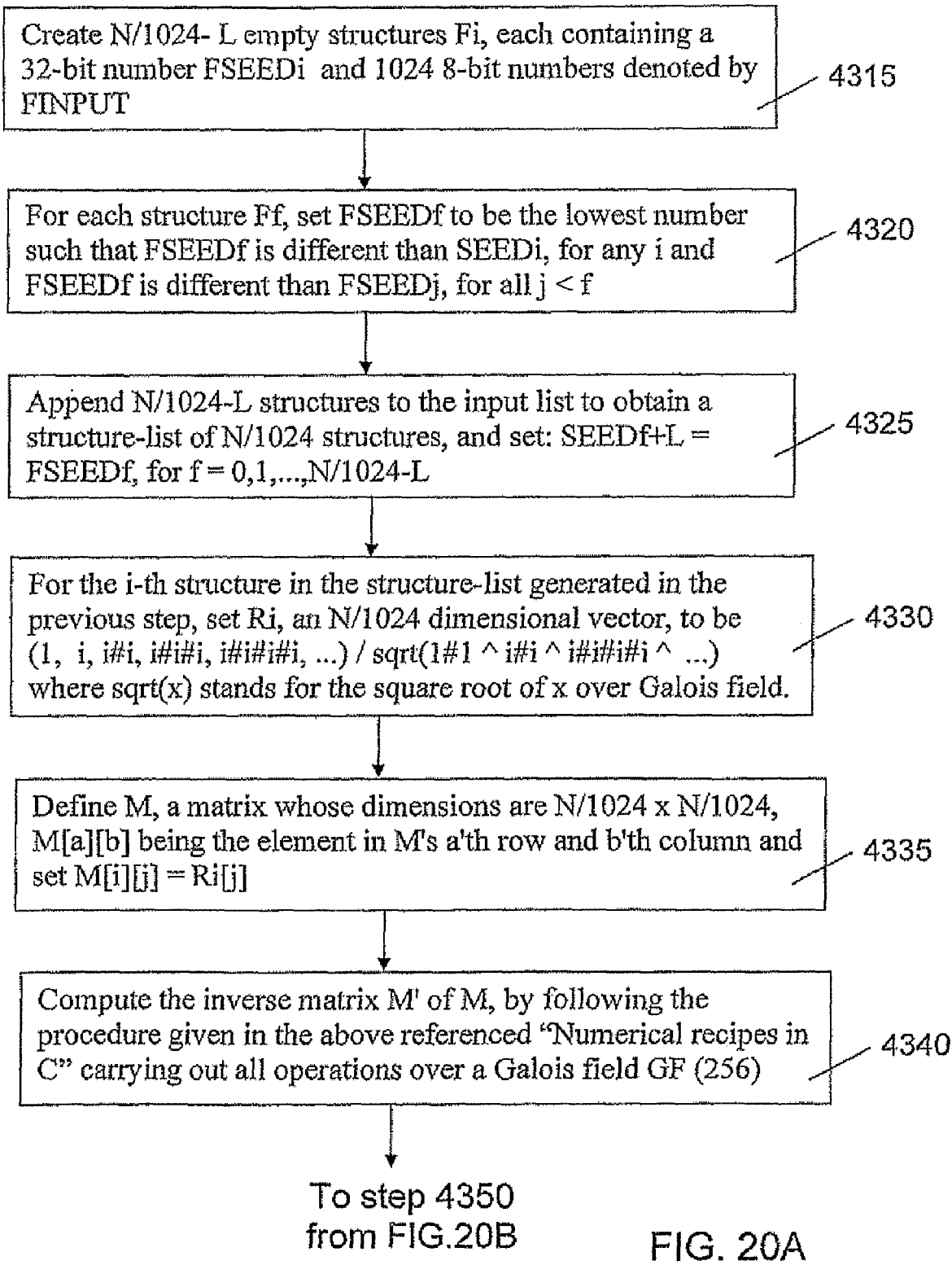
Figure 20B:
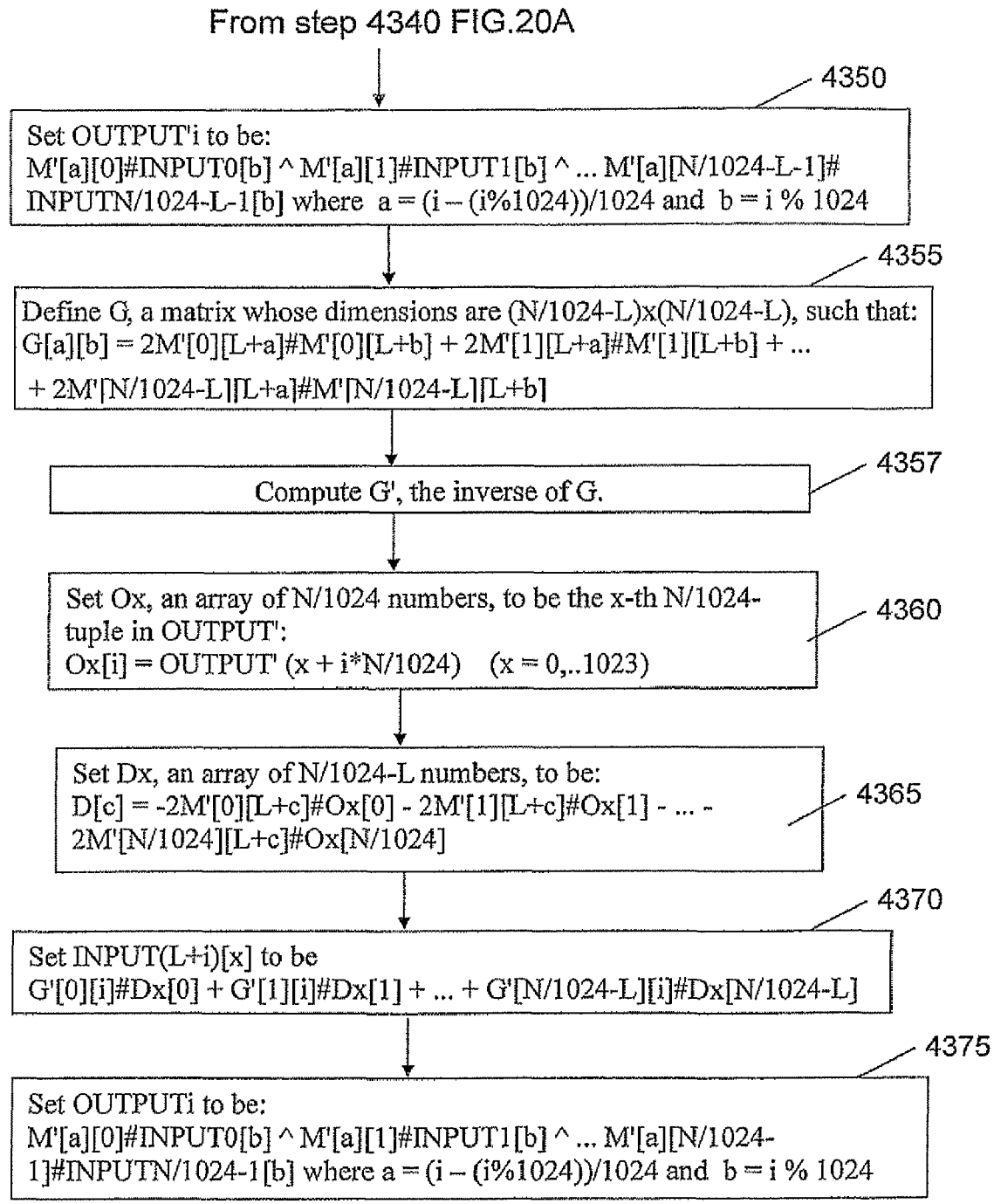

Fig, 2A is a simplified flowchart illustration of a method for encoding a sound file in projection form, the method being constructed and operative in accordance with certain embodiments of the present invention;

FIG. 2B is a simplified flowchart illustration of a method for encoding a black and white image, the method being constructed and operative in accordance with certain embodiments of the present invention;

FIG. 2C is a simplified flowchart illustration of a method for encoding a color image, the method being constructed and operative in accordance with certain embodiments of the present invention;

FIG. 2D is a simplified flowchart illustration of a method for off-line encoding a sequence of color images ("frames") such as a video, the method being constructed and operative in accordance with certain embodiments of the present invention;

FIG. 2E is a simplified flowchart illustration of a method for encoding a stream of color images ("frames");

FIG. 2F is a simplified flowchart illustration of a method for encoding an audio stream;

FIG. 3A is a simplified flowchart illustration of a method for decoding projections completely representing a sound file, the method being constructed and operative in accordance with certain embodiments of the present invention;

FIG. 3B is a simplified flowchart illustration of a method for decoding a black and white image encoded in accordance with the method of FIG. 2B, assuming no data has been lost;

FIG. 3C is a simplified flowchart illustration of a method for decoding a color image encoded in accordance with the method of FIG. 2C, assuming no data has been lost, the method being constructed and operative in accordance with certain embodiments of the present invention;

FIG. 3D is a simplified flowchart illustration of a method for off-line decoding a sequence of color images ("frames") such as a video encoded in accordance with the method of FIG. 2D, assuming no data has been lost, the method being constructed and operative in accordance with certain embodiments of the present invention;

FIG. 3E is a simplified flowchart illustration of a method for decoding a stream of color images ("frames") encoded in accordance with the method of FIG. 2E, assuming no data has been lost, the method being constructed and operative in accordance with certain embodiments of the present invention;

FIG. 3F is a simplified flowchart illustration of a method for decoding an audio stream encoded in accordance with the method of FIG. 2F, assuming no data has been lost, the method being constructed and operative in accordance with certain embodiments of the present invention;

FIG. 4A is a simplified flowchart illustration of a method for decoding projections incompletely and partially representing a sound file, the method being constructed and operative in accordance with certain embodiments of the present invention;

FIG. 4B is a simplified flowchart illustration of a method for decoding a black and white image encoded in accordance with the method of FIG. 2B, assuming data has been lost, the method being constructed and operative in accordance with certain embodiments of the present invention;

FIG. 4C is a simplified flowchart illustration of a method for decoding a color image encoded in accordance with the method of FIG. 2C, assuming data has been lost, the method being constructed and operative in accordance with certain embodiments of the present invention;

FIG. 4D is a simplified flowchart illustration of a method for off-line decoding a sequence of color images ("frames") such as a video encoded in accordance with the method of FIG. 2D, assuming data has been lost, the method being constructed and operative in accordance with certain embodiments of the present invention;

FIG. 4E is a simplified flowchart illustration of a method for decoding a stream of color images ("frames") encoded in accordance with the method of FIG. 2E, assuming data has been lost, the method being constructed and operative in accordance with certain embodiments of the present invention;

FIG. 4F is a simplified flowchart illustration of a method for decoding an audio stream encoded in accordance with the method of FIG. 2F, assuming data has been lost, the method being constructed and operative in accordance with certain embodiments of the present invention;

FIG. 5 is a simplified flowchart illustration of a method for encoding a sequence of one or more images, such as video file, in projection form, the method being constructed and operative in accordance with certain embodiments of the present invention;

FIG. 6 is a simplified flowchart illustration of a method for decoding a set of projections representing a sequence of one or more images, such as a video file, generated in accordance with the method of FIG. 5, the method of FIG. 6 being constructed and operative in accordance with certain embodiments of the present invention;

FIG. 7 is a simplified flowchart illustration of a method for dispensing content material to one or more subscribers, where the quality of the content is determined by the encoder ex post facto, after the content has been created, and may be different for different subscribers;

FIG. 8 is a simplified flowchart illustration of a method for encoding of content where the content is uniform for all subscribers, and the quality of the content is different for different subscribers; and FIGS. 9-19 are simplified flowchart illustrations of certain applications of certain of the methods of FIGS. 2A-8, which are merely exemplary and are not intended to be limiting; and FIGS. 20A and 20B, taken together, form a simplified flowchart illustration of a method for performing step 340 of FIG. 4A according to certain embodiments of the present invention.

DETAILED DESCRIPTION OF CERTAIN EMBODIMENTS

Figure 1:
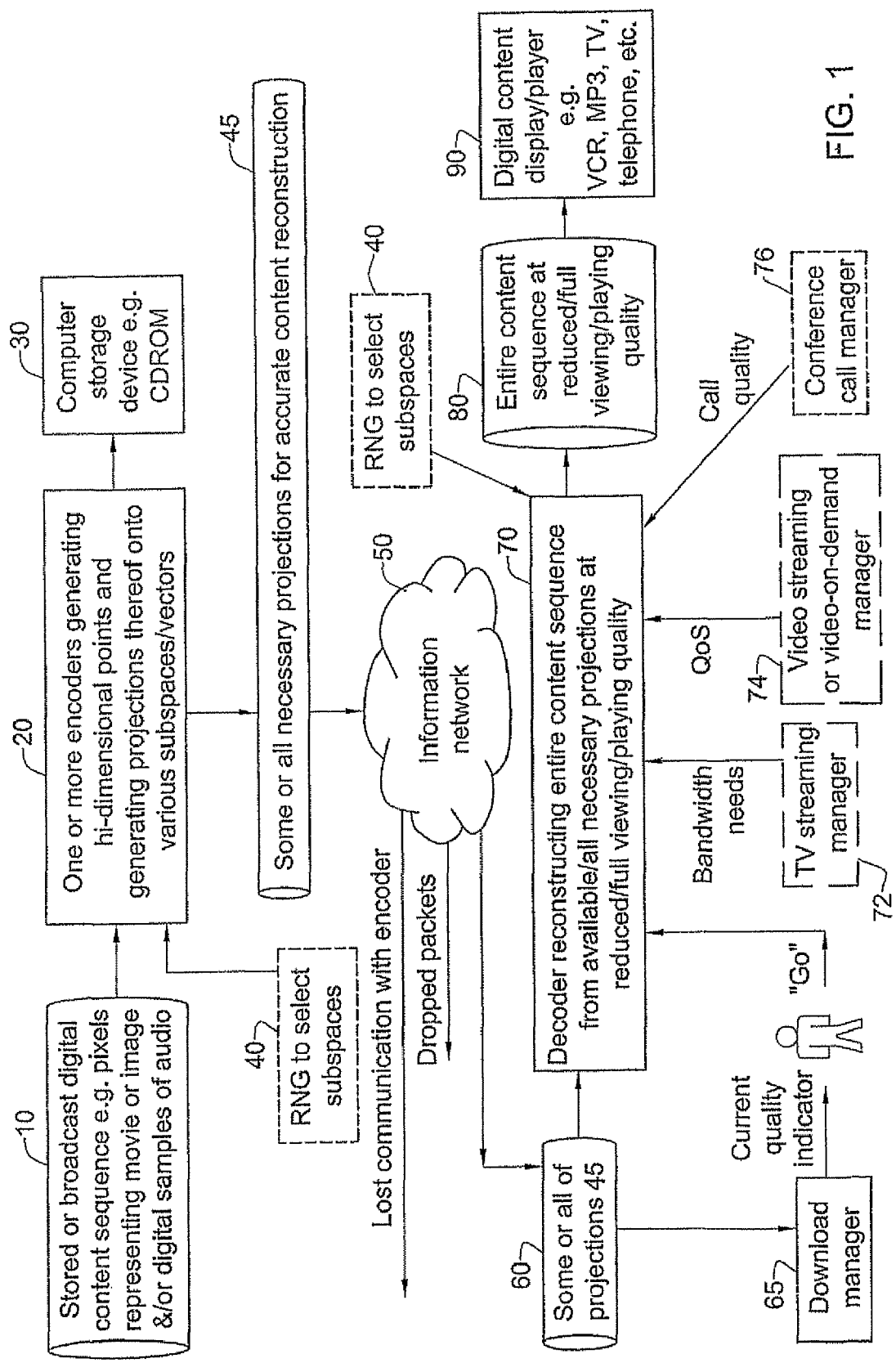
FIG. 1 is a simplified functional block diagram of a system for dispensing content data represented as projections, the system being constructed and operative in accordance with certain embodiments of the present invention.

Reference is now made to FIG. 1 which is a simplified functional block diagram of a system for dispensing content data represented as projections, the system being constructed and operative in accordance with certain embodiments of the present invention.

As shown, a stored or broadcast digital content sequence 10 e.g. pixels representing movie or image &/or digital samples of audio, is provided to one or more is encoders 20 generating high-dimensional points and generating projections thereof onto various subspaces or vectors, all in accordance with encoding methods shown and described herein e.g. with reference to FIGS. 2A-2E. The output of the encoders 20 may be stored in a computer storage device 30 such as a CDROM. Subspaces may be selected by a conventional random number generator (RNG) 40. Alternatively, a description of suitable projection subspaces may be externally provided. The output 45 of the encoders 20 typically some or all necessary projections for accurate content reconstruction. The output 45 may also comprise redundant projections to accommodate packet loss, loss of connection with certain encoders, and other exigencies. The output of the encoders 20 is typically transmitted over an information network 50 to a decoder 70 which is operative in accordance with any of the decoding methods shown and described herein.

For example, if the content comprises sound and the encoder/s 20 are operative in accordance with the encoding method of FIG. 2A, the decoder 70 is typically operative in accordance with the decoding method of FIGS. 3A or 4A, depending on whether or not it can be assumed that the projections are a complete representation of the original content.

If the content comprises a black and white image and the encoder/s 20 are operative in accordance with the encoding method of FIG. 2B, the decoder 70 is typically operative in accordance with the decoding method of FIGS. 3B or 4B, depending on whether or not it can be assumed that the projections are a complete representation of the original content.

If the content comprises a colored image and the encoder/s 20 are operative in accordance with the encoding method of FIG. 2C, the decoder 70 is typically operative in accordance with the decoding method of FIGS. 3C or 4C, depending on whether or not it can be assumed that the projections are a complete representation of the original content.

If the content comprises an off-line stored sequence of colored images and the encoder/s 20 are operative in accordance with the encoding method of FIG. 2D, the decoder 70 is typically operative in accordance with the decoding method of Figs, 3D or 4D, depending on whether or not it can be assumed that the projections are a complete representation of the original content.

If the content comprises a stream of colored images and the encoder/s 20 are operative in accordance with the encoding method of FIG. 2E, the decoder 70 is typically operative in accordance with the decoding method of FIGS. 3E or 4E, depending on whether or not it can be assumed that the projections are a complete representation of the original content.

If the content comprises an audio stream and the encoder/s 20 are operative in accordance with the encoding method of FIG. 2F, the decoder 70 is typically operative in accordance with the decoding method of FIGS. 3F or 4F, depending on whether or not it can be assumed that the projections are a complete representation of the original content.

In the course of transmission, packets may be dropped and/or communication with certain encoders may be lost. Therefore, projections 60 supplied to the decoder 70 may comprise all, or only some, of projections 45.

A download manager 65 provides a current quality indicator to a human user who may according to certain embodiments of the present invention interface with download manager 65 by electing to "go", i.e. to forgo additional projections, if the current quality of the content, as reconstructed from projections supplied to the decoder 70, suffices for his purposes.

Decoder 70 reconstructs the entire content sequence from the available projections which may or may not be sufficient for full playing quality; if they are not sufficient, reduced playing quality is obtained.

An optional TV streaming manager 72 is operative to control how many projections are transmitted and/or decoded, based on bandwidth needs, in TV streaming applications. If bandwidth needs are high, the manager 72 may determine that only a limited number of projections be transmitted and/or decoded. Otherwise, the manager may determine that a proportionately larger number of projections be transmitted and/or decoded, An optional video streaming or video-on demand manager is operative to control how many projections are transmitted and/or decoded, based on quality of service considerations, in video streaming or video-on demand applications in which different subscribers deserve different qualities of service. If deserved quality of service is low, the manager 74 may determine that only a limited number of projections be transmitted and/or decoded. Otherwise, the manager may determine that a proportionately larger number of projections be transmitted and/or decoded.

An optional conference call manager 76 is operative to control how many projections are transmitted and/or decoded, based on call quality considerations, in tele-conferencing or video-conferencing applications in which different subscribers deserve different qualities of service. If deserved quality of service is low, the manager 76 may determine that only a limited number of projections be transmitted and/or decoded. Otherwise, the manager may determine that a proportionately larger number of projections be transmitted and/or decoded.

The output of decoder 70 is the entire content sequence 80 at either reduced or full viewing/playing quality. The content sequence is presented to the user by a suitable digital content display/player 90, depending on the application, such as but not limited to a VCR, MP3, TV, or telephone.

Reference is now made to FIG. 2A which is a simplified flowchart illustration of a method for encoding a Sound File for uploading. The input of the method of FIG. 2A typically comprises a file that contains samples of a sound wave that can be played by a speaker, such as samples sampled by some digital means. For simplicity and without loss of generality, it is assumed that each sample SAMPLE[i] (I=1, . . . N) comprises an integer from 0 to 255, represented by 8 bits. Alternatively, the samples may have other resolutions such as 4 bit, 16 bit, and 24 bit. N is the number of samples in the file. For simplicity and without loss of generality, it is assumed that N is an integer multiple of 1024. If N is not a multiple of 1024 1024-(N % 1024) zeros may be appended to the end of the data. The decoder is informed of N and can then artificially add equations or projections that force these trailing bytes to be zero in the decoder's reconstructed output.

The method of FIG. 2A typically includes some or all of the following steps, in any suitable order such as that illustrated:

Step 110: sample a sound-wave, thereby to generate a file (one dimensional array) of samples representing the sound-wave.

Step 120: input the file of samples representing the sound-wave. Denote by SAMPLE[i] the i-th sample in the file.

Where each sample is an 8-bit number representing the amplitude of the sound wave at the i-th sampling time.

Step 130: Denote by V0, ..., VN/1024-1, a set of N/1024 vectors whose dimension is 1024, and set Vi to be (SAMPLE[i*1024+0], SAMPLE[i*1024+1], ..., SAMPLE[i*1024+1023]), for i=1, ... N/1024

Step 140: generate each i-th structure in the output (for I=1, ... N or until interrupted):

Step 145: set SEEDi to be i.

Step 150: denote by Ri a vector whose dimension is N/1024 and set Ri to be:

(1, i, i#i, i#i#i, i#i#i#i ... )/sqrt(1#1^i#i^i#i#i#i^ ... )

where sqrt(x) stands for the square root of x over Galois field.

Step 155: set OUTPUTi[d] to be Ri[0]#V0[d]^ ... ^ Ri[N/1024]#VN/1024-1[d],

Step 160: upload the number N and the list of structures (typically each structure i is uploaded as soon as it is ready), each structure i containing SEEDi and the array of 1024 8-bit numbers termed OUTPUTi The method of FIG. 2A generates an output, for uploading, that includes the number N and a list of structures. Each structure contains a 32-bit number (denoted by SEED) and an array of 1024 8-bit numbers (denoted by OUTPUT). SEEDi is the 32-bit number contained in the i-th structure, and OUTPUTi[j] is the j-th 8-bit number contained in the i-th structure. The length of the list (number of structures) determines the quality of the sound decoded. For simplicity and without loss of generality, it is assumed that the maximal length of the list is 2 exp 32 (4294967296) structures.

In FIG. 2A and in other figures, all numerical operators are effected over the following Galois field: GF(256). Galois fields are described in "Introduction to Finite Fields and their Applications" by Rudolf Lidl and Harald Niederreiter.

In FIG. 2A and other figures, '#' denotes multiplication over a Galois field such as GF(256), '^' is the standard bit-wise-XOR operation, and '%' indicates a modulo operation.

Reference is now made to FIG. 3A which is a simplified flowchart illustration of a method for downloading and Decoding a Sound File encoded and uploaded in accordance with the method of FIG. 2A, assuming that there has been no Loss of Data.

The input of the method of FIG. 3A typically includes a number N, and a list of structures, e.g. as uploaded by the method of FIG. 2A. The term "list" is used herein to refer to a set which may be ordered and may be stored as a list or may have any other suitable data structure. Each structure i contains a 32-bit number denoted by SEEDi and an array of 1024 8-bit numbers denoted by INPUTi. INPUTi[j] denotes the j-th 8-bit number contained in the i-th structure. The length of the list determines the quality of the sound decoded. The maximal length of the list is assumed to be 2 exp 32 or 4294967296 structures. If the list is greater than N/1024, then only N/1024 structures are considered and the rest are discarded. The length of the list is assumed to be at least as large as N/1024.

As shown, a data stream of length n samples may be regarded herein as 1024 n/1024-dimensional vectors in n/1024-dimensional space. The vectors may be projected onto other random vectors, yielding 1024 scalar values. Using n scalars from n/1024 linear independent projections the vectors can be reconstructed. If d is a vector of data, and v is the vector to project d onto, then the projection is the scalar product vd. Given n/1024 linear independent vectors $v_1, \ldots, v_{n/1024}$, whose d's projections on them are the values $x_1, \ldots, x_{n/1024}$ gather $v_1, \ldots, v_{n/1024}$ into a matrix M and formulate the relations between $v_1, \ldots, v_{n/1024}, x_1, \ldots, x_{n/1024}$ and d as: Md=x. The multiplication here stands for the product of the matrix (M) with a vector (d), yielding a vector (x).

Since $v_1, \ldots, v_{n/1024}$ are linearly independent M is reversible hence d can be reconstructed back from x:: $d=M^{-1}x$. Similarly, a data stream of length n can be regarded as a polygonal line of m point in n/m-dimensions, and processed as described above, mutatis mutandis.

With reference to the above-referenced publication by Johnson and Lindenstrauss it is believed that using random orthogonal projections to reduce the dimensions of data yields good results. More formally, the expected distortion is not very high. With reference to the above-referenced publication by Hecht-Nielsen, it is believed that random projections behave much like random orthogonal projections. Generally, it is believed that random projections can be used successfully to reduce the dimensionality of data.

The method of FIG. 3A generates an output which comprise an array of N numbers, each number between 0 and 255 and representing a sample that can be played by a speaker such as samples generated by a digital recording device. OUTPUT[i] denotes the i-th number in the output (I=1, ... N).

The method of FIG. 3A typically includes some or all of the following steps, in any suitable order such as that illustrated:

Step 210: download a number N and a a list of structures, e.g. as uploaded by the method of FIG. 2A Step 220: For the i-th structure in the input, set Ri, an N/1024 dimensional vector, to be:

(1, i, i#i, i#i#i, i#i#i#i, ... )/sqrt(1#1^i#i^i#i#i#i^ ... )

where sqrt(x) stands for the square root of x over Galois field.

Step 230: set M, a matrix whose dimensions are N/1024× N/1024 and whose elements are M[a][b], where a denotes row number and b denotes column number, as follows: M[i][j]=Ri[j]

Step 240: Compute the inverse matrix M' of M, e.g. by following the procedure given in "Numerical recipes in C" second edition, by William H. Press, Saul A. Teukolsky, William T. Vetterling, Brian P. Flannery, page 39, chapter 2, carrying all operations over a Galois field GF(256)

Step 250: Set OUTPUTi to be:

M'[a][0]#INPUT0[b]^M'[a][1]#INPUT1[b]^ ... M'[a][N/1024-1]#INPUTN/1024-1[b]

where a=(i-(i % 1024))/1024 and b=i % 1024

Step 260: using OUTPUT[i] (I=1, ... N) as sound wave samples, play sound wave

Reference is now made to FIG. 4A which is a simplified flowchart illustration of a method for downloading and Decoding a Sound File encoded and uploaded in accordance with the method of FIG. 2A, taking into account that data may have been lost.

The input of the method of FIG. 4A typically includes a number N, and a list of structures, e.g. as uploaded by the method of FIG. 2A. Each structure i contains a 32-bit number denoted by SEEDi and an array of 1024 8-bit numbers denoted by INPUTi. INPUTi[j] denotes the j-th 8-bit number contained in the i-th structure. The length of the list determines the quality of the sound decoded. The maximal length of the list is assumed to be 2 exp 32 or 4294967296 structures. If the list is greater than N/1024, then only N/1024 structures are considered and the rest are discarded.

L is the size of the list as actually received, also termed herein the "input list", e.g. the output of a partial rendition of the method of FIG. 2A. L is assumed to be at least 1, and no more than N/1024-1.

The method of FIG. 4A generates an output which comprise an array of N numbers, each number between 0 and 255 and representing a sample that can be played by a digital speaker such as a sample generated by a digital recording device. OUTPUT[i] denotes the i-th number in the output (I=1, ... N).

The method of FIG. 4A typically includes some or all of the following steps, in any suitable order such as that illustrated:

Step 310: download a number N and a a list of structures, e.g. as uploaded by the method of FIG. 2A Step 315: Create N/1024−L empty structures Fi, each containing a 32-bit number FSEEDi and 1024 8-bit numbers denoted by FINPUTi Step 320: For each structure Ff, set FSEEDf to be the lowest number such that FSEEDf is different than SEEDi, for any i and FSEEDf is different than FSEEDi, for all j<f Step 325: Append N/1024−L structures to the input list to obtain a structure-list of N/1024 structures, and set: SEEDf+L=FSEEDf, for f=0,1, ..., N/1024−L Step 330: For the i-th structure in the structure-list generated in the previous step, set Ri, an N/1024 dimensional vector, to be $(1, i, i\#i, i\#i\#i, i\#i,\#i\#i, \ldots)/\mathrm{sqrt}(1\#1\hat{\ }i\#i\hat{\ }i\#i\#i\#i\hat{\ }\ldots)$
where sqrt(x) stands for the square root of x over Galois field.

Step 335: define M, a matrix whose dimensions are N/1024×N/1024, M[a][b] being the element in M's a'th row and b'th column and set M[i][j]=Ri[j]

Step 340: Compute the inverse matrix M' of M, by following the procedure given in the above referenced "Numerical recipes in C" carrying out all operations over a Galois field GF(256)

Step 350: Set OUTPUT'i to be:

$M'[a][0]\#INPUT0[b]\hat{\ }M'[a][1]\#INPUT1[b]\hat{\ }\ldots$
$M'[a][N/1024-L-1]\#INPUTN/1024-L-1[b]$
where $a=(i-(i\ \%\ 1024))/1024$ and $b=i\ \%\ 1024$ Step 355: define G, a matrix whose dimensions are (N/1024−L)×(N/1024−L), such that:

$G[a][b]=2M'[0][L+a]\#M'[0][L+b]+2M'[1][L+a]\#M'[1][L+b]+\ldots+2M'[N/1024-L][L+a]\#M'[N/1024-L][L+b]$ Step 357: compute G', the inverse of G.

Step 360: set Ox, an array of N/1024 numbers, to be the x-th N/1024-tuple in OUTPUT':

$Ox[i]=OUTPUT'(x+i*N/1024)\ (x=0,\ldots 1023)$

Step 365: set Dx, an array of N/1024−L numbers, to be:

$Dx[c]=-2M'[0][L+c]\#Ox[0]-2M'[1][L+c]\#Ox[1]-\ldots-2M'[N/1024][L+c]\#Ox[N/1024]$ Step 370: Set INPUT(L+i)[x] to be $G'[0][i]\#Dx[0]+G'[1][i]\#Dx[1]+\ldots+G'[N/1024-L][i]\#Dx[N/1024-L]$ Step 375: Set OUTPUTi to be:

$M'[a][0]\#INPUT0[b]\hat{\ }M'[a][1]\#INPUT1[b]\hat{\ }\ldots$
$M'[a][N/1024-1]\#INPUTN/1024-1[b]$ where
$a=(i-(i\ \%\ 1024)/1024$ and $b=i\ \%\ 1024$ Step 380: using OUTPUT[i] (I=1, ... N) as sound wave samples, play sound wave A particular advantage of the method of FIG. 4A is that it is not necessary to download the data in the correct order. When downloading projections of image data onto random vectors the order of receiving the projections does not matter. The projections are typically linearly independent, which may be accomplished at sufficiently high probability by randomly selecting the vectors on which to project. The exact probability of linear dependence depends on the random function, and the size of the field in which the projection is made. Adding a source to the download may be effected by receiving projections from that source. There is no need to partition the data into chunks and assign different chunks of the image data to different sources. Instead, all sources may transmit projections of the data onto randomly selected vectors, and when the downloader has downloaded enough projections, where sufficiency depends on the desired quality of service, the downloader can reconstruct the image data from the set of downloaded projections. Therefore, when a source has prematurely disconnected, and no more projections are received from it, there is no need to reassign any chunks to other sources.

As described above, if the content comprises a black and white image and the encoder/s 20 are operative in accordance with the encoding method of FIG. 2B, the decoder 70 is typically operative in accordance with the decoding method of FIG. 3B or 4B, depending on whether or not it can be assumed that the projections are a complete representation of the original content.

The method of FIG. 2B typically comprises some or all of the following steps, suitably ordered e.g. as shown:

Step 405: input black and white image data whose size is X×Y pixels; e.g. by reading in a digitally representation of an image as a two dimensional array IMG; where IMG[x][y] is an 8-bit number that represents the intensity of the pixel at the x-th row and the y-th colon (0 being black and 255 being white).

Step 410: Generate a one dimensional input array INPUT of XY bytes such that:

$INPUT[i]=IMG[i\ \%\ X][i/X]$

Step 420: Send to the decoder the values: X and Y

Step 430: Denote by V0, ..., VN/1024−1, a set of N/1024 vectors whose dimension is 1024, and set Vi to be (SAMPLE[i*1024+0], SAMPLE[i*1024 +1], ..., SAMPLE[i*1024 +1023]), for i=1, ... N/1024

Step 440: generate each i-th structure in the output (for I=1, ... N or until interrupted):

Step 445: set SEEDi to be i.

Step 450: denote by Ri a vector whose dimension is N/1024 and set Ri to be:

$(1, i, i\#i, i\#i\#i, i\#i\#i\#i, \ldots)/\mathrm{sqrt}(1\#1\hat{\ }i\#i\hat{\ }i\#i\#i\#i\hat{\ }\ldots)$ where sqrt(x) stands for the square root of x over Galois field.

Step 455: set OUTPUTi[d] to be $Ri[0]\#V0[d]\hat{\ }\ldots\hat{\ }Ri[N/1024]\#VN/1024-1[d]$.

Step 460: upload the number N and the list of structures (typically each structure i is uploaded as soon as it is ready), each structure i containing SEEDi and the array of 1024 8-bit numbers termed OUTPUTi.

The method of FIG. 3B typically comprises some or all of the following steps, suitably ordered e.g. as shown:

Step 510: download numbers X,Y and a a list of structures, e.g. as uploaded by the method of FIG. 5.

Step 515: Set N to be XY.

Step 520: perform steps 220-250 of FIG. 3A.

Step 560: Construct a two dimensional array IMG of size X×Y and set $IMG[x][y]=OUTPUT[x+y*X]$ Step 570: display IMG on the screen.

The method of FIG. 4B typically comprises some or all of the following steps, suitably ordered e.g. as shown:

Step 610: download numbers X,Y and a a list of structures, e.g. as uploaded by the method of FIG. 5

Step 620: Set N to be XY

Step 630: perform steps 315-375 of FIG. 4A

Step 640: Construct a two dimensional array IMG of size X×Y and set $$IMG[x][y]=OUTPUT[x+y*X]$$

Step 650: display IMG on the screen.

As described above, if the content comprises a colored image and the encoder/s 20 are operative in accordance with the encoding method of FIG. 2C, the decoder 70 is typically operative in accordance with the decoding method of FIGS. 3C or 4C, depending on whether or not it can be assumed that the projections are a complete representation of the original content.

The method of FIG. 2C typically comprises some or all of the following steps, suitably ordered e.g. as shown:

Step 705: input image data whose size is X×Y pixels; e.g. by reading in a digitally representation of an image as a two dimensional array IMG, where IMG[x][y] is a triplet of 8-bit numbers representing the red, green and blue intensity (respectively) of the pixel at the x-th row and the y-th colon.

Step 710: Generate one-dimensional input array INPUT of 3XY bytes such that:

$$INPUT[i]=\text{red intensity of}(IMG[i \% X][int(i/X)])$$

$$INPUT[XY+i]=\text{green intensity of}(IMG[i \% X][int(i/X)])$$

$$INPUT[2XY+i]=\text{blue intensity of}(IMG[i \% X][int(i/X)])$$

Step 720: Send to the decoder the values: X and Y

Step 730: perform steps 130-160 of FIG. 2A on INPUT

The method of FIG. 3C typically comprises some or all of the following steps, suitably ordered e.g. as shown:

Step 810: download numbers X,Y and list of structures, e.g. as uploaded by the method of FIG. 2C.

Step 815: Set N to be 3XY.

Step 820: perform steps 220-250 of FIG. 3A.

Step 860: Construct a two dimensional array IMG of size X×Y and set $$\text{red intensity of } IMG[x][y]=OUTPUT[x+y*X]$$

$$\text{green intensity of } IMG[x][y]=OUTPUT[XY+x+y*X]$$

$$\text{blue intensity of } IMG[x][y]=OUTPUT[2XY+x+y*X]$$

Step 870: display IMG on the screen.

The method of FIG. 4C typically comprises some or all of the following steps, suitably ordered e.g. as shown:

Step 910: download numbers X,Y and a a list of structures, e.g. as uploaded by the method of FIG. 5.

Step 915: Set N to be 3XY.

Step 920: perform steps 315-375 of FIG. 4A.

Step 960: Construct a two dimensional array IMG of size X×Y and set: red intensity of IMG[x][y]=OUTPUT[x+y*X]; green intensity of IMG[x][y]=OUTPUT[XY+x+x+y*X]; and blue intensity of IMG[x][y]=OUTPUT[2XY+x+y*X].

Step 970: display IMG on the screen.

As described above, if the content comprises an off-line stored sequence of colored images and the encoder/s 20 are operative in accordance with the encoding method of FIG. 2D, the decoder 70 is typically operative in accordance with the decoding method of FIGS. 3D or 4D, depending on whether or not it can be assumed that the projections are a complete representation of the original content.

The method of FIG. 2D typically comprises some or all of the following steps, suitably ordered e.g. as shown:

Step 1005: input video data whose size is X×Y pixels with F frames; e.g. by reading in a digitally representation of a video as a three dimensional array VID, where VID[f][x][y] is a triplet of 8-bit numbers representing the red, green and blue intensity (respectively) of the pixel at the x-th row and the y-th colon in the f-th frame.

Step 1010: Generate one-dimensional input array INPUT of 3XYF bytes such that:

$$INPUT[i]=\text{red intensity of}(VID[i \% 3XY][int(i/3XY) \% X][int(int(i/3XY)/X)])$$

$$INPUT[FXY+i]=\text{green intensity of}(VID[i \% 3XY][int(i/3XY) \% X][int(int(i/3XY)/X)])$$

$$INPUT[2FXY+i]=\text{blue intensity of}(VID[i \% 3XY][int(i/3XY) \% X][int(int(i/3XY)/X)])$$

Step 1020: Send to the decoder the values: F, X and Y

Step 1030: Perform steps 130-160 of FIG. 2A on INPUT

The method of FIG. 3D typically comprises some or all of the following steps, suitably ordered e.g. as shown:

1100: download numbers X,Y,F and list of structures, e.g. as uploaded by the method of FIG. 2d 1115: Set N to be 3XYF 1120: perform steps 220-250 of FIG. 3A 1160: Construct a three dimensional array VID of size X×Y×F (where VID[f][x][y] represents the RGB values of the pixel in the f-th frame at the x-th row and y-th colon) and set $$\text{red intensity of } VID[f][x][y]=OUTPUT[f*X*Y+y*X+x]$$

$$\text{green intensity of } VID[f][x][y]=OUTPUT[F*X*Y+f*X*Y+x+y*X]$$

$$\text{blue intensity of } VID[f][x][y]=OUTPUT[2*F*X*Y+f*X*Y+x+y*X]$$

1170: display VID on the screen

The method of FIG. 4D typically comprises some or all of the following steps, suitably ordered e.g. as shown:

Step 1200: download numbers X,Y,F and list of structures, e.g. as uploaded by the method of Fig, 2d Step 1215: Set N to be 3FXY Step 1220: perform steps 315-375 of FIG. 4A Step 1260: Construct a three dimensional array VID of size X×Y×F (where VID[f][x][y] represents the RGB values of the pixel in the f-th frame at the x-th row and y-th colon) and set red intensity of VID[f][x][y]=OUTPUT[f*X*Y+y*X+x], green intensity of VID[f][x][y]=OUTPUT[F*X*Y+f*X*Y+x+y*X], blue intensity of VID[f][x][y]=OUTPUT[2*F*X*Y+f*X*Y+x+y*X]].

As described above, if the content comprises a stream of colored images and the encoder/s 20 are operative in accordance with the encoding method of FIG. 2E, the decoder 70 is typically operative in accordance with the decoding method of FIGS. 3E or 4E, depending on whether or not it can be assumed that the projections are a complete representation of the original content.

The method of FIG. 2E typically comprises some or all of the following steps, suitably ordered e.g. as shown:

Step 1301: input video data whose size is X×Y pixels, and frame rate is F frames per second; e.g. by reading in a digitally representations of video frames, each frame being a two dimensional array FRM, where FRM[x][y] is a triplet of 8-bit numbers representing the red, green and blue intensity (respectively) of the pixel at the x-th row and the y-th colon in the frame.

Step 1302: Send to the decoder the values: F, X and Y

Step 1304: read F frames from the input, and put them in a three dimensional array VID such that VID[f][x][y] is the RGB values of the pixel at the f-th frame read, at the x-th row and the y-th colon.

Step 1310: Generate one-dimensional input array INPUT of 3XYF bytes such that:

INPUT[$i$]=red intensity of(VID[$i$ % 3XY]/int($i$/3XY) % X]/int(int($i$/3XY)/X)])

INPUT[FXY+$i$]=green intensity of(VID[$i$ % 3XY]/int ($i$/3XY) % X]/int(int($i$/3XY)/X)])

INPUT[2FXY+$i$]=blue intensity of(VID[$i$ % 3XY]/int ($i$/3XY) % X]/int(int($i$/3XY)/X)])

Step 1330: Perform steps 130-160 of FIG. 2A on INPUT

Step 1340: go back to step 1304 to read the next F frame of the stream (unless last frame)

The method of Fig, 3E typically comprises some or all of the following steps, suitably ordered e.g. as shown:

Step 1410: download numbers X,Y,F

Step 1411: Set N to be 3XYF

Step 1415: read list of structures, e.g. as uploaded by the method of FIG. 2e

Step 1420: perform steps 220-250 of FIG. 3A

Step 1460: Construct a three dimensional array VID of size X×Y×F (where VID[f][x][y] represents the RGB values of the pixel in the f-th frame at the x-th row and y-th colon) and set: red intensity of VID[f][x][y]=OUTPUT[f*X*Y+y*X+x], green intensity of VID[f][x][y]=OUTPUT[F*X*Y+f*X*Y+x+y*X], blue intensity of VID[f][x][y]= OUTPUT[2*F*X*Y+f*X*Y+x+y*X]]

Step 1470: display VID on the screen

Step 1480: go back to step 1415 to read the next group of F frames (unless end has been reached)

The method of FIG. 4E typically comprises some or all of the following steps, suitably ordered e.g. as shown:

Step 1510: download numbers X,Y,F

Step 1515: Set N to be 3FXY

Step 1516: download list of structures, e.g. as uploaded by the method of FIG. 2d

Step 1520: perform steps 315-375 of FIG. 4A

Step 1560: Construct a three dimensional array VID of size X×Y×F (where VID[f][x][y] represents the RGB values of the pixel in the f-th frame at the x-th row and y-th colon) and set: red intensity of VID[f][x][y]=OUTPUT[f*X*Y+y*X+x], green intensity of VID[f][x][y]=OUTPUT[F*X*Y+f*X*Y+x+y*X], blue intensity of VID[f][x][y]= OUTPUT[2*F*X*Y+f*X*Y+x+y*X]].

Step 1570: display VID on the screen

Step 1580: go back to step 1516 to read the next group of F frames (unless end has been reached)

As described above, if the content comprises an audio stream and the encoder's 20 are operative in accordance with the encoding method of FIG. 2F, the decoder 70 is typically operative in accordance with the decoding method of FIGS. 3F or 4F, depending on whether or not it can be assumed that the projections are a complete representation of the original content.

The method of FIG. 2F typically comprises some or all of the following steps, suitably ordered e.g. as shown:

Step 1601: input sound stream, whose sample rate is S samples per second; e.g. by reading samples generated by microphone, each sample being an 8-bit number representing the amplitude sampled by the microphone.

Step 1602: Send to the decoder the value S

Step 1604: read S samples from the input, and put them in an array INPUT such that INPUT[s] is the s-th sample Step 1630: Perform steps 130-160 of FIG. 2A on INPUT Step 1640: go back to step 1604 to read the next s samples of the stream The method of FIG. 3F typically comprises some or all of the following steps, suitably ordered e.g. as shown:

Step 1710: download numbers S

Step 1711: Set N to be S

Step 1715: read list of structures, e.g. as uploaded by the method of FIG. 2f

Step 1720: perform steps 220-250 of FIG. 3A

Step 1770: play OUTPUT on the speaker

Step 1780: go back to step 515 to read the next group of S samples unless end has been reached The method of FIG. 4F typically comprises some or all of the following steps, suitably ordered e.g. as shown:

Step 1810: download number S.

Step 1815: Set N to be S.

Step 1816: download list of structures, e.g. as uploaded by the method of FIG. 2F.

Step 1820: perform steps 315-375 of FIG. 4A.

Step 1870: play OUTPUT on the speaker.

Step 1880: go back to step 1816 to read the next group of S Samples unless end has been reached.

In streaming applications, e.g. as in FIGS. 2E-2F, 3E-3F, 4E-4F, the stream is typically partitioned into groups of consecutive frames and each group is decoded, and subsequently encoded, separately. Streams may be finite or, as in TV broadcasting, endless.

Reference is now made to FIGS. 5 and 6 which are simplified flowchart illustrations of methods for respectively uploading and downloading image data such as movies, in accordance with certain embodiments of the present invention.

The method of FIG. 5 typically includes some or all of the following steps, in any suitable order such as that illustrated:

Step 2405: input image data e.g. by reading in a digitally represented movie.

Represent the image data as an array of numbers e.g. as per the following publication: Ye, Jieping and Janardan, Ravi and Li, Qi "GPCA: an efficient dimension reduction scheme for image compression and retrieval". KDD '04: Proceedings of the tenth ACM SIGKDD international conference on Knowledge discovery and data mining 2004

Step 2410: Represent image data as points in high dimensional space

Step 2420: provide a random number generator that is also available to an intended receiver; send a seed to the receiver for each sender. Each sender's seed may be a randomly selected value.

Step 2430: generate a random vector

Step 2440: project the data points on the random vector by multiplying the random vector with each data point, Step 2450: send the projections to the intended receiver Step 2460: repeat steps 2430-2450 until the receiver signals to stop The method of FIG. 6 typically includes some or all of the following steps, in any suitable order such as that illustrated:

Step 2510: Collect projections pertaining to a single set of one or more images to be reconstructed, such as a movie or real-time streamed television broadcast, where the set is sent by one or more senders who may be using the method of FIG. 5

Step 2515: optionally, signal one or more of the senders to stop sending projections before the senders have independently terminated their sending process Step 2520: Solve the minimization problem under the restrictions of the projections received.

Step 2530: regard the solution of the minimization problem as pixels forming images forming a movie and play the movie Referring again to FIG. 5, the set of projection vectors may not be random but can be represented by as few bits as those enough to represent a single number. This can be achieved if the set of projections is pseudo-randomly generated. A representation of a set of projections can be a number which is used as a seed for a random generator, or a range in a full Van der-Monde matrix, where the columns are considered as vectors. Otherwise, if the set of projections is truly random and many bits are needed to represent it, the method described in FIG. 5 becomes inefficient, because the set of projections must typically be known to the decoder as well.

Regarding step 2440, a data stream of length n is regarded here as an n-dimensional vector in n-dimensional space. The vector is projected on to another random vector, yielding one scalar value. Using n scalars from n linear independent projections the vector can be reconstructed. If d is a vector of image data, and v is the vector we want to project d on to, then the projection is the scalar product vd. Given n linear independent vectors $v_1, \ldots, v_n$, whose d's projections on them are the values $x_1, \ldots, x_n$ gather $v_1, \ldots, v_n$ into a matrix M and formulate the relations between $v_1, \ldots, v_n, x_1, \ldots, x_n$ and d as: Md=x. The multiplication here stands for the product of the matrix (M) with a vector (d), yielding a vector (x).

Since $v_1, \ldots, v_n$ are linearly independent M is reversible hence d can be reconstructed back from x: $d=M^{-1}x$. Similarly, a data stream of length n can be regarded as a polygonal line of m point in n/m-dimensions, and processed as described above, mutatis mutandis.

The above-referenced publication by Johnson and Lindenstrauss demonstrates that using random orthogonal projections to reduce the dimensions of data gives good results. More formally, the expected distortion is not very high. The above-referenced publication by Hecht-Nielsen shows that random projections act very much like random orthogonal projections. Due to these results, it is believed that random projections can be used successfully to reduce the dimensionality of data.

A particular advantage of the method of FIG. 6 is that it is not necessary to download the data in the correct order. When downloading projections of image data onto random vectors the order of receiving the projections does not matter. The projections are typically linearly independent, which can be accomplished at sufficiently high probability by randomly selecting the vectors on which to project. The exact probability of linear dependence depends on the random function, and the size of the field in which the projection is made. Adding a source to the download is done by receiving projections from that source. There is no need to partition the data into chunks and assigning different chunks of the image data to different sources. All sources may transmit projections of the data onto randomly selected vectors, and when the downloader has downloaded enough projections, where sufficiency depends on the desired quality of service, the downloader can reconstruct the image data from the set of downloaded projections. Therefore, when a source has prematurely disconnected, and no more projections are received from it, there is no need to reassign any chunks to other sources.

One class of applications for the system of FIG. 1 is the class of real-time streaming applications. In real-time streaming a stream of bytes such as a television broadcast is created in real time and transmitted. Unlike a file, the stream is infinite, hence if the download of the stream stops the display of the television stream is likely to be inadequate. Therefore, using conventional technology, there is no easy way to connect to more than one source in real-time streaming applications. However, using the methods shown and described herein, one downloader can connect to several sources thereby to obtain sets of projections from each source. The downloader optionally selects to receive from the totality of sources slightly more projections than are required to generate the downloader's desired quality of service, so that, if one source fails, the downloader still has enough projections from the remaining sources to properly use the stream until the failed server has recovered. For example, a downloader can connect to 11 different sources, downloading from each source 1/10 of the projections required for adequately displaying a television broadcast. The downloader has elected to download a totality of 110% of the required projections, so even if only one source fails, the downloader still receives enough projections every second.

In summary, the advantages of the methods of FIGS. 4a, 4b, 4c, 4d, 4e include some or all of:

a. At any point a receiving computer can reconstruct an approximated content (sound, image, movie or stream) from the projections he had got thus far. This means that the receiving computer does not need to download the entire file to use the content. The receiving computer can use (display or play to a human user) the content prior to the completion of the download. As the receiving computer receives more projections, quality of the content increases, until a steady state of desired content quality is reached when all projections necessary to achieve that steady state have been received. If N projections have been received, where N is the amount of numbers (over the field used by the application) needed to describe the content, the exact content can be reconstructed.

b. Being able to perform lossy compression at the receiver side without having all the data beforehand, and without synchronizing between various senders.

c. When streaming video suffers packet loss, the quality of the video is damaged, but the video keeps playing.

Sources shown and described herein may be active, e.g. a computer connected to the Internet, or passive, e.g. a file read from stage such as hard-disk storage.

The term "missing data" and the like refers to any type of missing data such as a packet drop in the Internet, or a damaged area on a disk that cannot be read A particular feature of certain embodiments of the present invention is that compression is effectively performed by the receiving side. Conventional methods of compression require access to the entire data in order to produce the compressed version hence can only be applied at the server side. According to certain embodiments of the present invention, in contrast, compression can be effected when less than all of the data is available and therefore, compression can be effected at the client end. This is advantageous because the client rather than the server determines the acceptable rate of compression (hence quality of viewing) s/he is willing to accept.

A particular feature of certain embodiments of the present invention is that a downloading client has a viewable approximation of the data available to her before the download of the data is actually completed. Downloaded content, such as a video file, does not have to download completely before being viewed, although the proportion of download completed does determine the quality of service (the quality of the video e.g.). Therefore, according to certain embodiments, streaming video which has suffered packet loss keeps playing. The only effect of the packet loss is that the viewing quality of the video is reduced.

Two examples of work sessions in which content is encoded, sent, received and decoded in accordance with certain embodiments of the present invention are now described. For simplicity, the examples here are described over the real-number field, rather than over a Galois field. It is appreciated that in practice, using a field other than a Galois field may result in numbers with long bit representations (many bits required to represent each number), which may be practical for analog systems but is impractical for bit-oriented systems.

EXAMPLE 1

Encoding a 3-number-long array, and then Decoding it, by Representing it as a Single 3D Point Using step 405 in FIG. 2B, an image is represented as the following array of numbers: (10, 30, 25). In step 410, the data is represented as points in high-dimensional space. In the current simplified example there is but a single point in three dimensions.

Projecting the point p=(10, 30, 25) onto the XY plane yields p'=(10, 30). Similarly the point p can be projected on the X-axis, yielding a point p"=(10). Computationally this is done by multiplying the vector p with the unit vector of x:

$$(10,30,25)*(1,0,0)=10*1+30*0+25*0=10.$$

Similarly, to compute the projection of a point p onto a unit vector v, compute the vector multiple: p*v. Since p*v yields a linear equation (if p is unknown), p can be reconstructed from three independent projections. Having gathered three independent projections, p can be reconstructed by solving the resulting equation system to obtain p=(10, 30, 25).

Specifically, assume Sender 1 uses these projection vectors: (1, 2, 3), (2, 3, 4), (3, 4, 5).

Sender 1 performs step 440, thereby yielding:

$$(1,2,3)*(10,30,25)=1*10+2*30+3*25=145$$

$$(2,3,4)*(10,30,25)=2*10+3*30+4*25=210$$

$$(3,4,5)*(10,30,25)=3*10+4*30+5*25=275$$

In step 450, therefore, Sender 1 transmits (145, 210, 275).

Assume Sender 2 uses these projections: (5, 6, 7), (3, 3, 4), (4, 4, 5).

Sender 2 performs step 440, thereby yielding:

$$(5,6,7)*(10,30,25)=5*10+6*30+7*25=405$$

$$(3,3,4)*(10,30,25)=3*10+3*30+4*25=220$$

$$(4,4,5)*(10,30,25)=4*10+4*30+5*25=285$$

In step 450, therefore, Sender 2 transmits (405, 220, 285).

Less than all of the data sent by Senders 1 and 2 may be received. For simplicity, the lengths of the projection vectors are not normalized in this example. Normalizing the vectors on which projections are made on is optional, however when data is lost, the length of a vector typically eventually determines an "importance factor" for the projection made onto it. If the receiver receives two projections from sender 1, and one projection from sender 2, the receiver has the equation system:

$$(1,2,3)*p=1*x+2*y+3*z=145$$

$$(2,3,4)*p=2*x+3*y+4*z=210$$

$$(5,6,7)*p=5*x+6*y+7*z=405$$

The Receiver solves the above to yield: p=(x, y, z)=(10, 30, 25).

If the receiver received one projection from sender 1 and one equation from sender 2, the receiver cannot reconstruct the data from the equation set:

$$e1: (1,2,3)*p=1*x+2*y+3*z=145$$

$$e2: (5,6,7)*p=5*x+6*y+7*z=405$$

However, p' can be reconstructed that meets the above equations and is 'similar' to p. It is desired to compute a vector p=(x,y,z) such that $$y=80-3/2*z, x=z-15$$

Reference (4), above, describes criteria for reconstructing p'. A reasonable vector may be that whose norm is minimal:

$$\min z^2+(80-3/2z)^2+(z-15)^2$$

which occurs, approximately, when z=31, x=16, y=33.

Thus we have p'=(16, 33, 31) as an approximation to the original vector.

EXAMPLE 2

Encoding and Decoding a 3×3 Black and White Image, Represented As Three 3D Points Consider image data comprising a 3×3 black and gray picture of a square.

The image looks like this:

O O O
O X O
O O O where X is a black pixel whose value is 0 and O is a gray pixel whose value is, say, 100.

In step 405, the above image is encoded as (100, 100, 100, 100, 0, 100, 100, 100, 100).

In step 410, the data is represented as points in high dimensional space. The data may be treated as three points in 3D by partitioning the 9 numbers into three lists of three numbers: (100,100,100), (100,0,100),(100,100,100)

In step 420, a random generator is provided that is common to the receiver too, such as the glibc random generator, initiated with a seed of 55. Inform the receiver that a glibc random number generator with seed 55 is being used. Three iterations of steps 430-450 are performed.

In Iteration 1, step 430 uses the random generator to create a random vector in 3D: (1, 2, 3). In step 440, project the data points on the random vector by multiplying the random vector with each data point. First, project the point (100,100,100) onto (1,2,3) by scalar multiplication of vectors: 100*1+100*2+100*3=600. Project the point (100,0,100) onto (1,2,3) by computing 100*1+0*2+100*3=400. The projections of the three points onto (1,2,3) are therefore: 600, 400, 600. These projections are sent to the receiver.

In Iteration 2, step 430 uses the random generator to create a random vector in 3D: (8, 3, 1). In step 440, project the data points on the random vector by multiplying the random vector with each data point. First, project the point (100,100,100) onto (8,3,1) by scalar multiplication of vectors: 100*8+100*3+100*1=1200. Project the point (100,0,100) onto (8,3,1) by computing: 100*8+0*3+100*1=900. So the projections of the three points onto (8,3,1) is: 1200, 900, 1200, These projections are sent to the receiver.

In iteration 3, the random generator generates vector (1,5, 1). In step 440, project the point (100,100,100) onto (1,5,1) by computing 100*1+100*5+100*1 =700, Project the point (100,0,100) onto (1,5,1) by computing: 100*1+0*5+100*1=200. So the projections of the three points onto (1,5,1) is: 700, 200, 700, These projections are sent to the receiver.

The receiver performs step 510, collecting the projections from the sender. The receiver knows the sender is using a glibc random generator with seed 55, hence can generate the same vectors onto which to project the data namely (1,2,3), (8,3,1),(1,5,1). The receiver gets the first two projections: 600,400,600 and 1200,900,1200. For the first point (x,y,z) the first projection is known to be 600 which means that: $x*1+y*2+z*3=600$. The second projection is 1200, which means that: $x*8+y*3+z*1=1200$. Each such equation defines a subspace (a plane in this example) of points that satisfy the equation. The intersection of the subspaces (a straight line in this example) is the locus of all points that satisfy both equations.

For the second point (a,b,c) the first projection is known to be 400 which means that: $a*1+b*2+c*3=400$. The second projection is 900, which means that: $a*8+b*3+c*1=900$. The solution is an approximation of the data and can be used as such. A point in the intersection of all subspaces received from the encoder is now selected.

If all three projections had been received, three equations with (x,y,z) as variables and three equations with (a,b,c) as variables would have been available, and these could have been solved, since the intersection of all the corresponding subspaces is a single point, comprising exactly the original data. However, in fact, only two equations are available so the solution is approximated as follows:

For (x,y,z):

$$E1: x*1+y*2+z*3=600$$

$$E2: x*8+y*3+z*1=1200$$

$$3*E2-E1: x*23+y*7=3000, \text{ which means that}$$
$$y=3000/7-x*23/7.$$

Plugging into E2 yields: $x*8+9000/7-x*69/7+z*1=1200$, hence $z=x*13/7-600/7$.

Any solution of the form (x, 3000/7−x*23/7, x*13/8−600/7) satisfies the two available equations. Typically, a solution is selected that minimizes some criteria, such as the solution that minimizes the expression: $x*x+y*y+z*z$. In this example, x,y,z are to be found, that minimize:

$$x*x+y*y+z*z=$$

$$=x*x+(3000/7-x*23/7)*(3000/7-x*23/7)+(x*13/7-600/7)*(x*13/7-600/7)=$$

$$=x*x*747/49-153600/49*x+9360000/49$$

The above expression is minimized when the derivative is zero (x*1494/49−153600/49=0) which means x is approximately 102 (actually x=102.811 . . . ). Solving for y and z yields: y=93, z=103, so the approximation for the first point (originally (100,100,100)), given two equations, is (102, 93, 103). Now, the second point (a,b,c) whose projections were 400 and 900 is approximated by computing:

$$E1: a*1+b*2+c*3=400$$

$$E2: a*8+b*3+c*1=900$$

$$3*E2-E1: a*23+b*7=2300$$

$$b=2300/7-a*23/7$$

Plugging into E2 yields:

$$a*8+6900/7-a*69/7+c*1=900$$

$$c*1=a*13/7-600/7$$

Again it is desired to find a point (a,b,c) that satisfies the above equations and typically minimizes a suitable criteria function such as $a*a+b*b+c*c$. It is desired, then, to minimize the following:

$$a*a+b*b+c*c=$$

$$=a*a+(2300/7-a*23/7)*(2300/7-a*2317)+(a*13/7-600/7)*(a*13/7-600/7)=$$

$$a*a*747/49-a*121400/49+5650000/49$$

This minimum is achieved when the derivative is zero: $2*a*747/49-121400/49=0$, which means that a=81, b=62, c=64, hence the approximated image is:
102, 92, 103
81, 62, 64
102, 92, 103
The two extreme rows are fairly accurate whereas the middle line is smeared.

According to certain embodiments of the present invention, a computerized display device is operative, as projection data is being downloaded, whose state is indicative of the quality of content reconstruction that would be possible if the content were to be re-constructed based on the projection data downloaded thus far. The computerized display device may for example comprise a progress bar icon of length L, wherein the proportion of the length L which is colored or otherwise marked, indicates the percentage of content reconstruction quality (relative to 100% yielded by data which allows the content to be computed precisely) which would result if content were to be re-constructed based on the projection data downloaded thus far. Such a data device would allow a user to stop the download and view the movie at any time, where the quality of viewing would depend on how has been downloaded as indicated by the display device.

According to certain embodiments of the present invention, if less than all of the data required to accurately reconstruct streaming entertainment (for example television over the Internet) has been downloaded, the content is displayed nonetheless, without pausing. The quality of viewing would be proportionally worse, however, there would be no pauses.

Typically, there is no need to partition the data into chunks and assign chunks to sources. The data may comprise a real-time stream being downloaded from one or several sources. The downloader may be programmed to reconstruct the stream in real-time even if any predefined number of arbitrary servers have failed.

The matrix M shown and described herein, also termed an "array" may be generated by a pseudo random generator with a pre-negotiated seed. The matrix M may also be a pre-negotiated sub-matrix of the Van der Monde matrix.

The encoding methods shown and described herein may be applied to disjoint, consecutive chunks of the content data or alternatively may be applied to a sliding window placed over the content data, as in FIG. 2E. For example, a movie or other stream may be represented as one or more points in some dimension. Also, the movie may be partitioned or otherwise divided into portions of x frames which are each encoded and decoded separately. Typically, in streaming application, the streamed data is partitioned into portions each representing a certain amount of time of the movie or other streamed content.

FIG. 7 is a simplified flowchart illustration of a method for dispensing content material to one or more subscribers, where the quality of the content is determined by the encoder ex post facto, after the content has been created, and may be different for different subscribers. The method of FIG. 7 typically comprises some or all of the following steps, suitably ordered e.g. as shown:

Step 2601: input the file of N samples representing the sound-wave. Denote by SAMPLE[i] the i-th sample in the file. Where each sample is an 8-bit number representing the amplitude of the sound wave at the i-th sampling time.

Step 2602: Write N to the storage device

Step 2630: Perform steps 130-160 of FIG. 2A on INPUT

Step 2640: generate N/1024 keys: KEY0, . . . , KEYN/1024−1 using a random generator Step 2650: encrypt the i-th structure of the output with the i-th key Step 2660: write the encrypted structures to the CD-ROM Step 2670: write the number L, and the keys key1, . . . keyL to a second storage device, such as the storage area that exists on a smart-card, where L is determined by the amount of money paid by the encoder FIG. 8 is a simplified flowchart illustration of a method for encoding of content where the content is uniform for all subscribers, and the quality of the content is different for different subscribers. The method of FIG. 8 typically comprises some or all of the following steps, suitably ordered e.g. as shown:

Step 2705: Read the number L and the set of keys KEY0, . . . KEYL from the smart-card Step 2710: Read the number N and L structures, e.g. as uploaded by the method of FIG. 5 from the CD-ROM Step 2720: perform steps 220-250 of FIG. 4A

Step 2760: Play the sound corresponding to the output of step 2020

The various embodiments of the present invention have many applications for lossy compression at the receiver side, including but not limited to the following:

a. File downloading in which the file can be used at any time, rather than having to wait till downloading is complete.

In this application the user downloads a file, either from one source, or from several sources simultaneously. Examples of this class of applications includes Internet-Explorer downloading of images, eMule downloading of movies, and ICQ downloading of audio files. At any time of the download the user can test use the content of the file he is downloading, by viewing the movie, seeing the image or hearing the audio. As downloading progresses, the quality of the file is enhanced.

Figure 9:
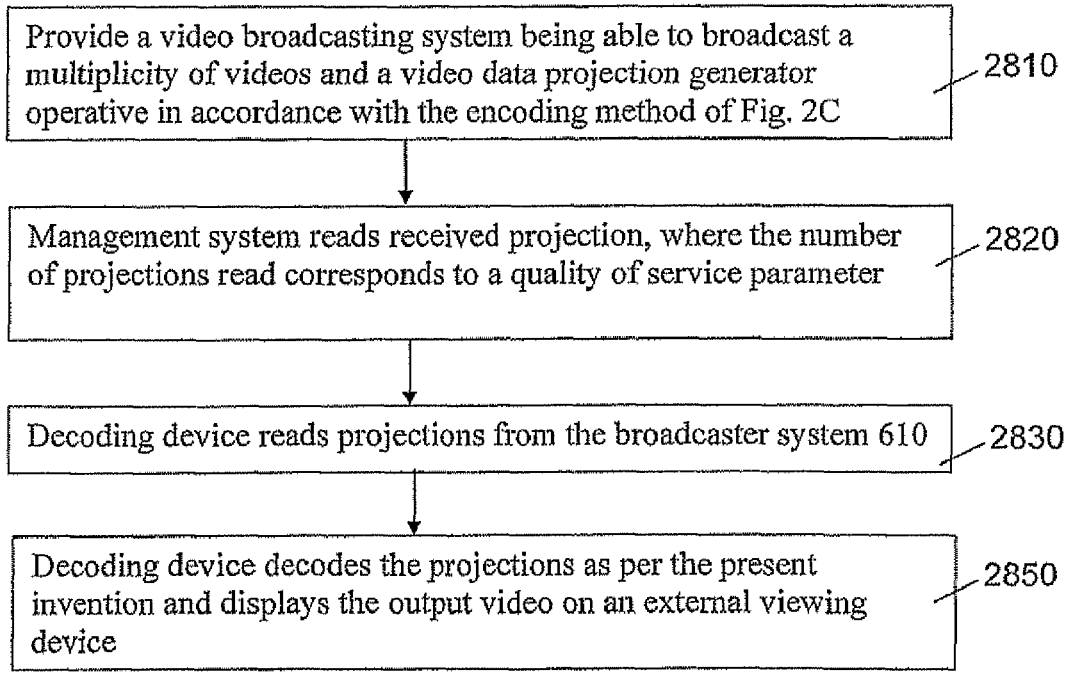

FIG. 9 is a simplified flowchart illustration of an example method of operation for this application in accordance with certain embodiments of the present invention. The method of FIG. 9 typically comprises some or all of the following steps, suitably ordered e.g. as shown:

Step 2810: Provide a video broadcasting system being able to broadcast a multiplicity of videos and a video data projection generator operative in accordance with the encoding method of FIG. 2C.

Step 2820: management system reads received projection, where the number of projections read corresponds to a quality of service parameter Step 2830: Decoding device reads projections from the broadcaster system 610

Step 2850: Decoding device decodes the projections as per the present invention and displays the output video on an external viewing device.

b. Video On Demand service in which the quality of the video is adjusted to meet bandwidth constraints.

Video on Demand systems transmit a continuous flow of the file and the user watches the movie as it is sent such that the file is not downloaded to be viewed when it has finished downloading, rather the view of the movie is concurrent with the download. Therefore, the download must be fast enough to match the displaying speed of the movie. In current applications, if the download is too slow the movie is not displayed properly. Usually the movie pauses until enough additional data is downloaded at which point the display resumes. Whereas conventional video on demand services sometimes generate several separate versions of each movie with different qualities hence different bandwidth requirements, according to certain embodiments of the present invention, the user can herself set the quality of the movie to meet bandwidth constraints, typically at an infinite number of levels, without requiring special versions to be pre-generated by the video on demand server. Typically, the user can change the quality of the movie at any time during the download.

Figure 10:
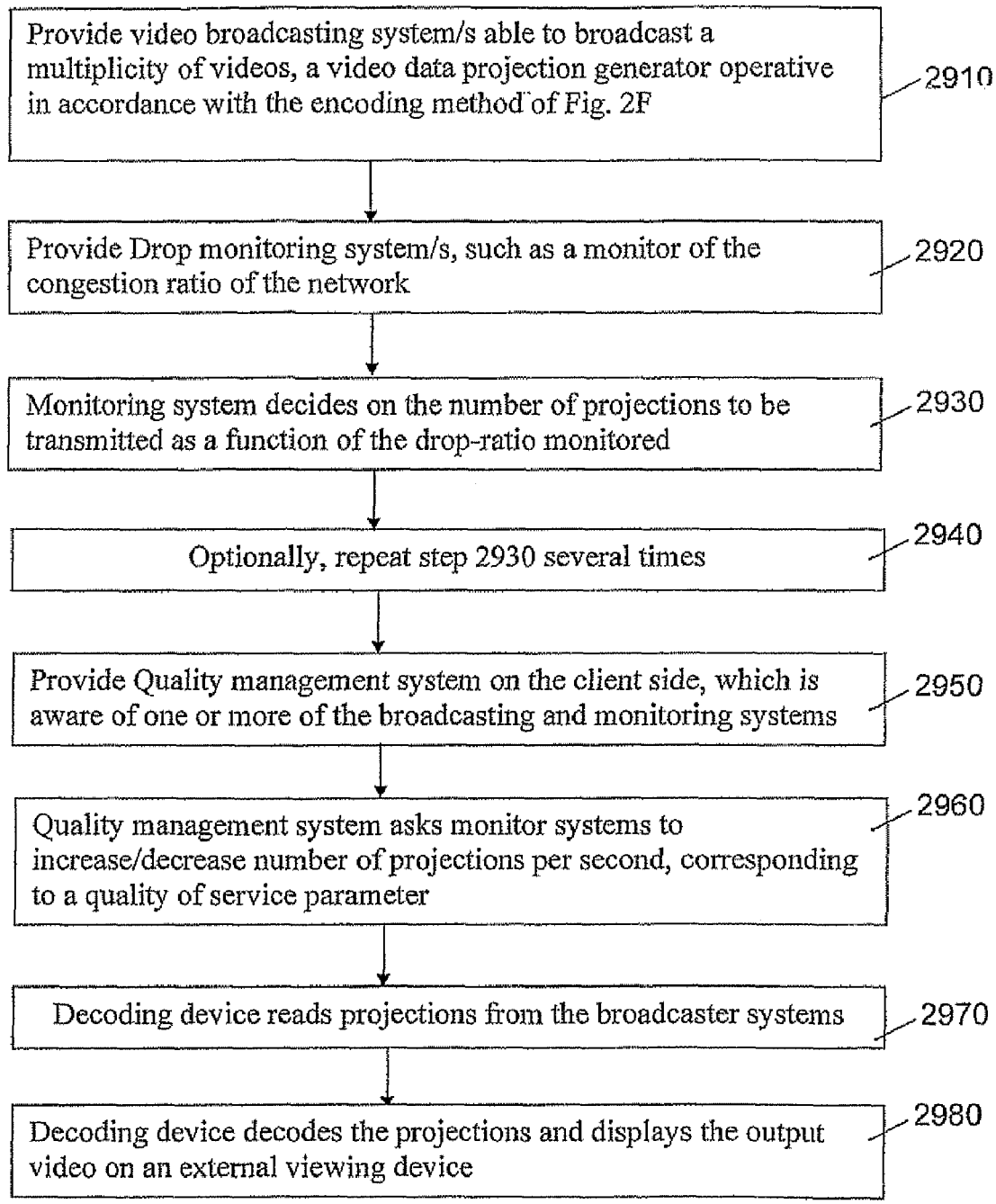

FIG. 10 is a simplified flowchart illustration of an example method of operation for this application in accordance with certain embodiments of the present invention. The method of FIG. 10 typically comprises some or all of the following steps, suitably ordered e.g. as shown:

Step 2910: Provide video broadcasting system/s able to broadcast a multiplicity of videos, a video data projection generator operative in accordance with the encoding method of FIG. 2F.

Step 2920: provide Drop monitoring system/s, such as a monitor of the congestion ratio of the network Step 2930: monitoring system decides on the number of projections to be transmitted as a function of the drop-ratio monitored Step 2940: optionally, repeat step 2930 several times Step 2950: provide Quality management system on the client side, which is aware of one or more of the broadcasting and monitoring systems Step 2960: Quality management system asks monitor systems to increase/decrease number of projections per second, corresponding to a quality of service parameter Step 2970: Decoding device reads projections from the broadcaster systems Step 2980: Decoding device decodes the projections and displays the output video on an external viewing device c. TV-Streaming service in which the quality of the video is adjusted to meet bandwidth needs.

In video on demand applications, a finite file is transmitted from storage, whereas in TV-Streaming applications, an infinite video stream recorded from a recording device is transmitted. Even so, certain embodiments of the present invention are still applicable; quality can be adjusted according to bandwidth constraints, without recourse to preprocessing at the server end. The receiver of the stream may for example connect to more servers that are able to transmit the stream, thus getting more projections per second, and improving the quality of the stream s/he views.

Figure 11:
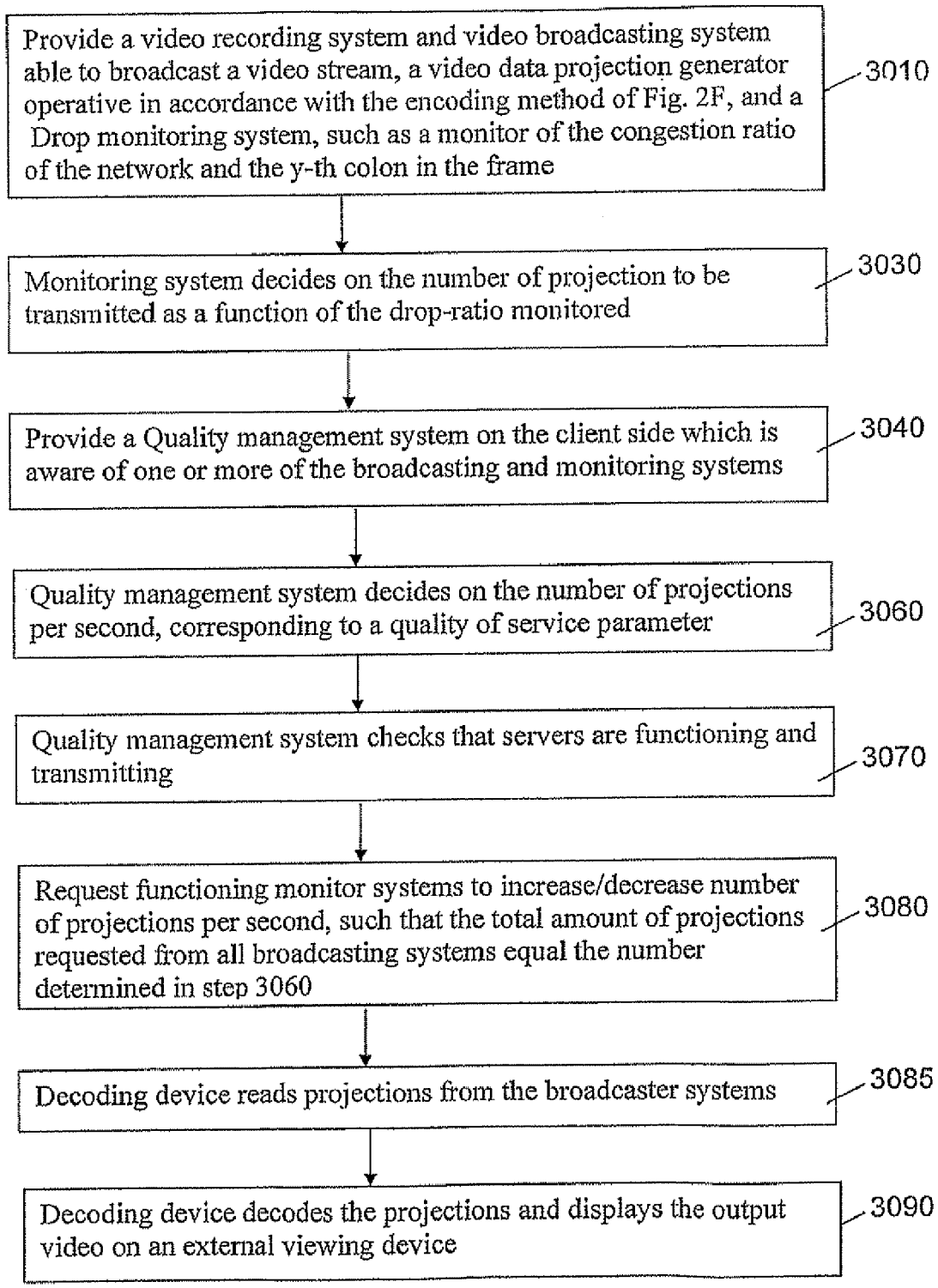

FIG. 11 is a simplified flowchart illustration of an example method of operation for this application in accordance with certain embodiments of the present invention. The method of FIG. 11 typically comprises some or all of the following steps, suitably ordered e.g. as shown:

Step 3010: Provide a video recording system and video broadcasting system able to broadcast a video stream, a video data projection generator operative in accordance with the encoding method of FIG. 2F, and a Drop monitoring system, such as a monitor of the congestion ratio of the network Step 3030: monitoring system decides on the number of projection to be transmitted as a function of the drop-ratio monitored Step 3040: provide a Quality management system on the client side which is aware of one or more of the broadcasting and monitoring systems Step 3060: Quality management system decides on the number of projections per second, corresponding to a quality of service parameter Step 3070: Quality management system checks that servers are functioning and transmitting Step 3080: request functioning monitor systems to increase/decrease number of projections per second, such that the total amount of projections requested from all broadcasting systems equal the number determined in step 3060

Step 3090: Decoding device reads projections from the broadcaster systems

Step 3095: Decoding device decodes the projections and displays the output video on an external viewing device d. Video-Streaming service providing several simultaneous sources for video content:

According to certain embodiments of the present invention, an end user may connect to several servers each providing the same TV-Streaming service, so as to be able to display the stream even if a server crashes, If for example a user views CNN over the Internet and connects to 10 different servers, then if one server crashes the stream continues with 10% decrease in quality. The client later compensates for the missing server by connecting to another server, or requesting each server to send more projections per second, if the server can support such a request. It is appreciated that the Video-Streaming service may be transmitted over a P2P network or in a server-to-client network.

Figure 12:
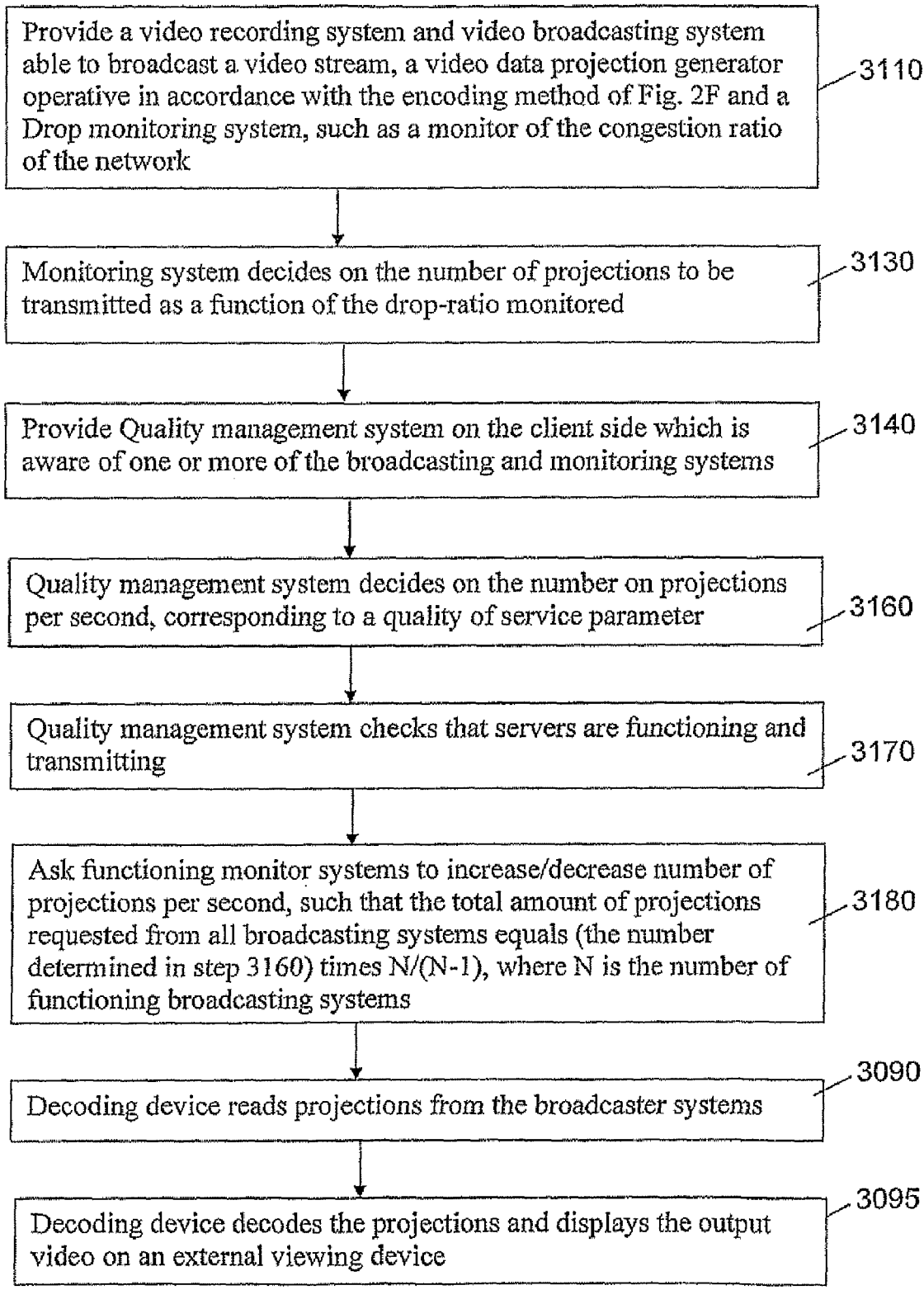

FIG. 12 is a simplified flowchart illustration of an example method of operation for this application in accordance with certain embodiments of the present invention. The method of FIG. 12 typically comprises some or all of the following steps, suitably ordered e.g. as shown:

Step 3110: Provide a video recording system and video broadcasting system able to broadcast a video stream, a video data projection generator operative in accordance with the encoding method of FIG. 2F and a Drop monitoring system, such as a monitor of the congestion ratio of the network Step 3130: monitoring system decides on the number of projections to be transmitted as a function of the drop-ratio monitored Step 3140: provide Quality management system on the client side which is aware of one or more of the broadcasting and monitoring systems.

Step 3160: Quality management system decides on the number on projections per second, corresponding to a quality of service parameter.

Step 3170: Quality management system checks that servers are functioning and transmitting.

Step 3180: ask functioning monitor systems to increase/decrease number of projections per second, such that the total amount of projections requested from all broadcasting systems equals (the number determined in step 3160) times N/(N−1), where N is the number of functioning broadcasting systems Step 3190: Decoding device reads projections from the broadcaster systems Step 3195: Decoding device decodes the projections and displays the output video on an external viewing device.

e. Video/Image/Audio storage (such as CDROM) of encoded content:

The output of the encoding methods shown and described herein may be stored, e.g. on CDROM, such that local damage to the storage device does not result in a total loss of the stored content, but rather in a uniform reduction in quality when the content is played.

Figure 13:
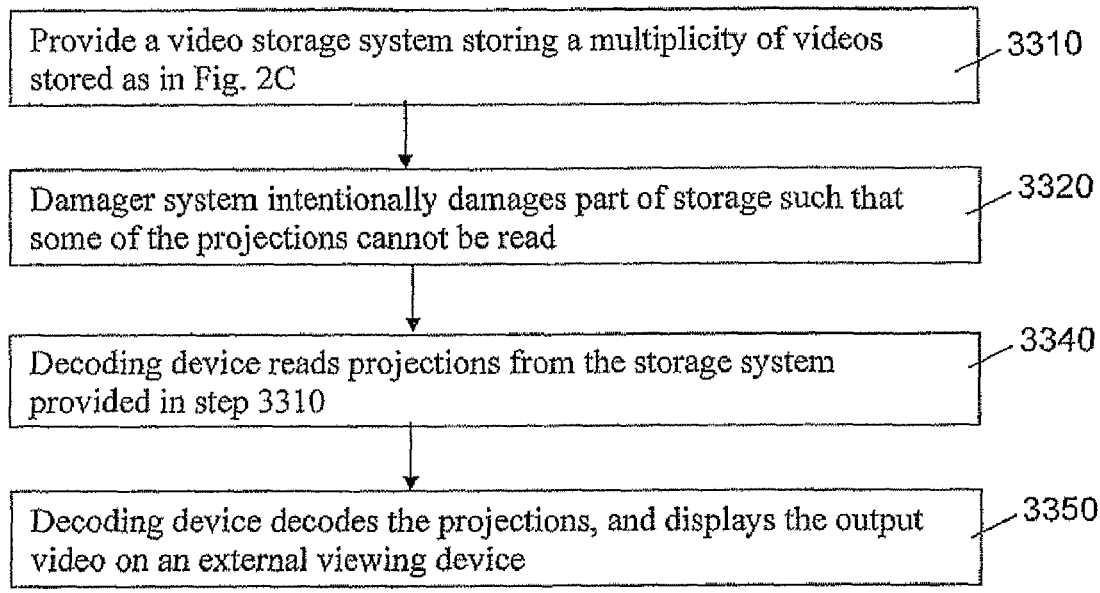

FIG. 13 is a simplified flowchart illustration of an example method of operation for this application in accordance with certain embodiments of the present invention. The method of FIG. 13 typically comprises some or all of the following steps, suitably ordered e.g. as shown:

Step 3310: Provide a video storage system storing a multiplicity of videos stored as in FIG. 2C Step 3320: Damager system intentionally damages part of storage such that some of the projections cannot be read Step 3330: Decoding device reads projections from the storage device 610

Step 3350: Decoding device decodes the projections, and displays the output video on an external viewing device f. A video on demand service or video-Streaming system in which different clients receive different qualities of service.

The higher the quality of service a certain client is entitled to, the more projection vectors are sent to him. It is appreciated that the service or system may communicate with the client over a P2P network or alternatively over a client-server network.

Figure 14:
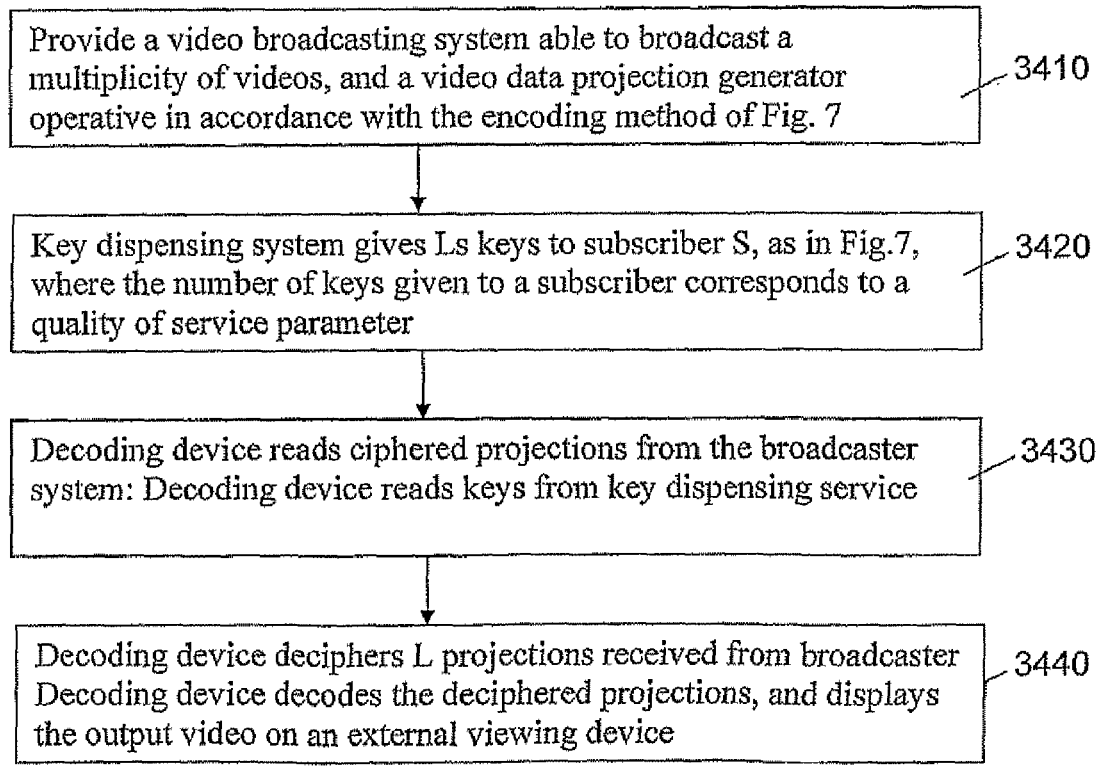

FIG. 14 is a simplified flowchart illustration of an example method of operation for this application in accordance with certain embodiments of the present invention. The method of FIG. 14 typically comprises some or all of the following steps, suitably ordered e.g. as shown:

Step 3410: Provide a video broadcasting system able to broadcast a multiplicity of videos, and a video data projection generator operative in accordance with the encoding method of FIG. 7

Step 3420: Key dispensing system gives Ls keys to subscriber S, as in FIG. 7, where the number of keys given to a subscriber corresponds to a quality of service parameter Step 3430: Decoding device reads ciphered projections from the broadcaster system 610635: Decoding device reads keys from key dispensing service 620

Step 3440: Decoding device deciphers L projections received from broadcaster 610, Step 3450: Decoding device decodes the projections deciphered in 640, and displays the output video on an external viewing device.

g. QoS-specific Video dispensing system:

A video dispensing system, where an external device (such as a smart-card) is used to interpret the projections, and the number of projection vectors revealed to each individual smart-card in a population of smart cards depends on a quality of service parameter which characterizes each smart-card and is stored in a smart-card interaction management system. A simplified flowchart illustration of a possible method of operation for a video dispensing system constructed and operative in accordance with this embodiment of the invention is illustrated in FIG. 6 which is generally self-explanatory.

Figure 15:
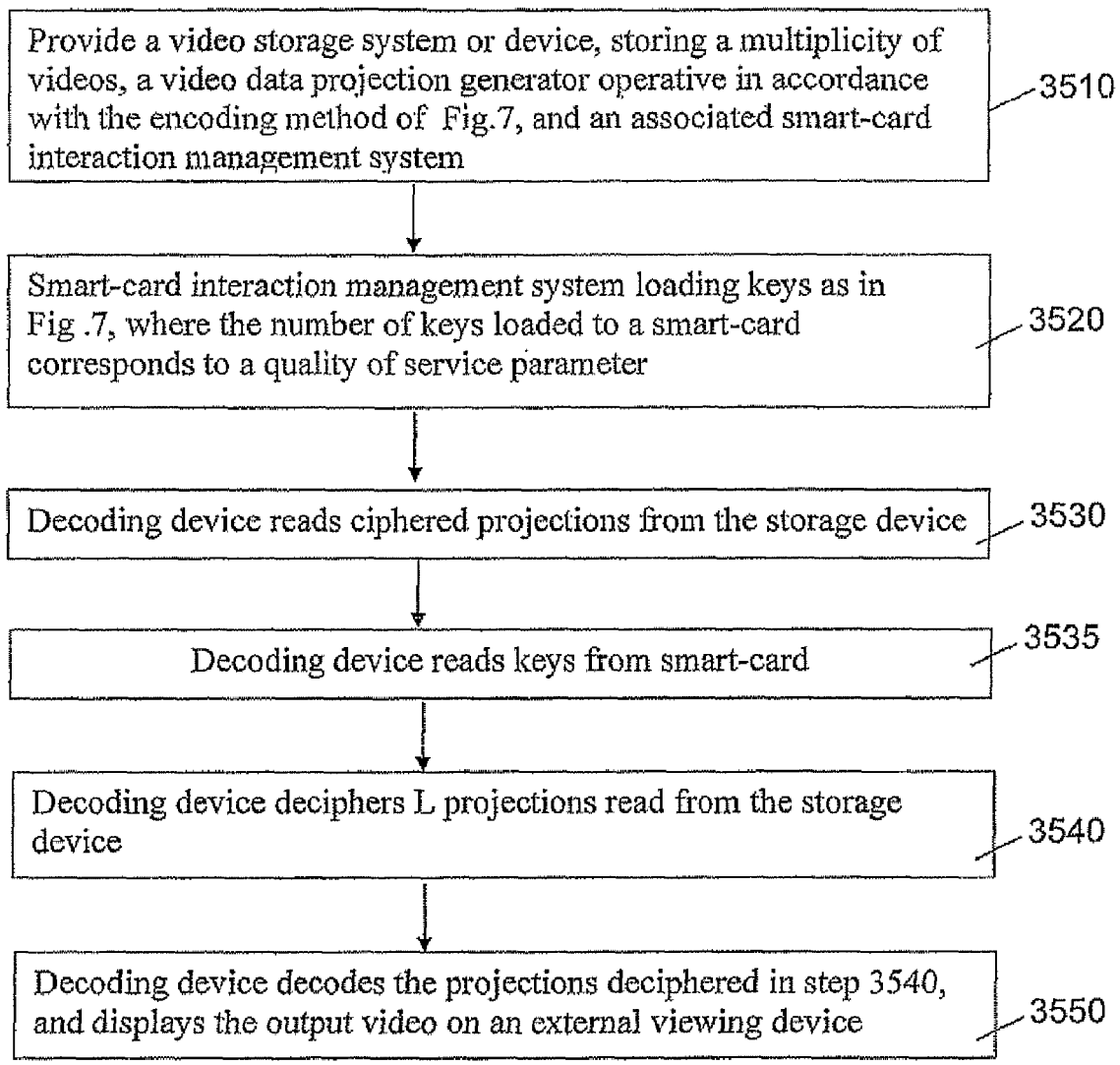

FIG. 15 is a simplified flowchart illustration of an example method of operation for this application in accordance with certain embodiments of the present invention. The method of FIG. 15 typically comprises some or all of the following steps, suitably ordered e.g. as shown:

Step 3510: Provide a video storage system or device, storing a multiplicity of videos, a video data projection generator operative in accordance with the encoding method of FIG. 7, and an associated smart-card interaction management system Step 3520: Smart-card interaction management system loading keys as in FIG. 7, where the number of keys loaded to a smart-card corresponds to a quality of service parameter Step 3530: Decoding device reads ciphered projections from the storage device Step 3535: Decoding device reads keys from smart-card Step 3540: Decoding device deciphers L projections read from the storage device Step 3550: Decoding device decodes the projections deciphered in step 3540, and displays the output video on an external viewing device h. Continuous voice-over-IP system:

Voice over IP systems characterized in that a dropped packet reduces the quality of the voice played, rather than playing silence instead of a dropped packet. The packet may form part of an ordinary call, or a video call, or a conference call.

Figure 16:
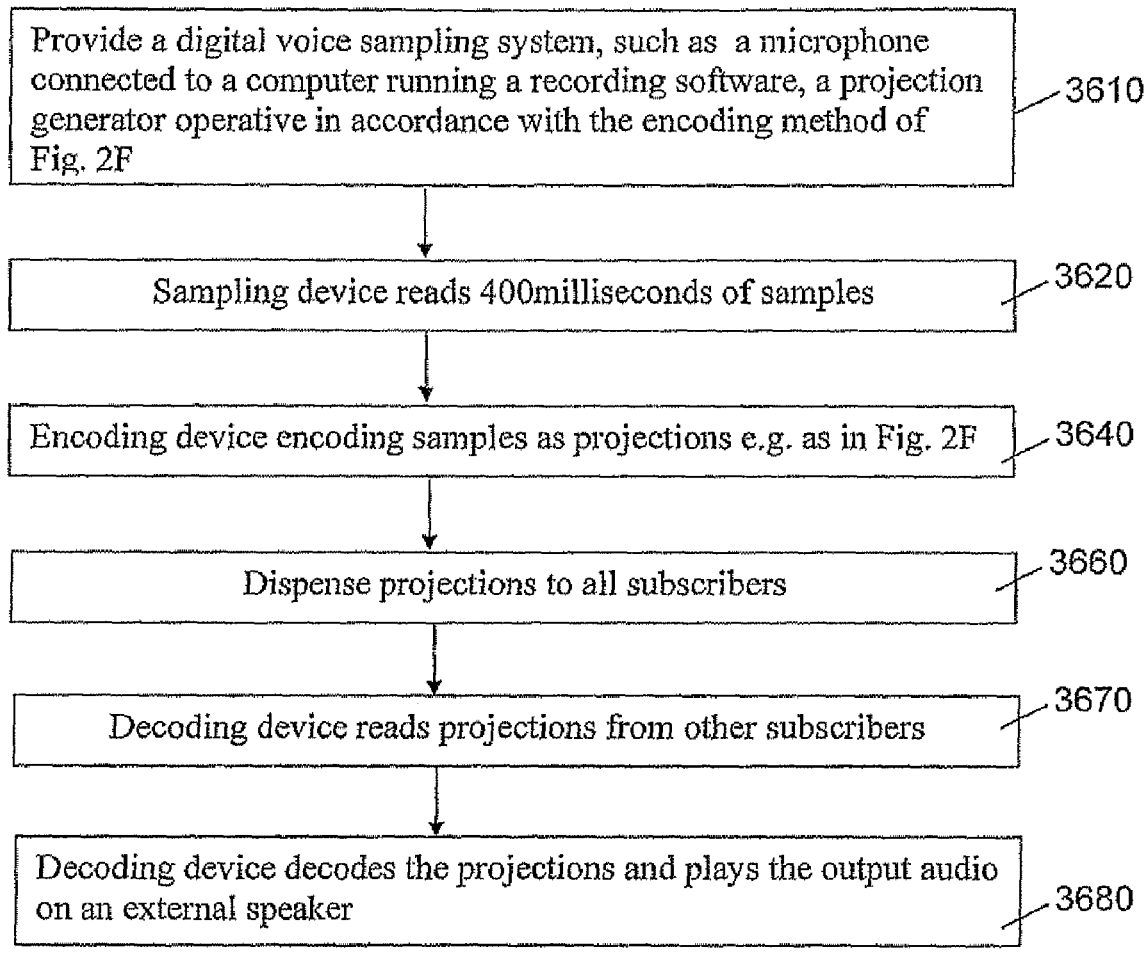

FIG. 16 is a simplified flowchart illustration of an example method of operation for this application in accordance with certain embodiments of the present invention. The method of FIG. 16 typically comprises some or all of the following steps, suitably ordered e.g. as shown:

Step 3610: Provide a digital voice sampling system, such as a microphone connected to a computer running a recording software, a projection generator operative in accordance with the encoding method of FIG. 2F

Step 3620: Sampling device reads 400 milliseconds of samples

Step 3640: Encoding device encoding samples as projections e.g. as in FIG. 2F

Step 3660: dispense projections to all subscribers

Step 3670: Decoding device reads projections from other subscribers

Step 3680: Decoding device decodes the projections and plays the output audio on an external speaker i. QoS-specific Voice over IP system:

Voice over IP systems are characterized in that the quality of the voice is different for different clients. Calls supported by the system may include ordinary calls, video calls, and conference calls.

Figure 17:
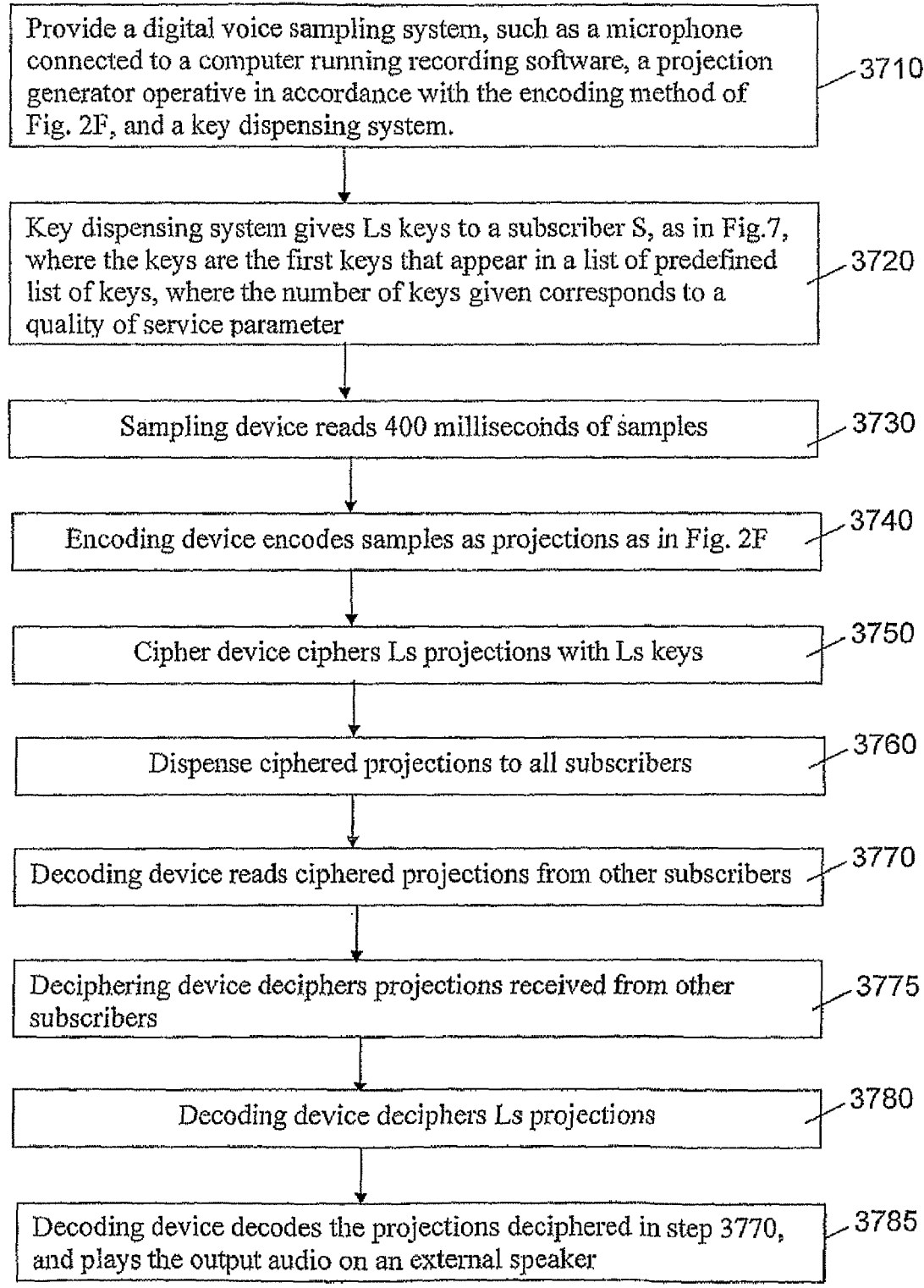

FIG. 17 is a simplified flowchart illustration of an example method of operation for this application in accordance with certain embodiments of the present invention. The method of FIG. 17 typically comprises some or all of the following steps, suitably ordered e.g. as shown:

Step 3710: Provide a digital voice sampling system, such as a microphone connected to a computer running a recording software, a projection generator operative in accordance with the encoding method of FIG. 2F, and a key dispensing system.

Step 3720: Key dispensing system gives Ls keys to a subscriber S, as in FIG. 7, where the keys are the first keys that appear in a list of predefined list of keys, where the number of keys given corresponds to a quality of service parameter Step 3730: Sampling device reads 400 milliseconds of samples Step 3740: Encoding device encodes samples as projections as in FIG. 2F

Step 3750: cipher device ciphers Ls projections with Ls keys

Step 3760: dispense ciphered projections to all subscribers

Step 3770: Decoding device reads ciphered projections from other subscribers Step 3775: Deciphering device deciphers projections received from other subscribers Step 3780: Decoding device deciphers Ls projections Step 3785: Decoding device decodes the projections deciphered in step 3770, and plays the output audio on an external speaker j. Resource-considerate voice over IP system:

Voice over IP systems are characterized in that the quality of the voice depends on the resources of the broadcaster. Calls supported by the system may include ordinary calls, video calls, and conference calls.

FIG. 18 is a simplified flowchart illustration of an example method of operation for this application in accordance with certain embodiments of the present invention. The method of FIG. 18 typically comprises some or all of the following steps, suitably ordered e.g. as shown:

Step 3810: Provide a digital voice sampling system, such as a microphone connected to a computer running a recording software, a projection generator operative in accordance with the encoding method of FIG. 2F

Step 3820: provide Load monitoring system, such as a monitor of the CPU load, or a monitor of the congestion ratio of the network Step 3830: Sampling device reads 400 milliseconds of samples Step 3835: monitoring system decides on the number of projections to be encoded as a function of the load monitored Step 3840: Encoding device encodes samples as projections, as in FIG. 2F, where the number of projections generated is determined by step 3835

Step 3860: dispense projections to all subscribers

Step 3870: Decoding device reads projections from other subscribers

Step 3875: monitoring system decides on the number of projections to be decoded as a function of the load monitored Step 3880: Decoding device decodes the projections, where the number of projections decoded is dependent of the number of projections received and the limit determined in step 3875, and plays the output audio on an external speaker.

k. Redundant voice over IP system:

Voice over IP systems characterized in that exact reconstruction of the call is possible even with a certain amount of data loss. Calls supported by the system may include ordinary calls, video calls, and conference calls.

FIG. 19 is a simplified flowchart illustration of an example method of operation for this application in accordance with certain embodiments of the present invention. The method of FIG. 19 typically comprises some or all of the following steps, suitably ordered e.g. as shown:

Step 3910: Provide a digital voice sampling system, such as a microphone connected to a computer running a recording software, and a projection generator operative in accordance with the encoding method of FIG. 2F

Step 3920: provide a Drop monitoring system, such as a monitor of the congestion ratio of the network Step 3930: Sampling device reads 400 milliseconds of samples
Step 3935: monitoring system decides on the number of projections to be encoded as a function of the drop-ratio monitored
Step 3940: Encoding device encodes samples as projections e.g. as in FIG. 2F, where the number of projection generated is determined by the output of step 3935, but is not less than the number of projections needed for exact reconstruction of the data
Step 3960: dispense projections to all subscribers
Step 3970: Decoding device reads projections from other subscribers
Step 3980: Decoding device decodes the projections and plays the output audio on an external speaker FIGS. 20A-20B, taken together, form a simplified flowchart illustration of a method for performing step 340 of FIG. 4A according to certain embodiments of the present invention. The method of FIGS. 20A-20B typically comprises the following steps, suitably ordered e.g. as shown:

Step 4315: Create N/1024-L empty structures Fi, each containing a 32-bit number FSEEDi and 1024 8-bit numbers denoted by FINPUT
Step 4320: For each structure Ff, set FSEEDf to be the lowest number such that FSEEDf is different than SEEDi, for any i and FSEEDf is different than FSEEDj, for all j<f
Step 4325: Append N/1024-L structures to the input list to obtain a structure-list of N/1024 structures, and set: SEEDf+L=FSEEDf, for f=0,1, ..., N/1024-L
Step 4330: For the i-th structure in the structure-list generated in the previous step, set Ri, an N/1024 dimensional vector, to be $(1, i, i\#i, i\#i\#i, i\#i\#i\#i, \ldots )/sqrt(1\#1\hat{}i\#i\hat{}i\#i\#i\hat{}\ldots)$ where sqrt(x) stands for the square root of x over Galois field.
Step 4335: Define M, a matrix whose dimensions are N/1024×N/1024, M[a][b] being the element in M's a'th row and b'th column and set M[i][j] =Ri[j]
Step 4340: Compute the inverse matrix M' of M, by following the procedure given in the above referenced "Numerical recipes in C" carrying out all operations over a Galois field GF (256)
Step 4350: Set OUTPUTi to be:

$M'[a][0]\#INPUT0[b]\hat{}M'[a][1]\#INPUT1[b]\hat{}... M'[a][N/1024-L-1]\#$

INPUTN/1024-L-1[b] where a=(i-(% 1024))/1024 and b=i % 1024

Step 4355: Define G, a matrix whose dimensions are (N/1024-L)×(N/1024-L), such that:

$G[a][b]=2M'[0][L+a]\#M'[0][L+b]+2M'[1][L+a]\#M'[1][L+b]+\ldots +2M'[N/1024-L][L+a]\#M'[N/1024-L][L+b]$ Step 4357: Compute G', the inverse of G.
Step 4360: Set Ox, an array of N/1024 numbers, to be the x-th N/1024-tuple in OUTPUT':

$Ox[i]=OUTPUT'(x+i*N/1024) (x=0, \ldots 1023)$

Step 4365: Set Dx, an array of N/1024-L numbers, to be:

$D[c]=-2M'[0][L+c]\#Ox[0]-2M'[1][L+c]\#Ox[1]-\ldots -2M'[N/1024][L+c]\#Ox[N/1024]$ Step 4370: Set INPUT(L+i)[x] to be $G'[0][i]\#Dx[0]+G'[1][i]\#Dx[1]+\ldots +G'[N/1024-L][i]\#Dx[N/1024-L]$ Step 4375: Set OUTPUTi to be:

$M'[a][0]\#INPUT0[b]\hat{}M'[a][1]\#INPUT1[b]\hat{}\ldots M'[a][N/1024-1]\#INPUTN/1024-1[b]$ where a=(i-(i % 1024))/1024 and b=i % 1024

It is appreciated that the applications specifically shown and described herein are merely exemplary and are not intended to be limiting. Applications may differ between them, inter alia, in that in some applications data is stored whereas in other applications data is directly transmitted. Also, the number of projections may be determined by the receiver, e.g. depending on the quality desired, or alternatively the number of projections may be determined by the server, according to criteria such as how much quality of service each receiver deserves, and/or the load on the sender and/or on the network, and the like. Also, redundant data may be supplied, to facilitate recovery from packet drops or alternatively, only data required to reconstruct content is supplied in which case packet drop results in a drop in quality although it typically does not result in interruption in the flow of content as in the prior art.

It is appreciated that, given a predefined set of projections it can be that averaging over all images, only a small number of projections are needed on average to generate high-quality representations of the images, however nonetheless, generating high-quality representations of certain individual images might require considerably more than such a small number of projections.

Conversely, given a predefined image, it is possible to compute a "best set of projections" for that image. Also, it can be said that averaging over all sets of projections only a small number of projections are needed on average to generate high-quality representations of the image, however nonetheless, generating high-quality representations of that image given a certain individual set of projections might require considerably more than that small number of projections. Therefore, it is believed preferable not to use a predefined set of projections and instead, to use a randomly selected set of projections. According to this embodiment, however, the receiver or content playing apparatus must be apprised as to what set of projections the sender used. One way of achieving this is if both the sender and the receiver use the same random generator with the same seed such that both generate the same set of projections. In an example provided herein, given a seed SEEDi, the projection vector generated from the seed is:
(1, SEED, SEED*SEED, SEED*SEED*SEED, ...)
and SEEDi is transmitted as part of the output. To optimize, select SEEDi randomly rather than letting it be, say: SEEDi=1,2,3,4,5, ...

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server's and/or client/s for using such; and hardware which performs any or all of the steps of any of the methods shown and described herein, in any suitable order, either alone or in conjunction with software.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order, "e.g." is used herein in the sense of a specific example which is not intended to be limiting.

The invention claimed is:

1. A method for retrieving a sequence of $P \times D \times L[>]=M$ raw digital entertainment content bits from a received sequence of $1 < e <= E$ data elements, each data element comprising P sets of $d_k$ L-tuples of bits, each data element $\text{ELEMENT}_k$ ($1<=k<=e$) comprising a projection of substantially all of P points defined in a coordinate system having an origin, onto a $d_k$-dimensional subspace $s_k$ of D-dimensional space, thereby to define subspaces defining a span, wherein the subspaces are characterized in that the dim$(\text{span}(S1, \ldots, Sk)) <= M/(P \times L)$, the method comprising:

if $\dim(S1)+\ldots+\dim(Se) > M/(P \times L)$ discarding data elements at random until $\dim(S1)+\ldots+\dim(Se) = M/(P \times L)$, and then continuing as in the case where $\dim(\text{span}(S1, \ldots, Se)) = M/(P \times L)$;

repeating for $p=1, \ldots P$:

a. retrieving a p'th point comprising D L-tuples of bits, wherein retrieving the p'th point comprises, for each data element $\text{ELEMENT}_h$ ($1<=h<=e$) in said sequence of e data elements, taking the intersection of all $O_{p,1}, O_{p,2}, \ldots, O_{p,e}$ where $O_{p,h}$ ($1<=p<=P$, $1<=h<=e$) is a translated subspace orthogonal to $s_h$ that contains the point PNTh,p, the dimension of the subspace being $D-d_h$, the intersection of all of said translated subspaces orthogonal to $s_h$ defining an intersection translated subspace comprising a translated subspace of dimension $D-\dim(\text{span}(s1,s2,\ldots,s[k]e))$; and b. choosing a D-dimensional point $q_p$ within said intersection translated subspace, wherein each dimension of the D-dimensional point is represented at a $2^L$-level resolution, such that the point is defined by D L-tuples of bits; and decoding the P D-dimensional points into M raw digital entertainment bits by setting the $(i \times D+j)$-th L-tuple of bits to hold the L-bit binary representation of the j-th coordinate of the i-th point ($1<=j<=D$) ($1<=i<=P$), thereby obtaining $P \times D \times L$ bits, wherein, if $\dim(\text{span}(S1, \ldots, Se)) = M/(P \times L)$, the intersection of all of said translated subspaces orthogonal to $s_h$ defines a single point $q_p$ and said M raw digital entertainment bits are identical to the bits that were encoded.

2. A method according to claim 1 wherein span(s1, ... se)=D such that all subspaces $s_k$ ($1<=k<=E$) intersect at a single D-dimensional point, each dimension having L levels, said point being the exact encoding of M.

3. A method according to claim 1 wherein $q_p$ is chosen so as to minimize its Euclidian distance from the origin.

4. A method according to claim 1 wherein M bits are permuted by a predefined permutation after decoding them.

* * * * *